US012660160B2

(12) United States Patent
Park et al.

(10) Patent No.: US 12,660,160 B2
(45) Date of Patent: Jun. 16, 2026

(54) SEMICONDUCTOR DEVICES AND METHODS OF MANUFACTURING THE SAME

(71) Applicant: SAMSUNG ELECTRONICS CO., LTD., Suwon-si (KR)

(72) Inventors: Seokhan Park, Yongin-si (KR); Kiseok Lee, Suwon-si (KR); Seokho Shin, Suwon-si (KR); Hyungeun Choi, Suwon-si (KR); Bowon Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 625 days.

(21) Appl. No.: 18/171,171

(22) Filed: Feb. 17, 2023

(65) Prior Publication Data

US 2023/0389289 A1 Nov. 30, 2023

(30) Foreign Application Priority Data

May 27, 2022 (KR) ........................ 10-2022-0065188

(51) Int. Cl.
*H10B 12/00* (2023.01)
(52) U.S. Cl.
CPC ........... *H10B 12/315* (2023.02); *H10B 12/05* (2023.02); *H10B 12/482* (2023.02); *H10B 12/488* (2023.02)
(58) Field of Classification Search
CPC .. H10B 12/315; H10B 12/482; H10B 12/488; H01L 21/764
See application file for complete search history.

(56) References Cited

U.S. PATENT DOCUMENTS 7,799,591 B2 9/2010 Fujimoto
8,143,121 B2 3/2012 Lin
(Continued)

FOREIGN PATENT DOCUMENTS

KR 10-1820022 1/2018
TW 202103291 1/2021

OTHER PUBLICATIONS

Extended European Search Report dated Oct. 16, 2023 in Corresponding European Patent Application No. 23155116.9, 10 pages.
(Continued)

*Primary Examiner* — Steven M Page
(74) *Attorney, Agent, or Firm* — Morgan, Lewis & Bockius LLP

(57) ABSTRACT

A semiconductor device includes bit line structures on a substrate. Each bit line structure extends in a second direction, and the bit line structures are spaced apart from each other in a first direction. The semiconductor device further includes semiconductor patterns spaced apart from each other in the second direction on each of the bit line structures, insulating interlayer patterns between neighboring ones of the semiconductor patterns in the first direction, and word lines spaced apart from each other in the second direction on the bit line structures. Each word line extends in the first direction adjacent to the semiconductor patterns. The semiconductor device further includes capacitors disposed on and electrically connected to the semiconductor patterns, respectively. A seam extending in the second direction is formed in each of the insulating interlayer patterns.

20 Claims, 120 Drawing Sheets

(56) References Cited

U.S. PATENT DOCUMENTS

| | | | |
|---|---|---|---|
| 8,248,876 B2 | 8/2012 | Masuoka et al. | |
| 8,552,472 B2 * | 10/2013 | Kim | H10B 12/053 |
| | | | 257/302 |
| 8,742,493 B2 | 6/2014 | Kim et al. | |
| 9,177,872 B2 | 11/2015 | Sandhu | |
| 9,245,976 B2 | 1/2016 | Cho et al. | |
| 9,576,963 B2 | 2/2017 | Nagai | |
| 11,018,255 B2 * | 5/2021 | Liu | H10D 62/151 |
| 11,145,656 B2 | 10/2021 | Ramaswamy | |
| 11,398,484 B1 * | 7/2022 | Fan | H10B 12/482 |
| 2019/0157275 A1 * | 5/2019 | Lee | H01L 21/76834 |
| 2020/0111800 A1 * | 4/2020 | Ramaswamy | H10B 12/033 |
| 2020/0227416 A1 | 7/2020 | Lilak et al. | |
| 2021/0013210 A1 | 1/2021 | Lee et al. | |
| 2021/0242210 A1 | 8/2021 | Lee | |
| 2022/0077158 A1 | 3/2022 | Chen et al. | |
| 2022/0102352 A1 * | 3/2022 | Lee | H10B 12/395 |
| 2022/0149052 A1 | 5/2022 | Kim | |
| 2024/0064967 A1 * | 2/2024 | Hsu | H10B 12/315 |

OTHER PUBLICATIONS

Office Action dated Nov. 3, 2023 in corresponding Taiwan Patent
Application No. 112105829 (10 pages).
Taiwan Search Report dated Nov. 3, 2023 in corresponding Taiwan
Patent Application No. 112105829 (2 pages).

\* cited by examiner

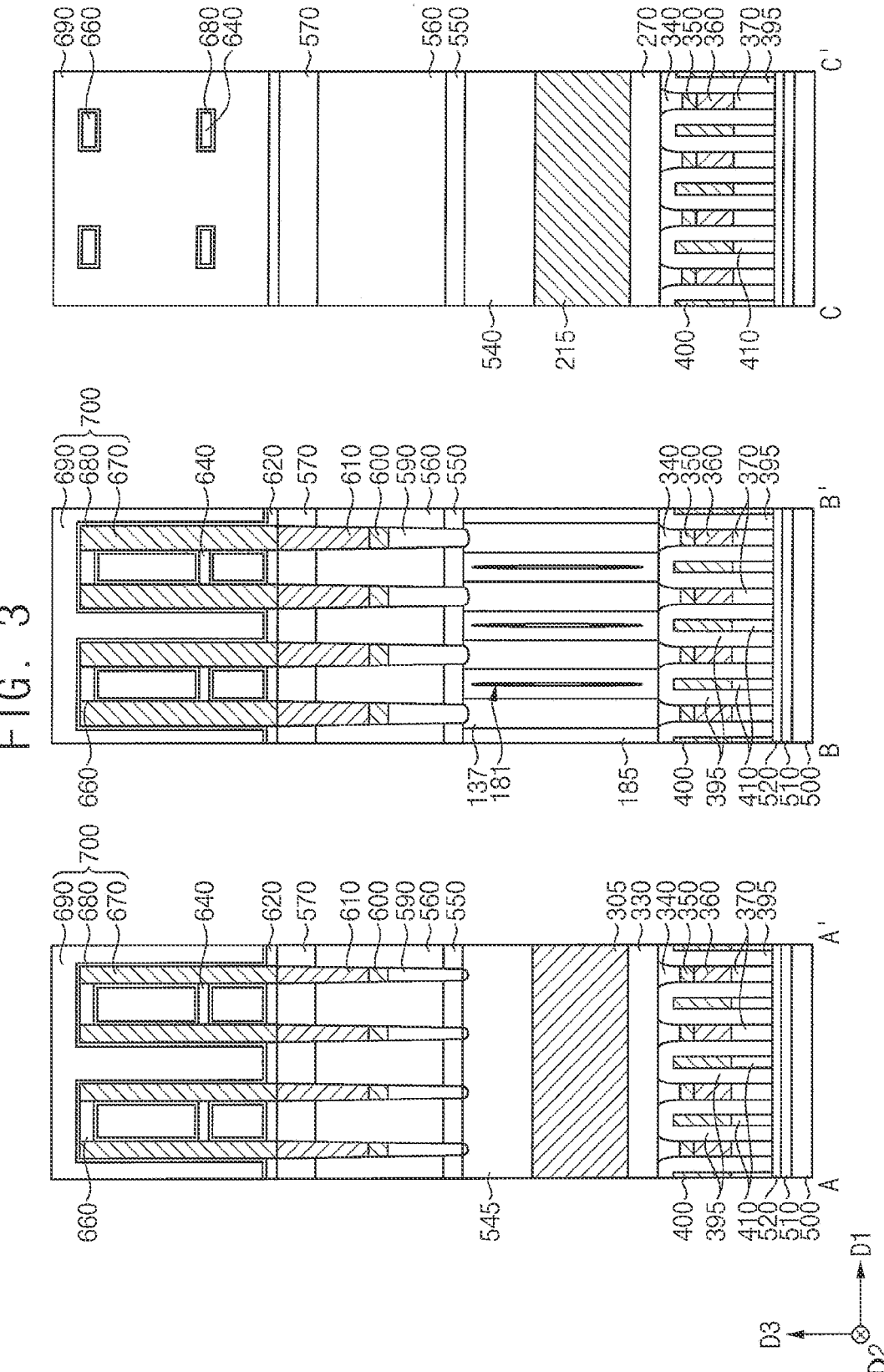
F I G.   3

FIG. 6
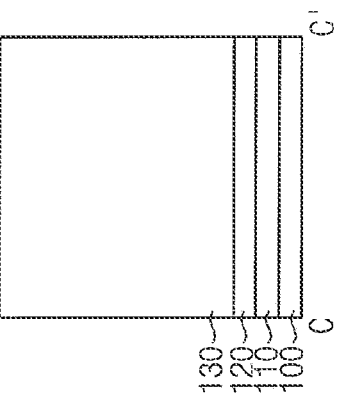
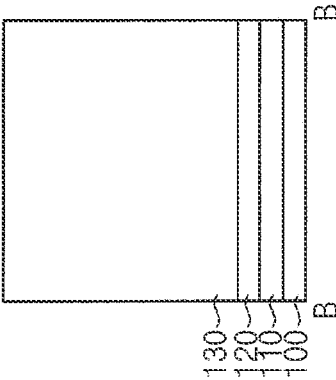
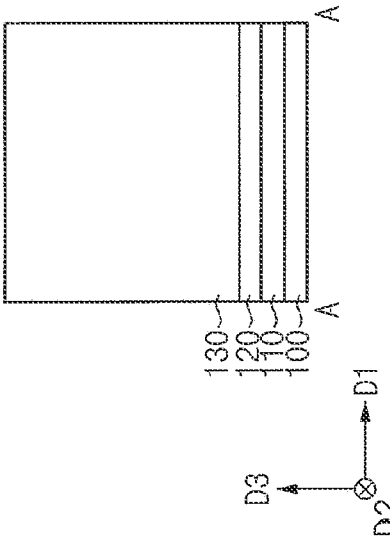

FIG. 7
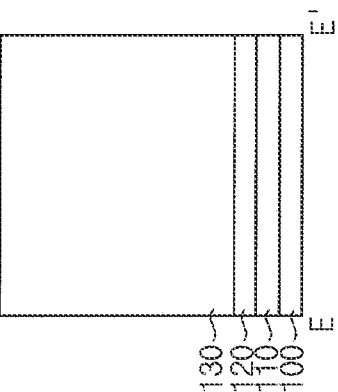
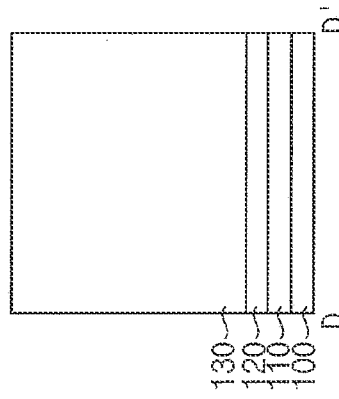
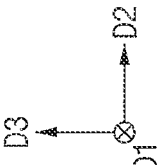

FIG. 9
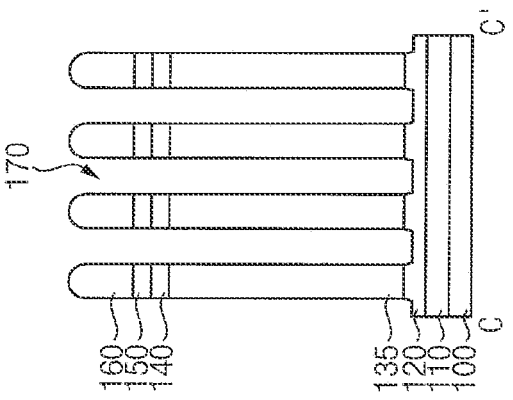
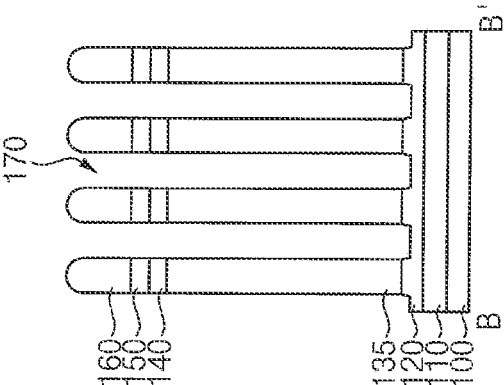
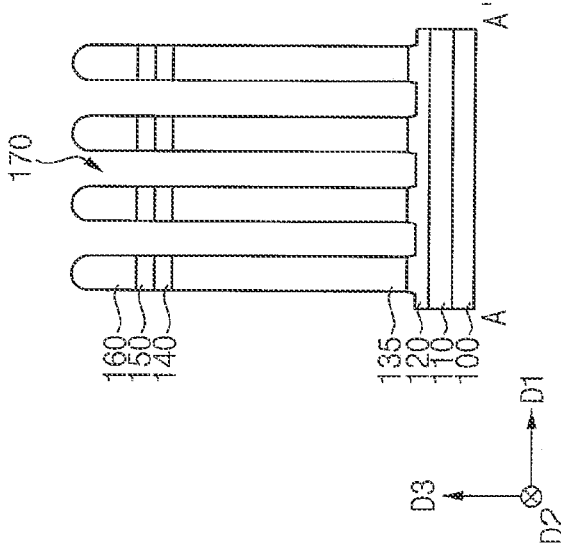

FIG. 10
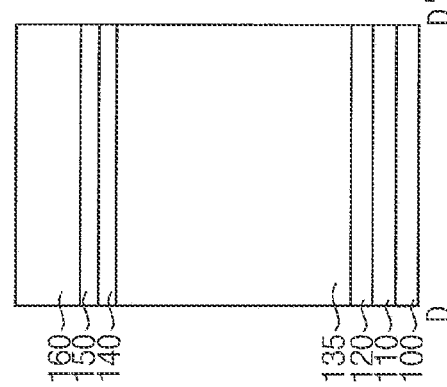
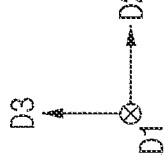

FIG. 11
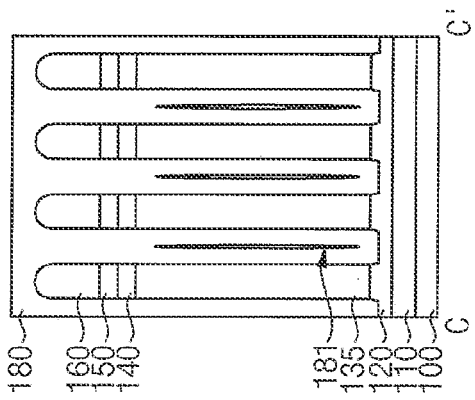
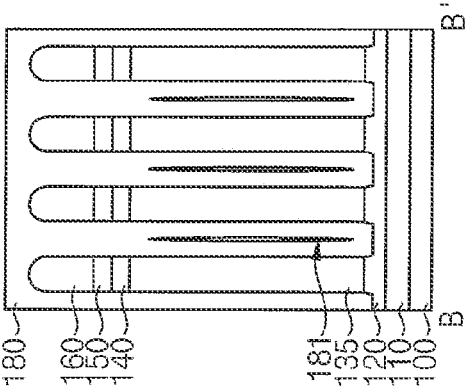
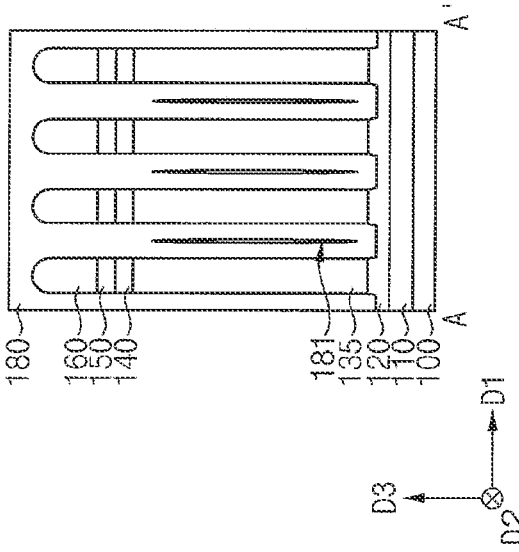

FIG. 12
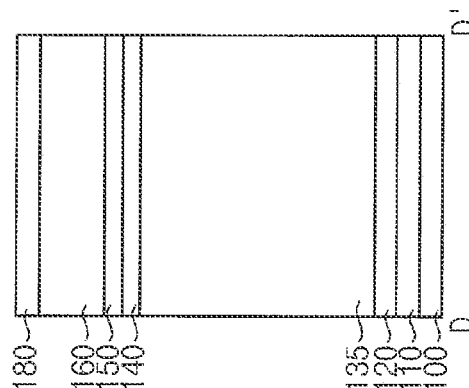
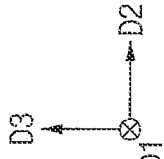

FIG. 14
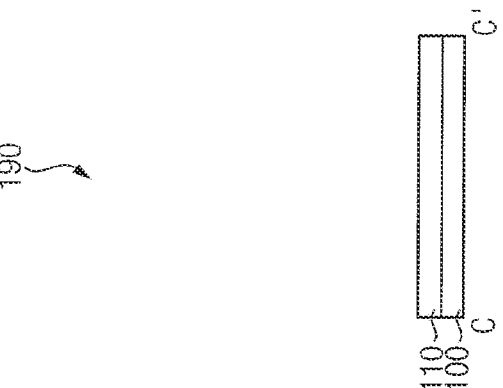
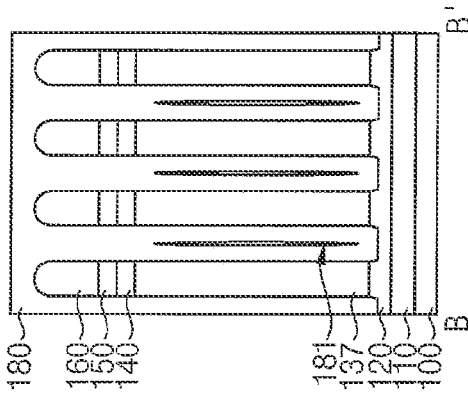
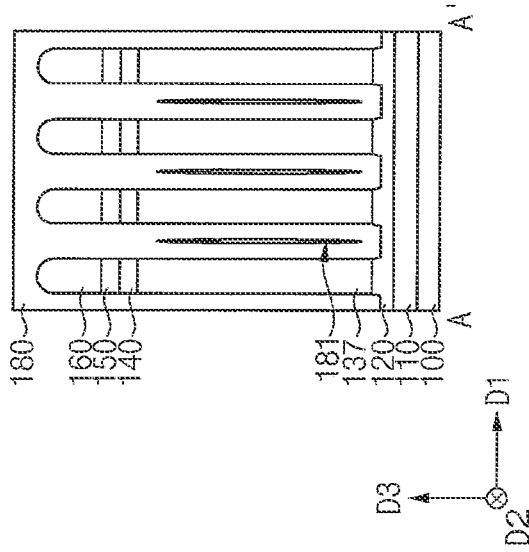

FIG. 15
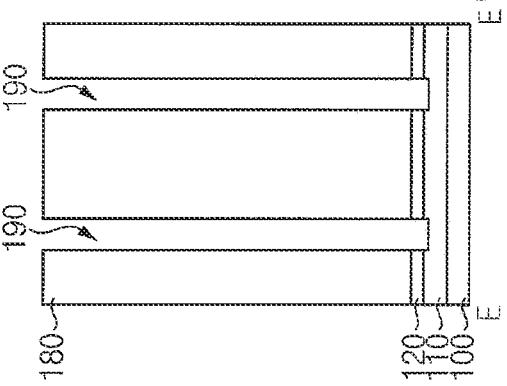
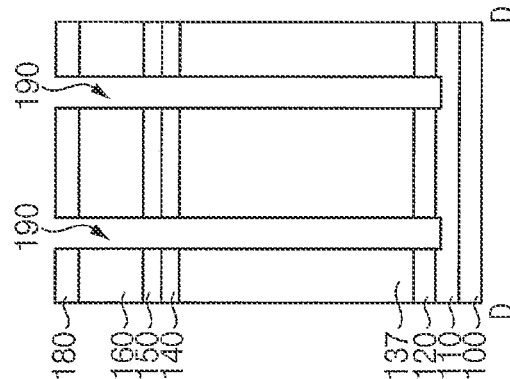
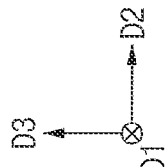

FIG. 16

FIG. 17
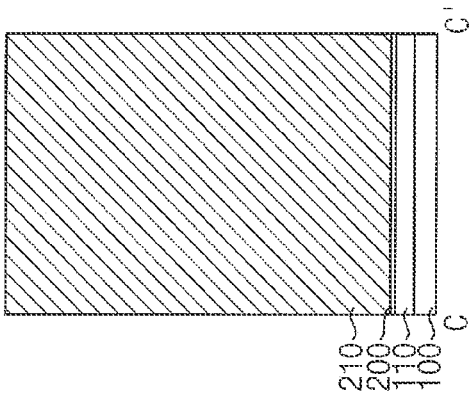
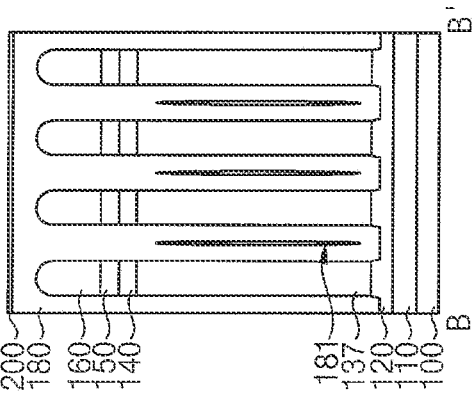
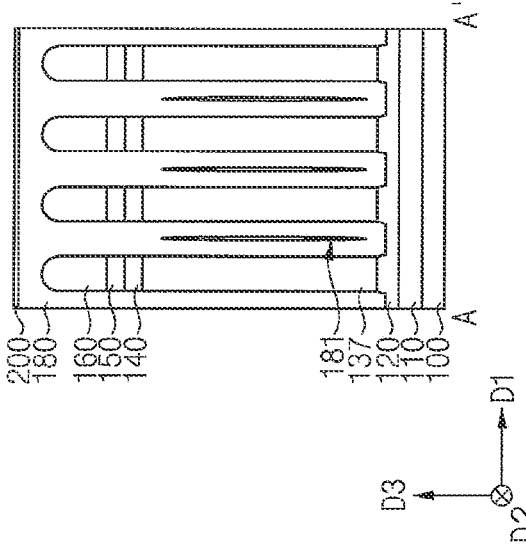

FIG. 18
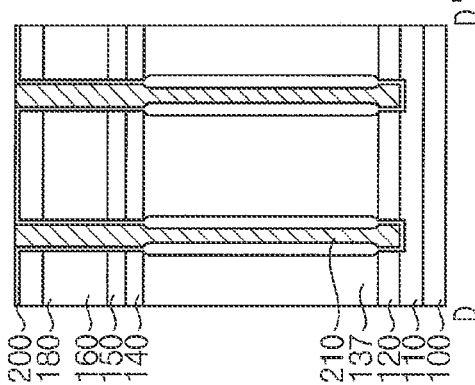
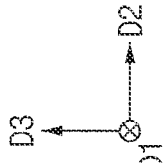

FIG. 20
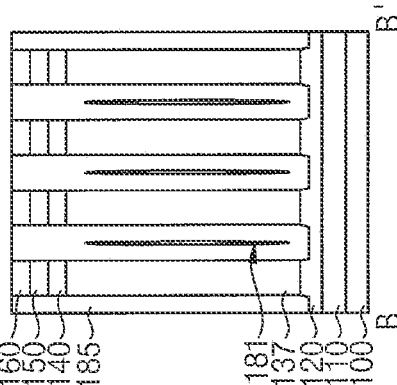
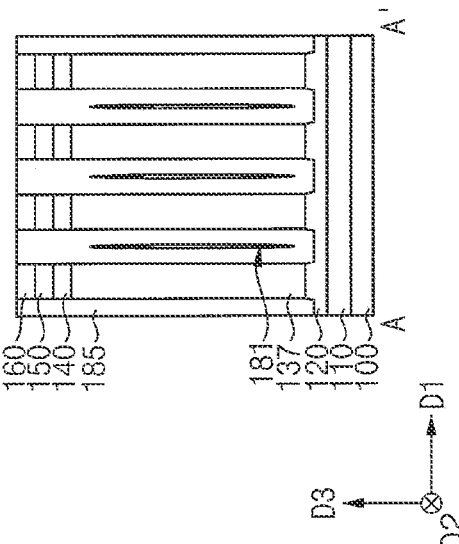

FIG. 23
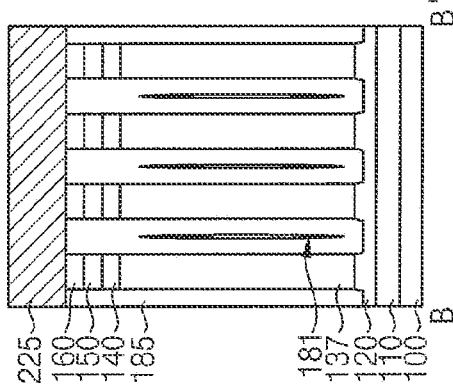
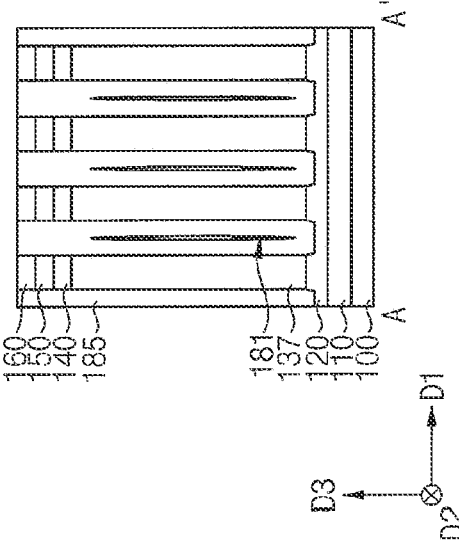

FIG. 24
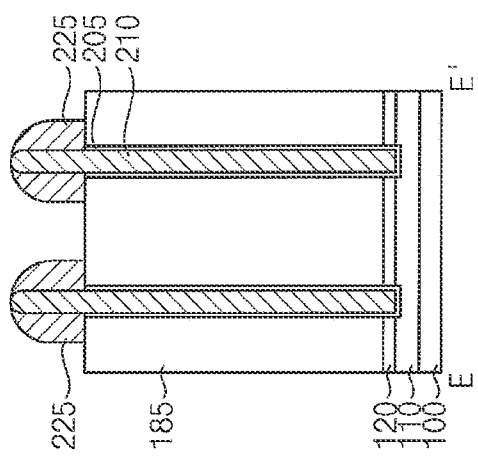
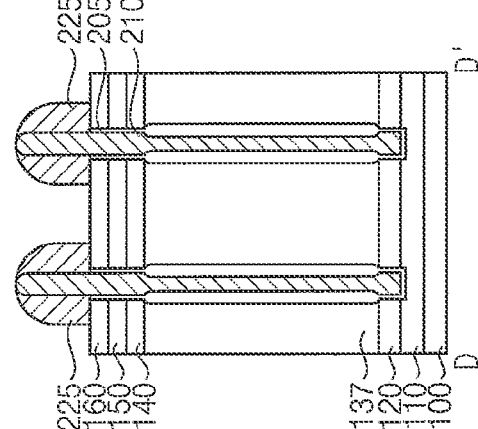
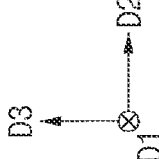

FIG. 26
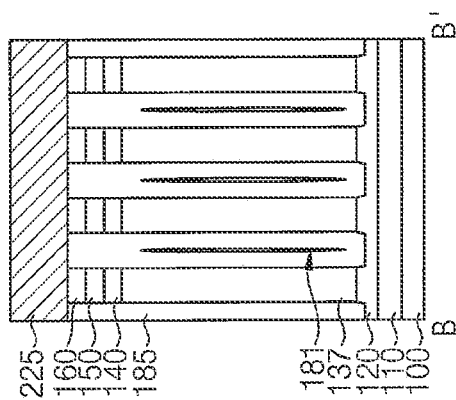
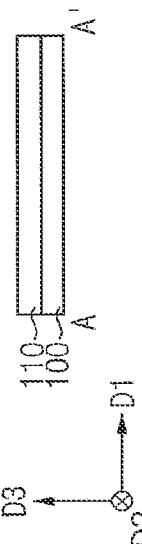

FIG. 27
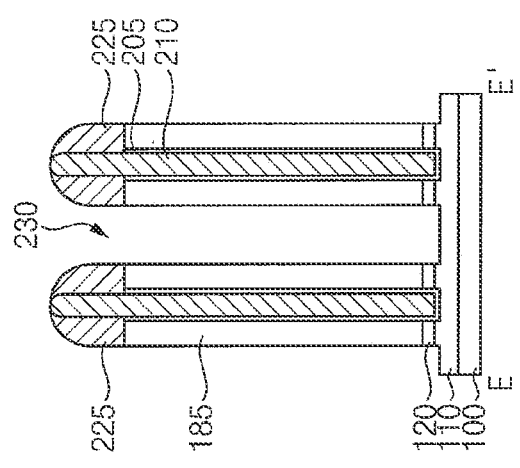
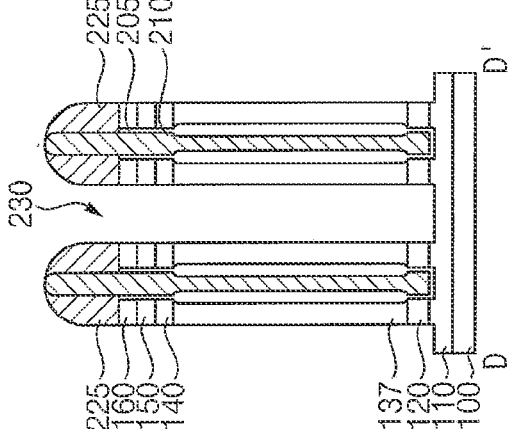
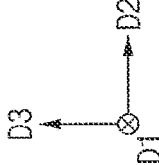

F I G. 28
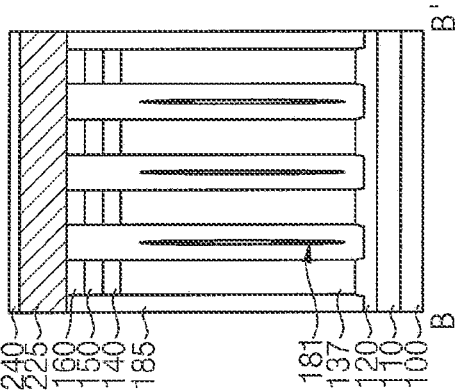
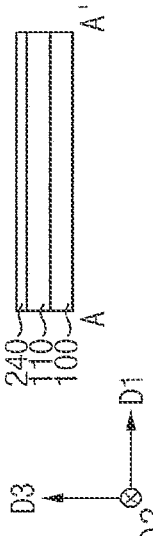

FIG. 29

FIG. 30
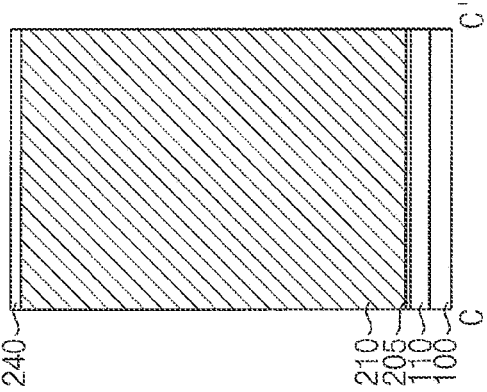
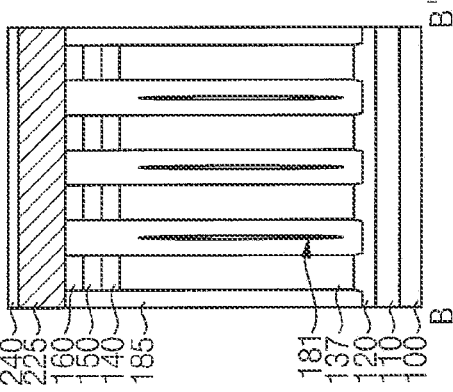
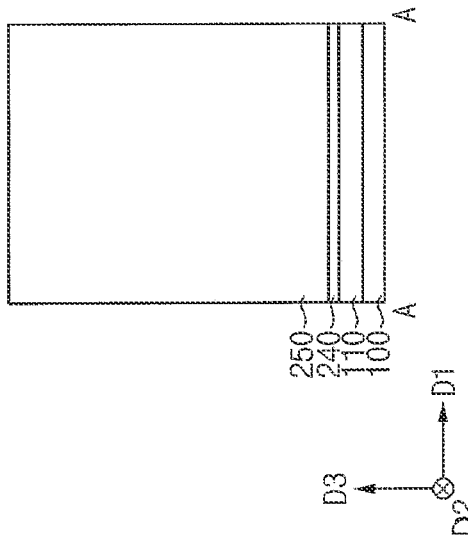

FIG. 31

FIG. 33
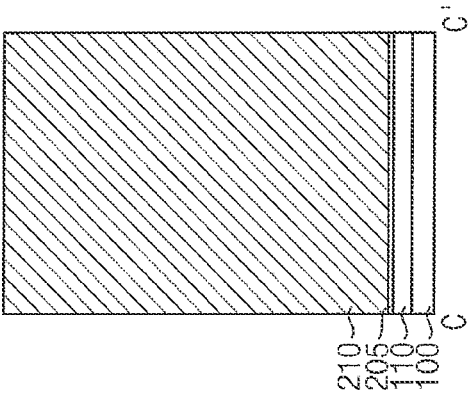
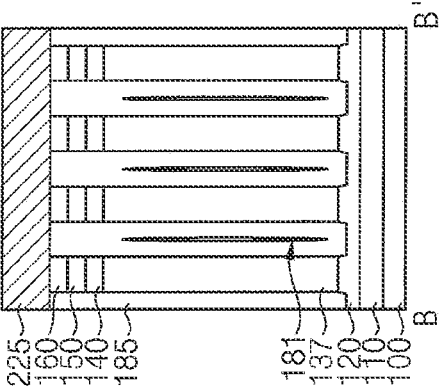
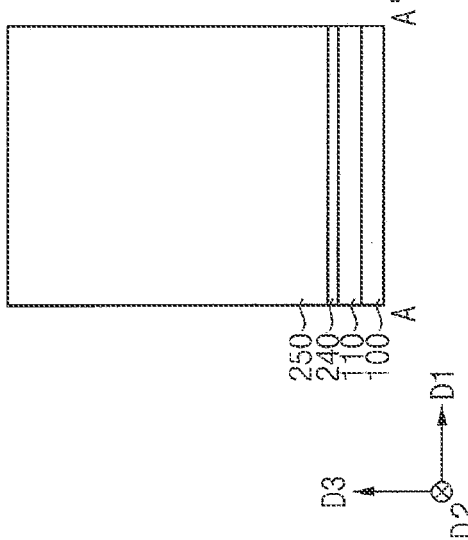

F I G. 34
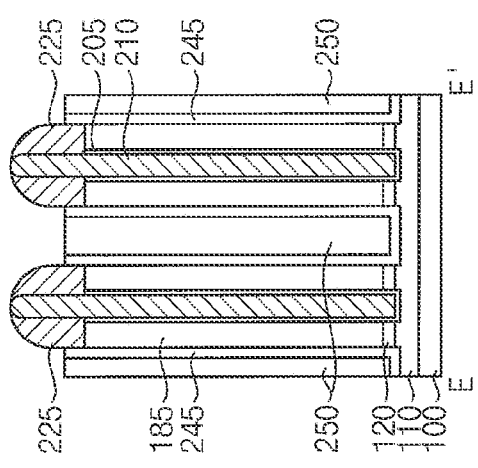
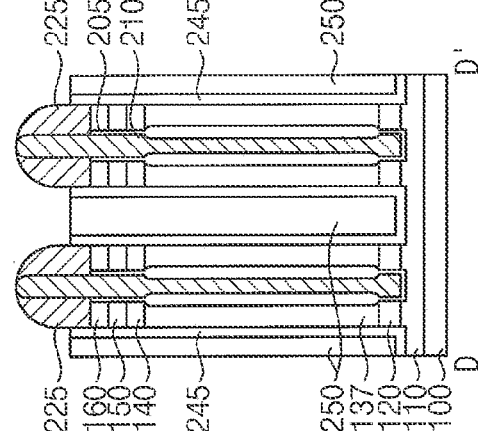

FIG. 36
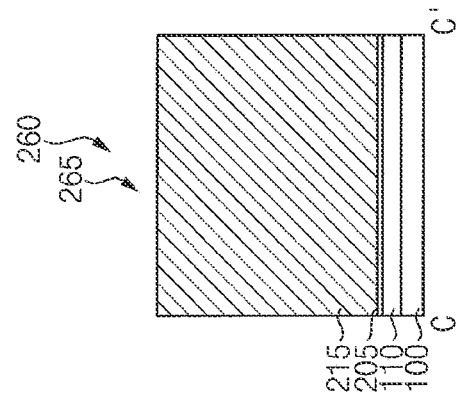
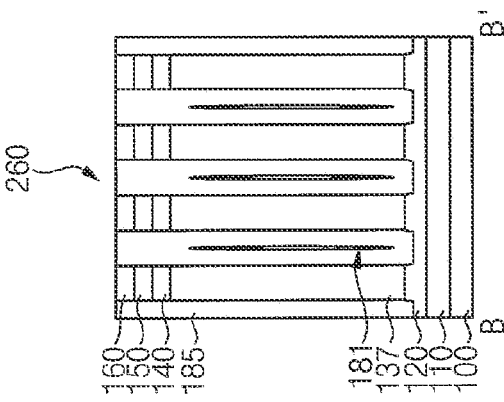
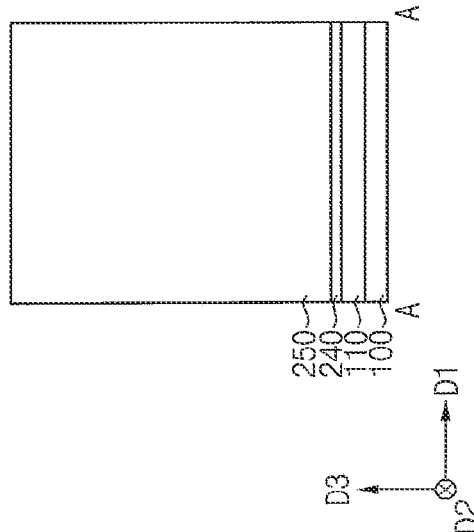

FIG. 37
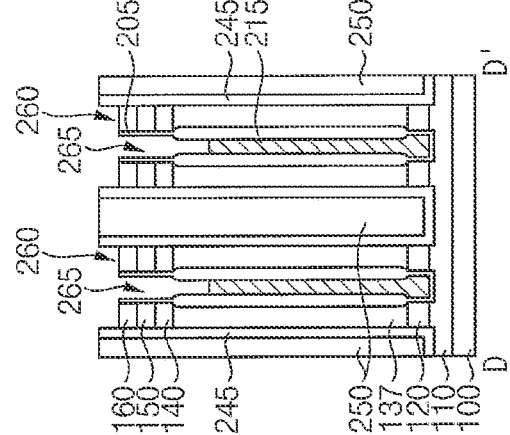
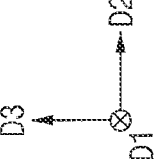

FIG. 39
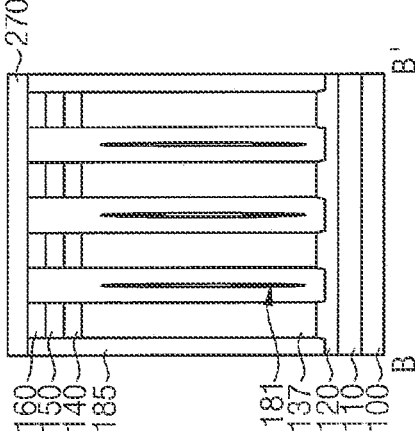
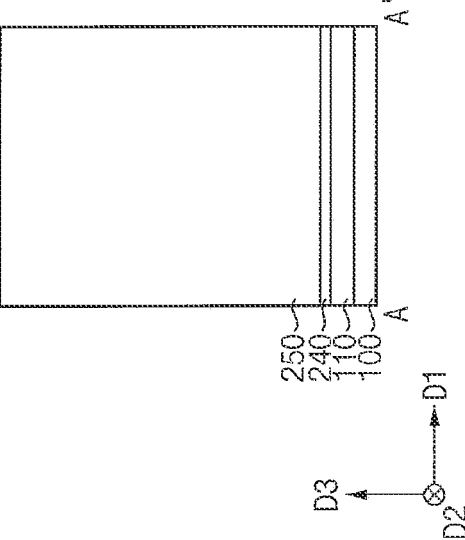

FIG. 40
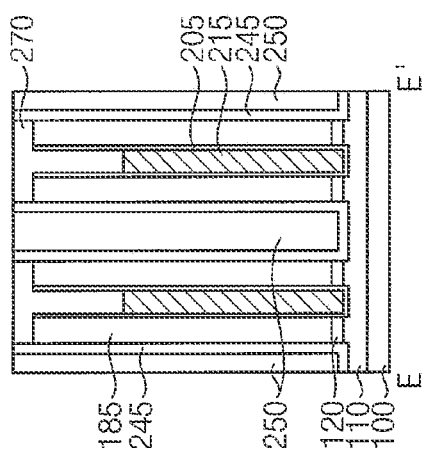
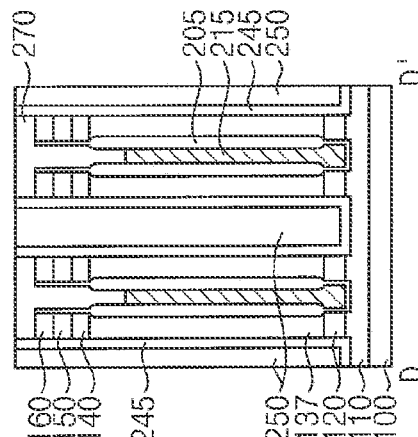

FIG. 41
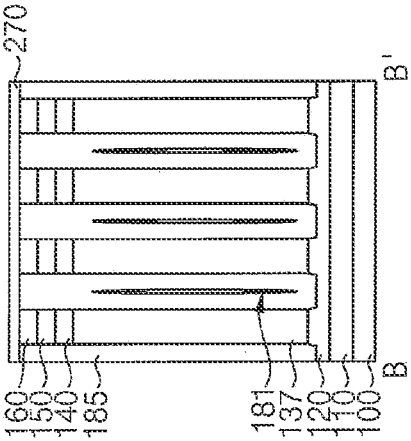
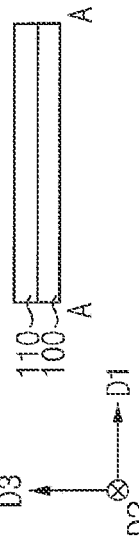

FIG. 42

F I G. 43
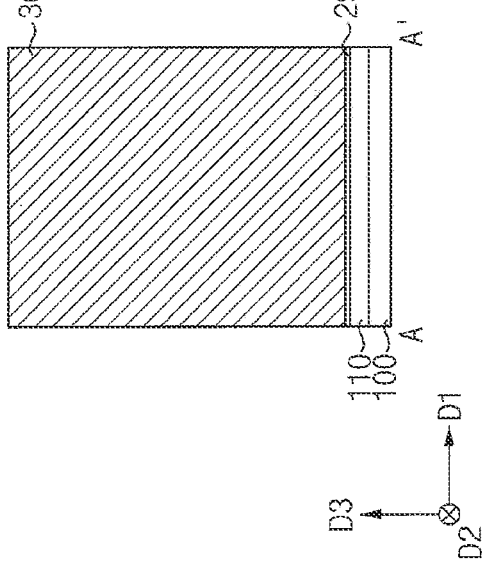

FIG. 44
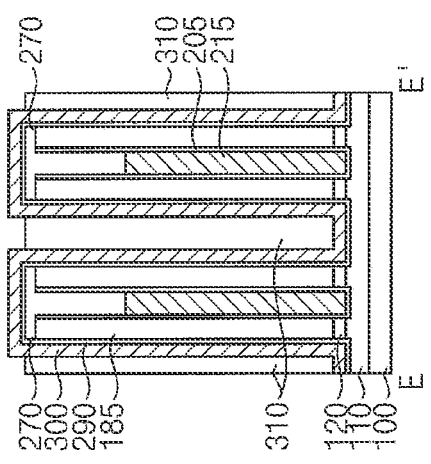
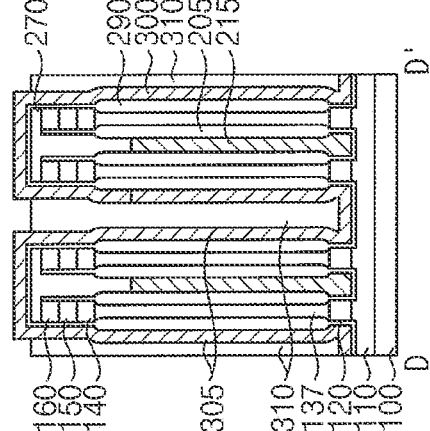
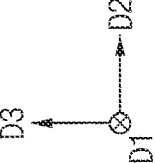

FIG. 45
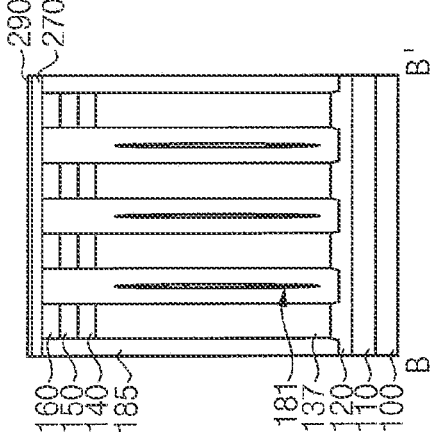
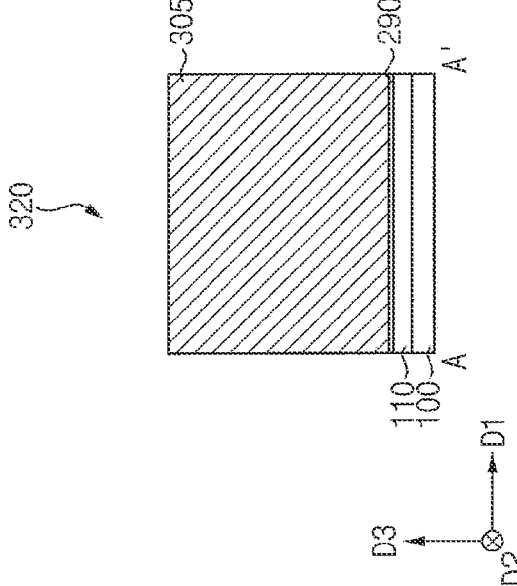

FIG. 47
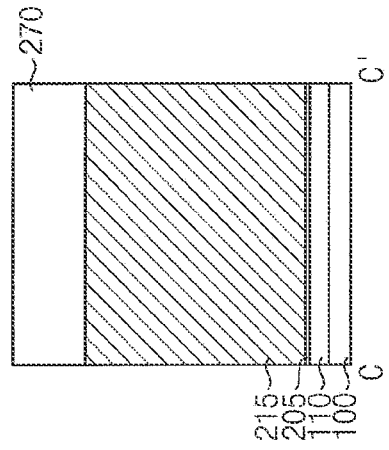
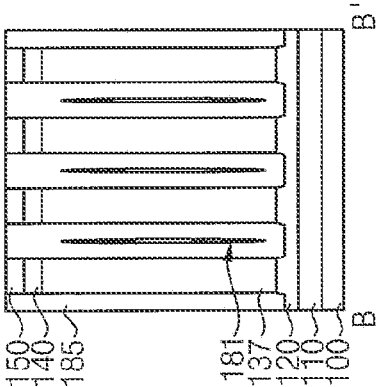
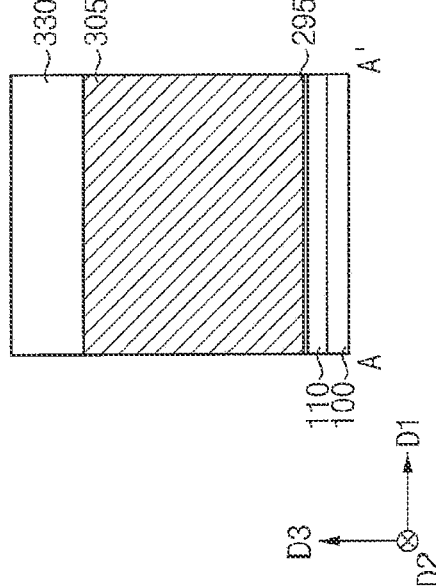

FIG. 50
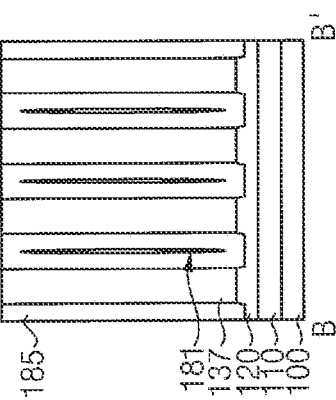
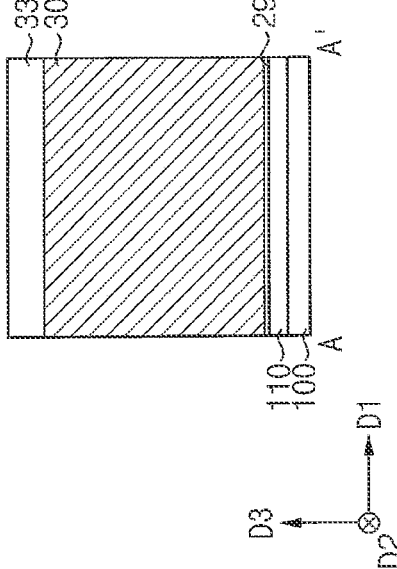

330 295 305 310 205 215

270 330 305 185 295 310 120 110 100

E E'

330 270 305 310 205 215 295

270 330 305 310 137 120 110 100

D D'

D3 D2
D1

FIG. 53
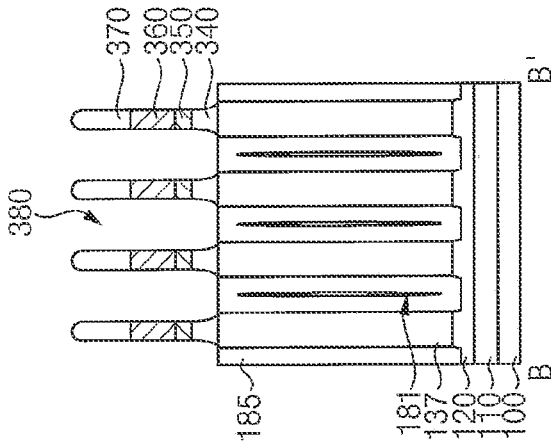
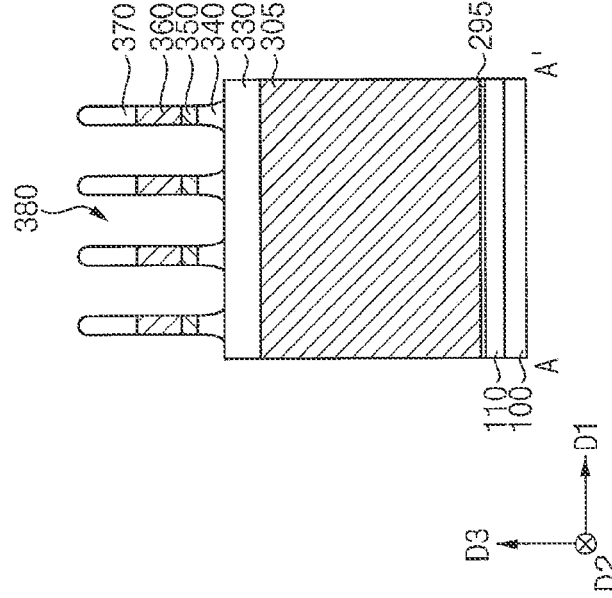

FIG. 54
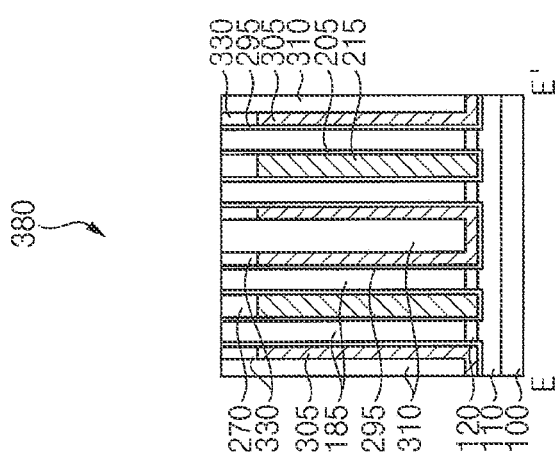
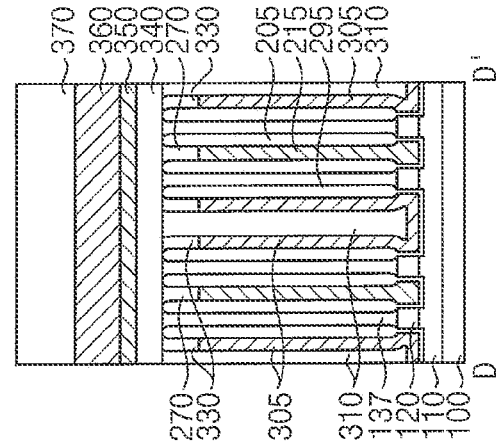
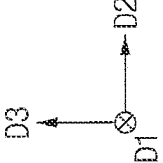

FIG. 55
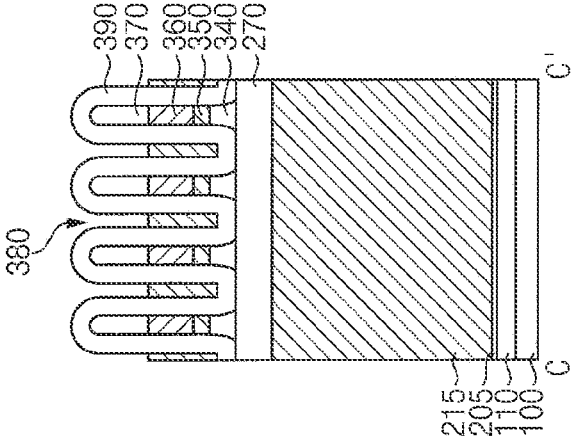
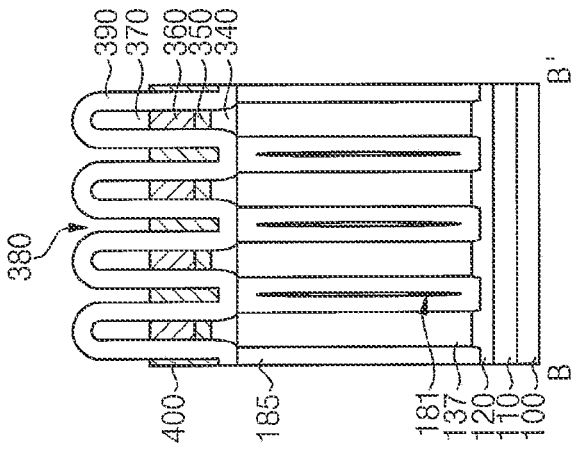
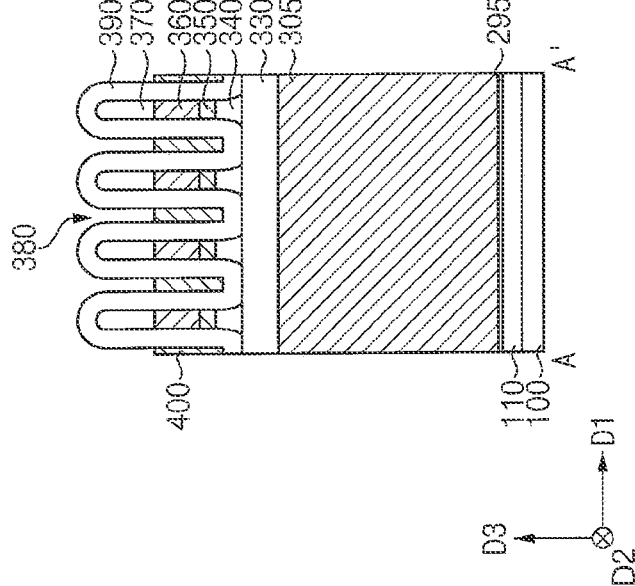

FIG. 56
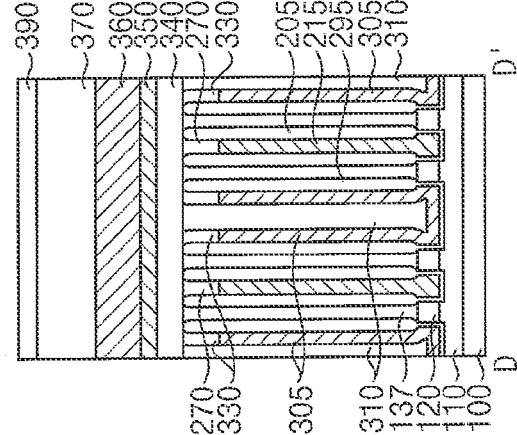
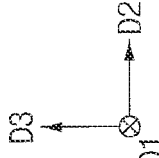

FIG. 58
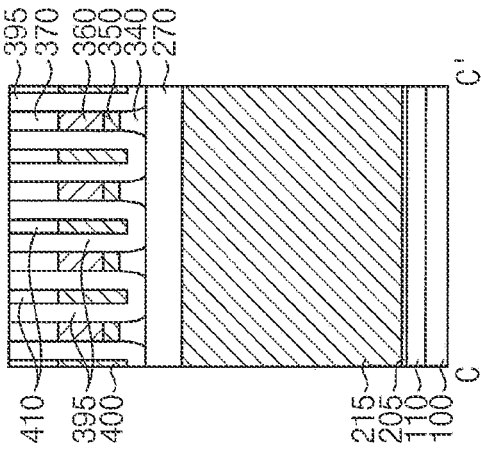
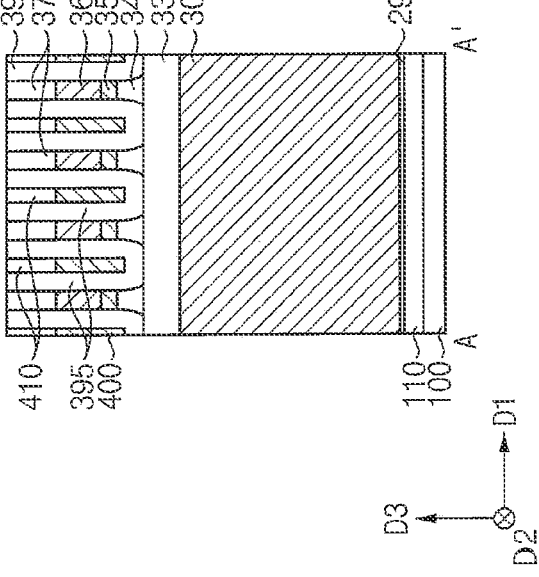

FIG. 60
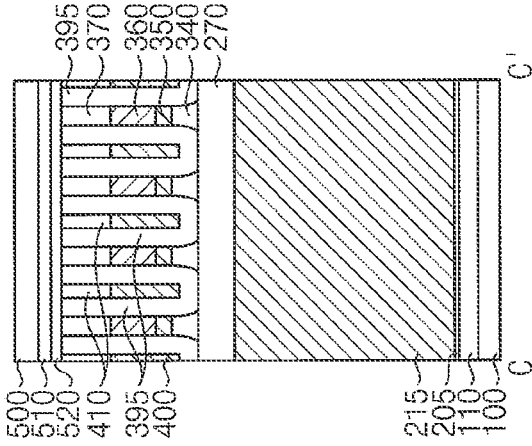
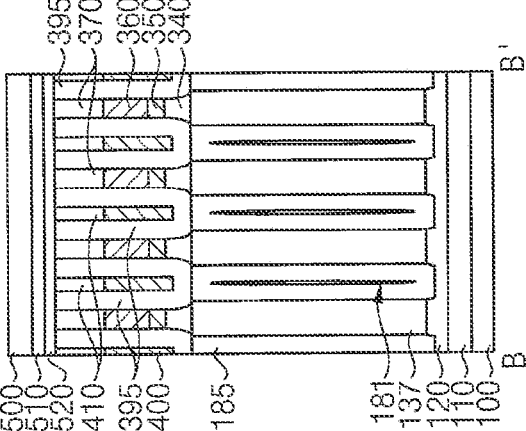
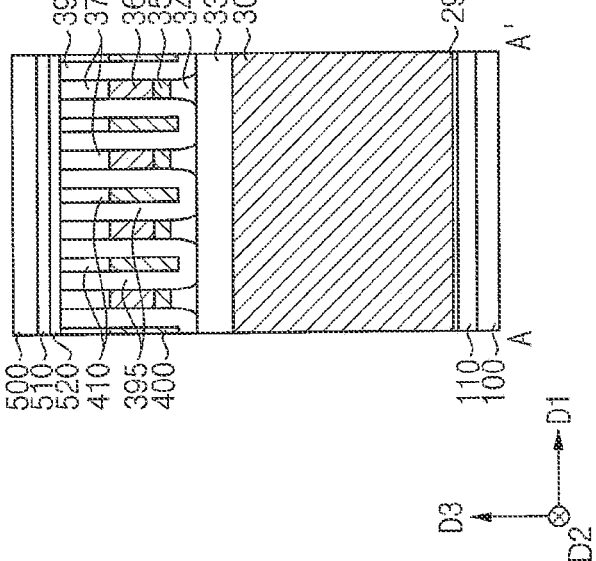

F I G.  62
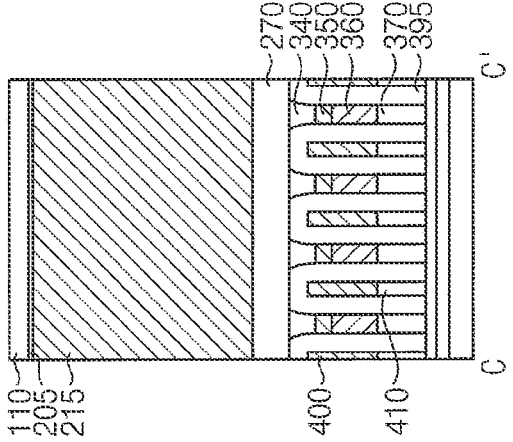
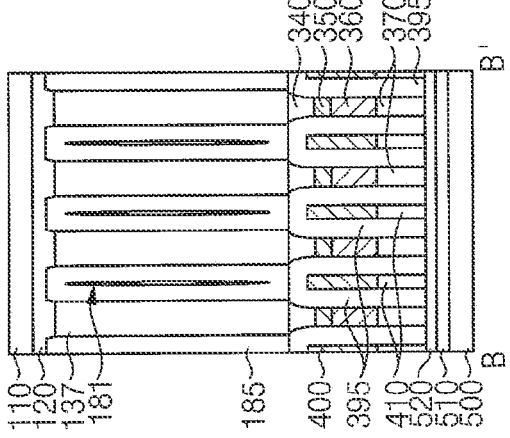
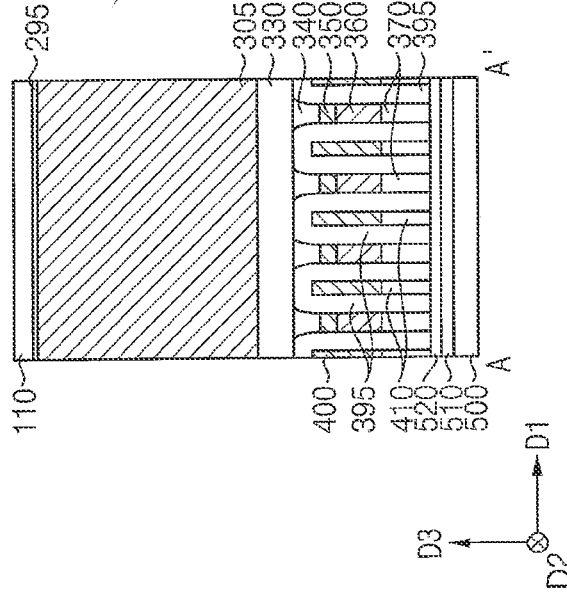

FIG. 63
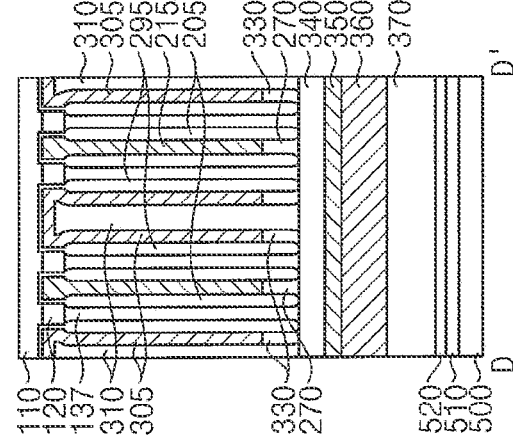
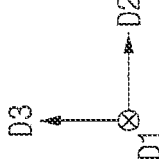

FIG. 65
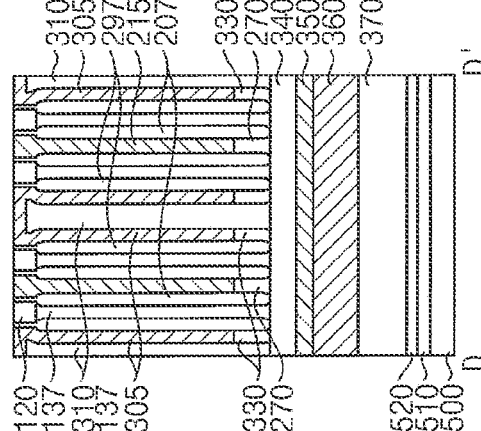
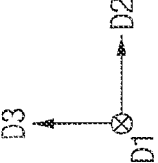

F I G. 67
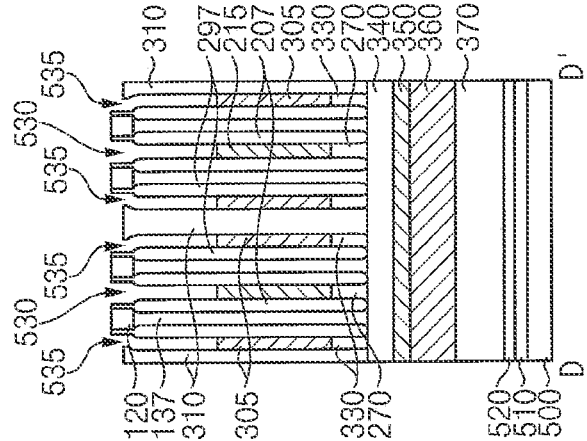
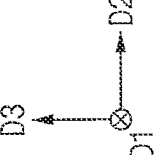

F I G . 6 9
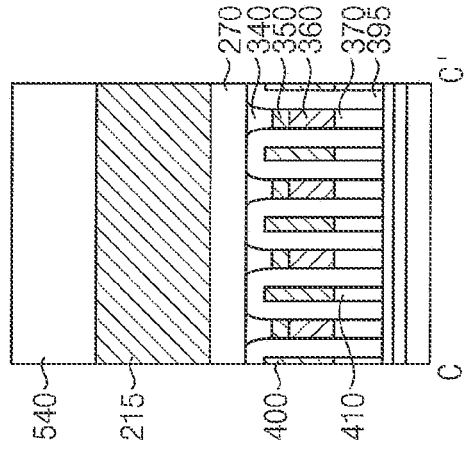
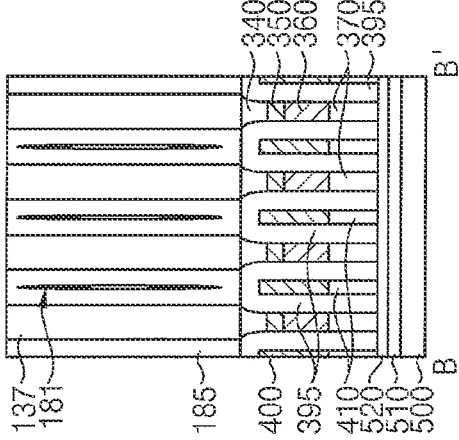
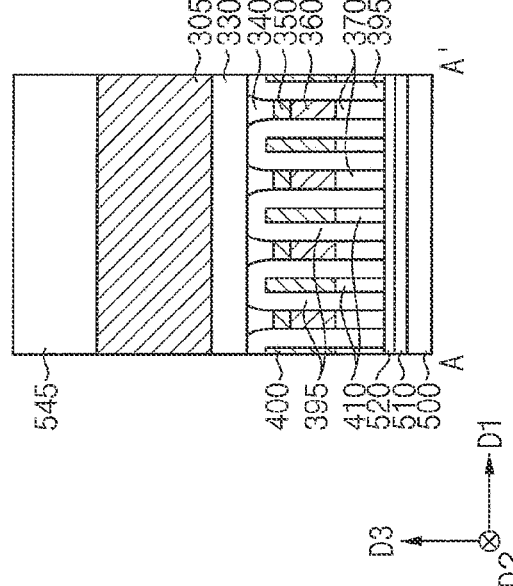

FIG. 70
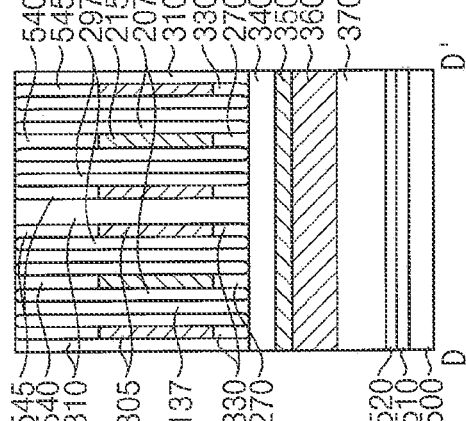
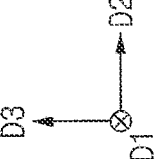

FIG. 72
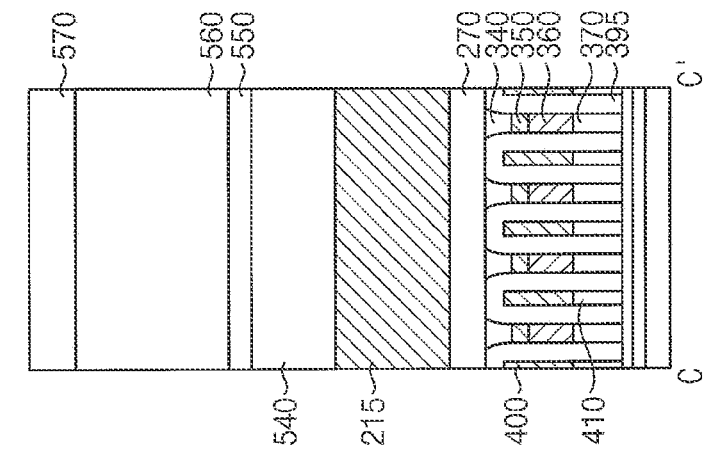
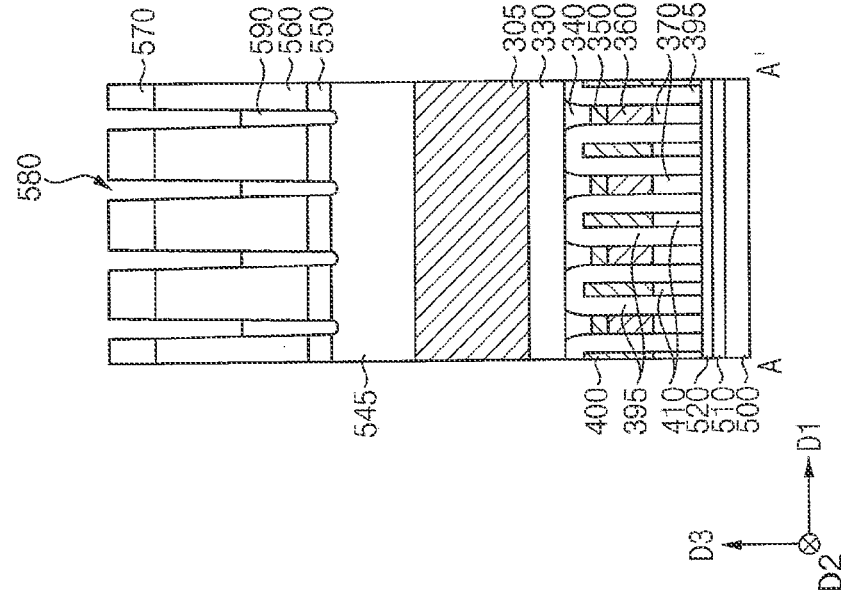

FIG. 75
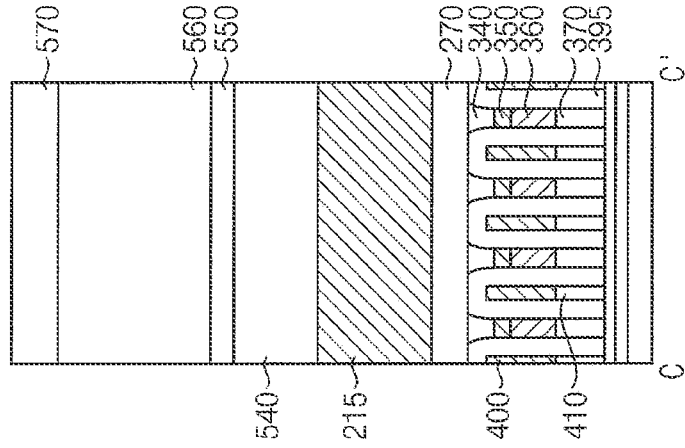
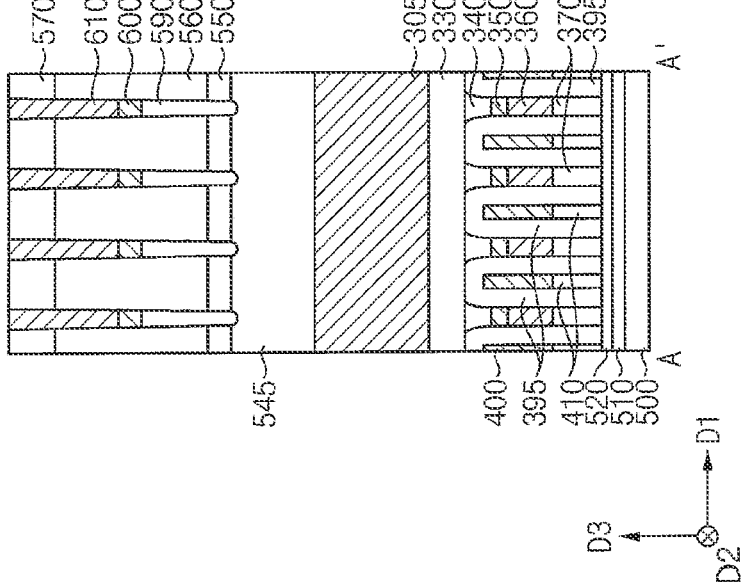

FIG. 76
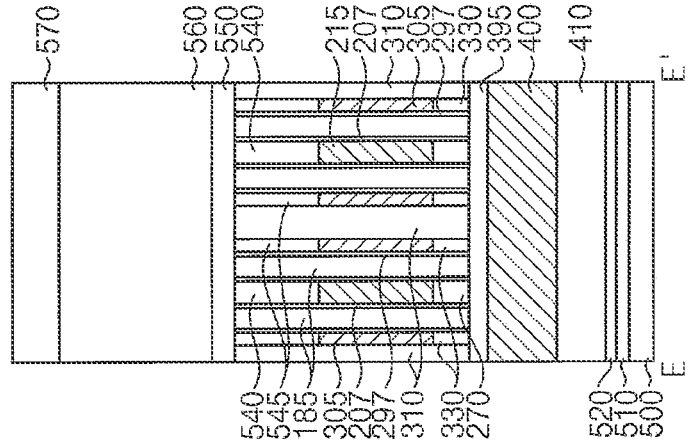
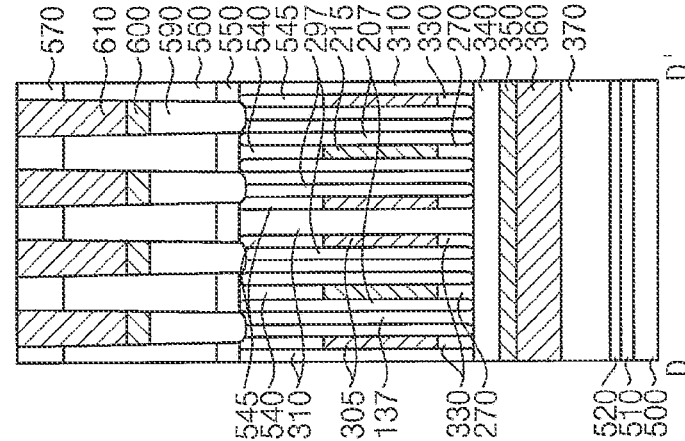

FIG. 78
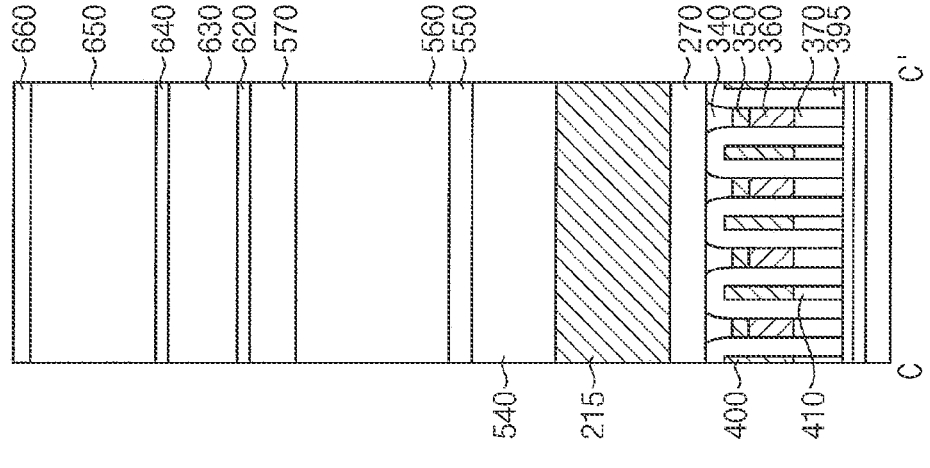
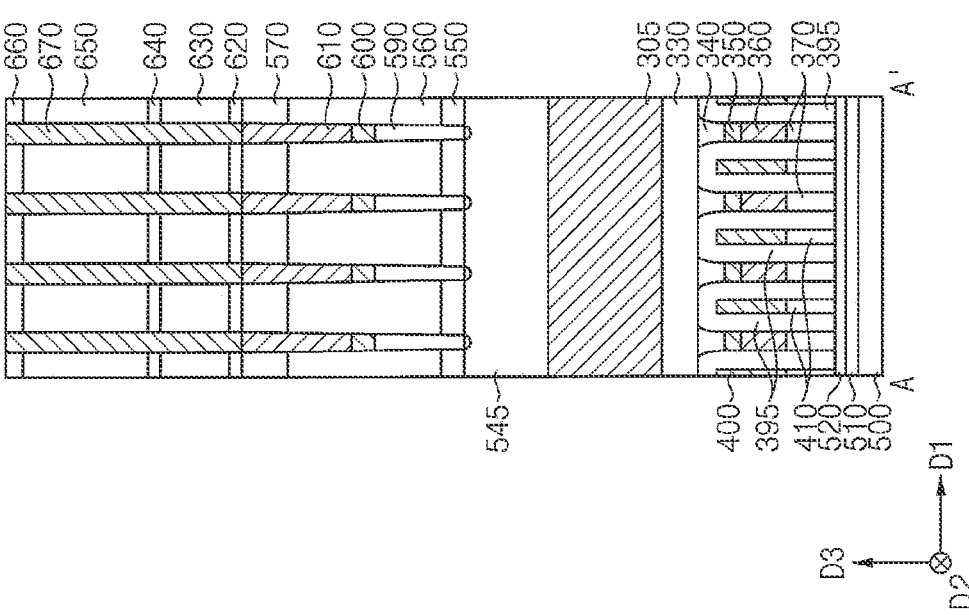

FIG. 79
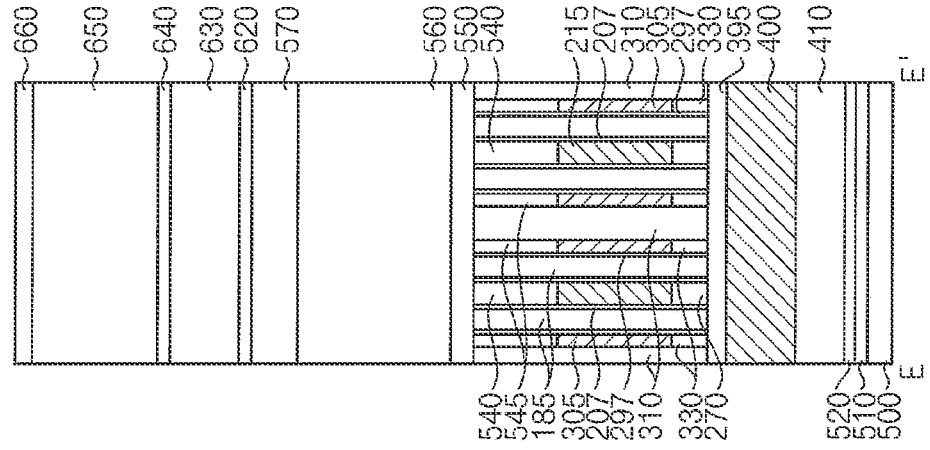
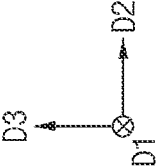

FIG. 81
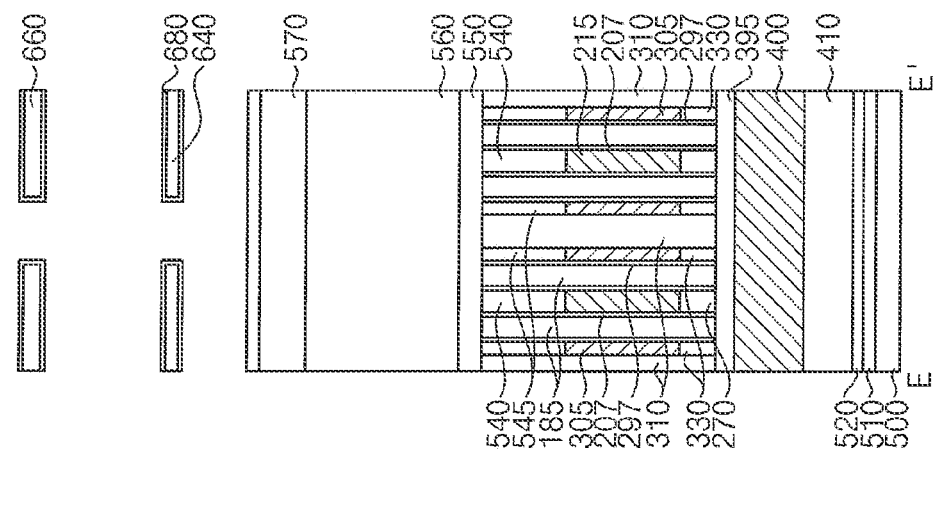
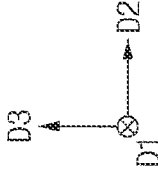

FIG. 86

FIG. 87
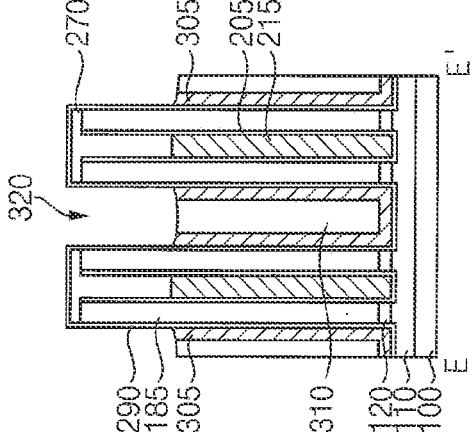
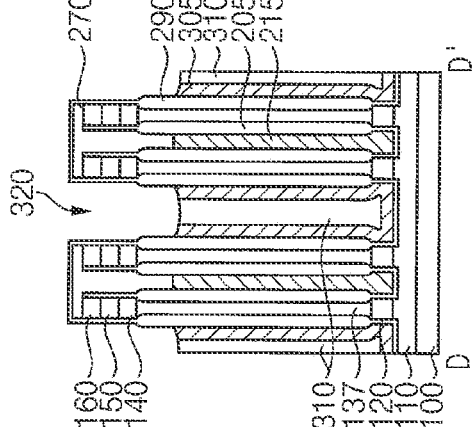
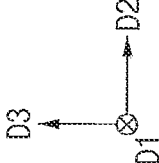

FIG. 91
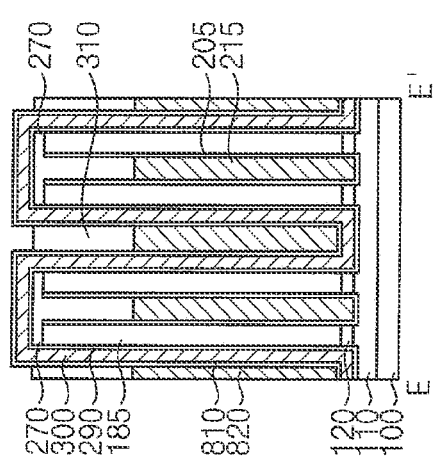
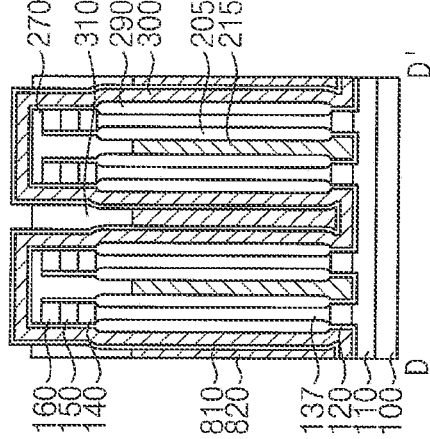
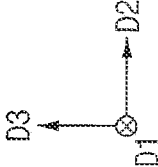

FIG. 92
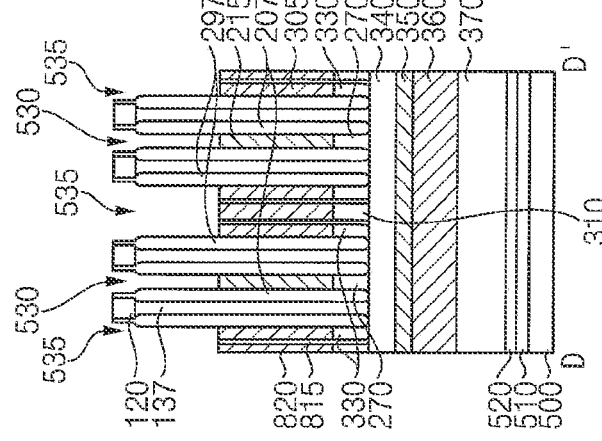
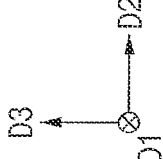

FIG. 93
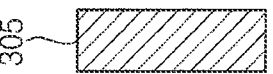
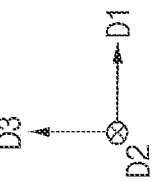

FIG. 100
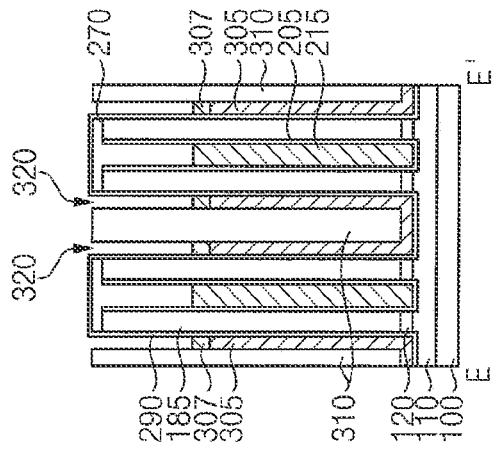
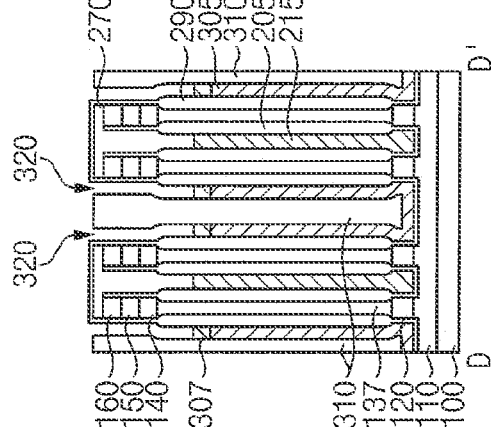
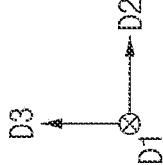

FIG. 101
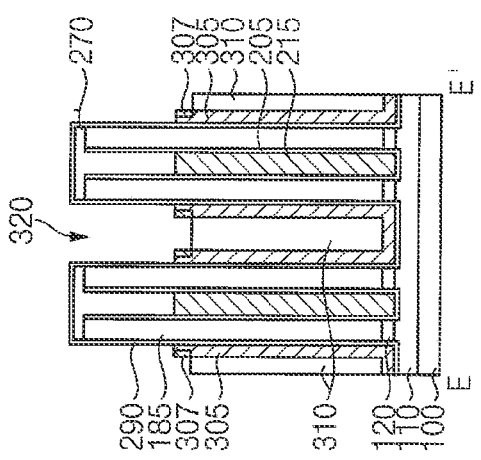
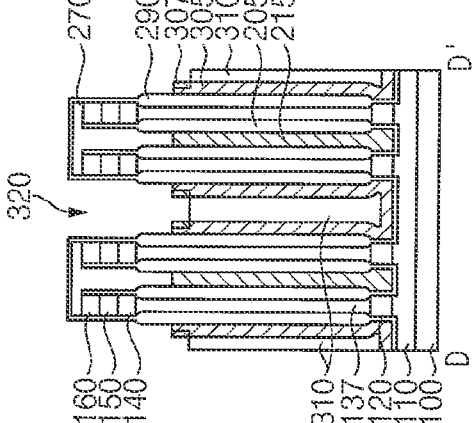
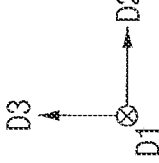

FIG. 102
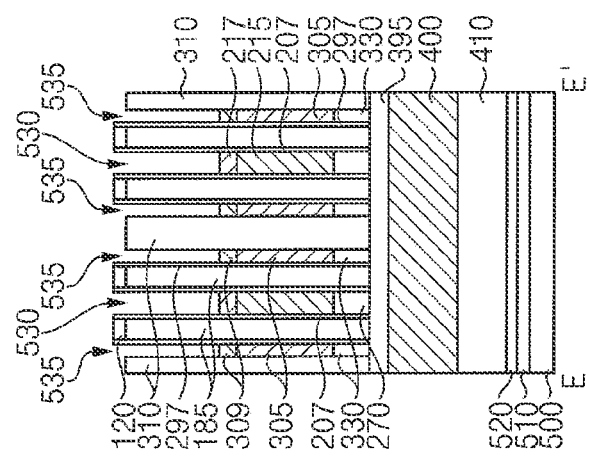
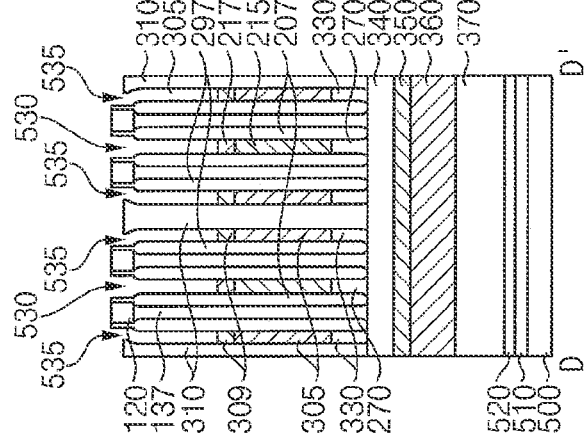
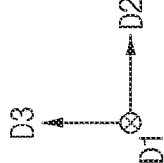

FIG. 103
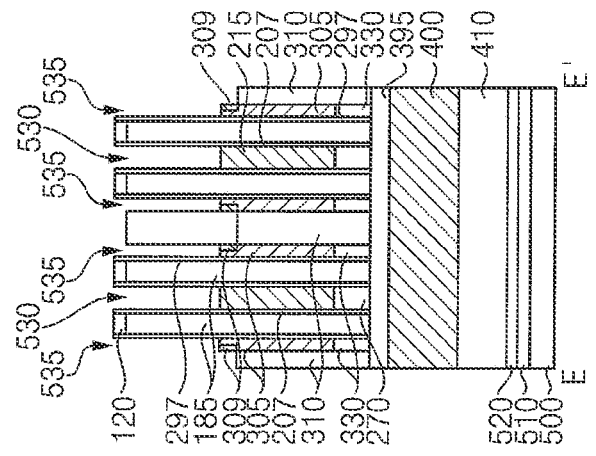
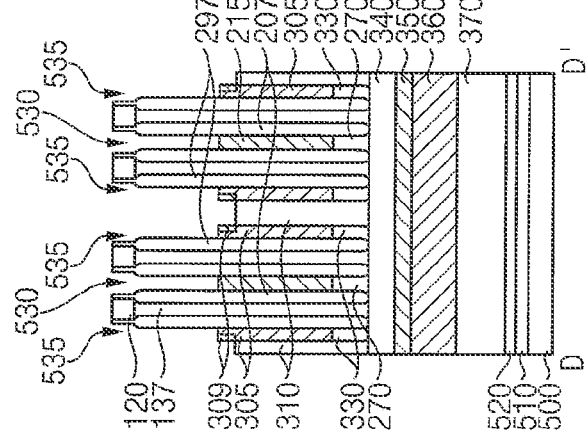
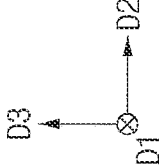

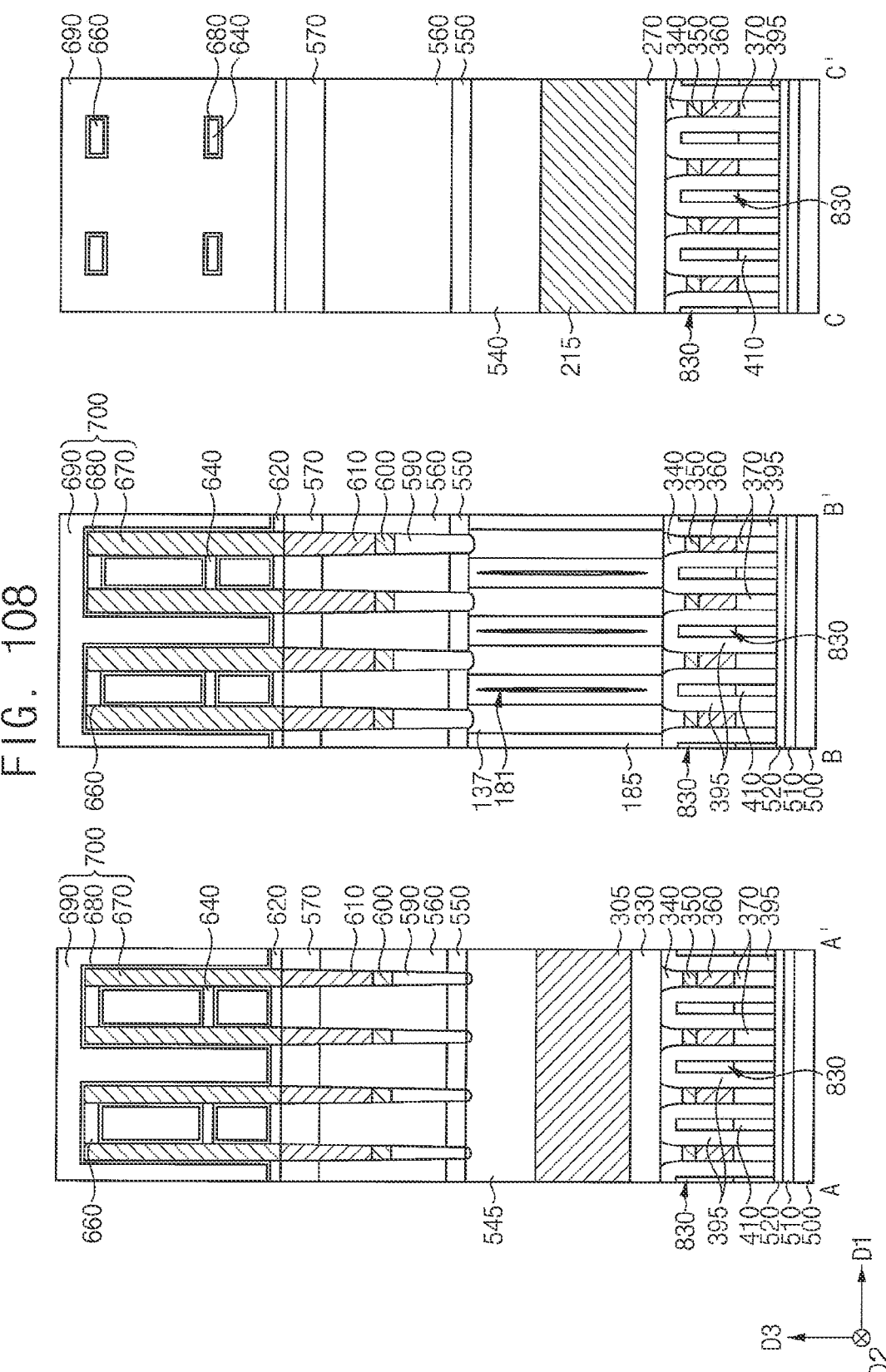
F I G. 108

FIG. 109
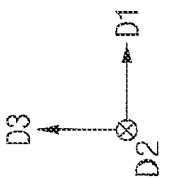

F I G. 111
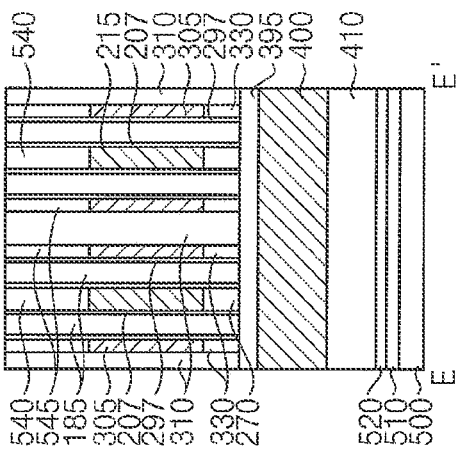
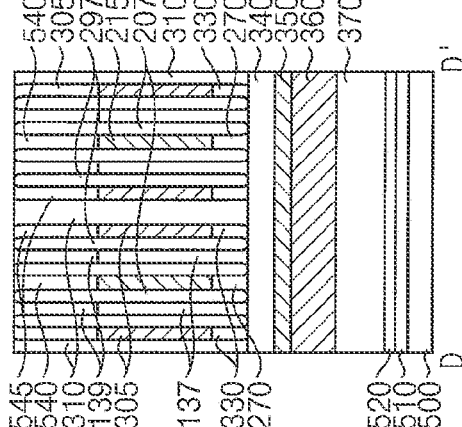
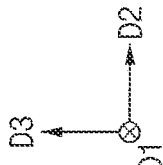

FIG. 113
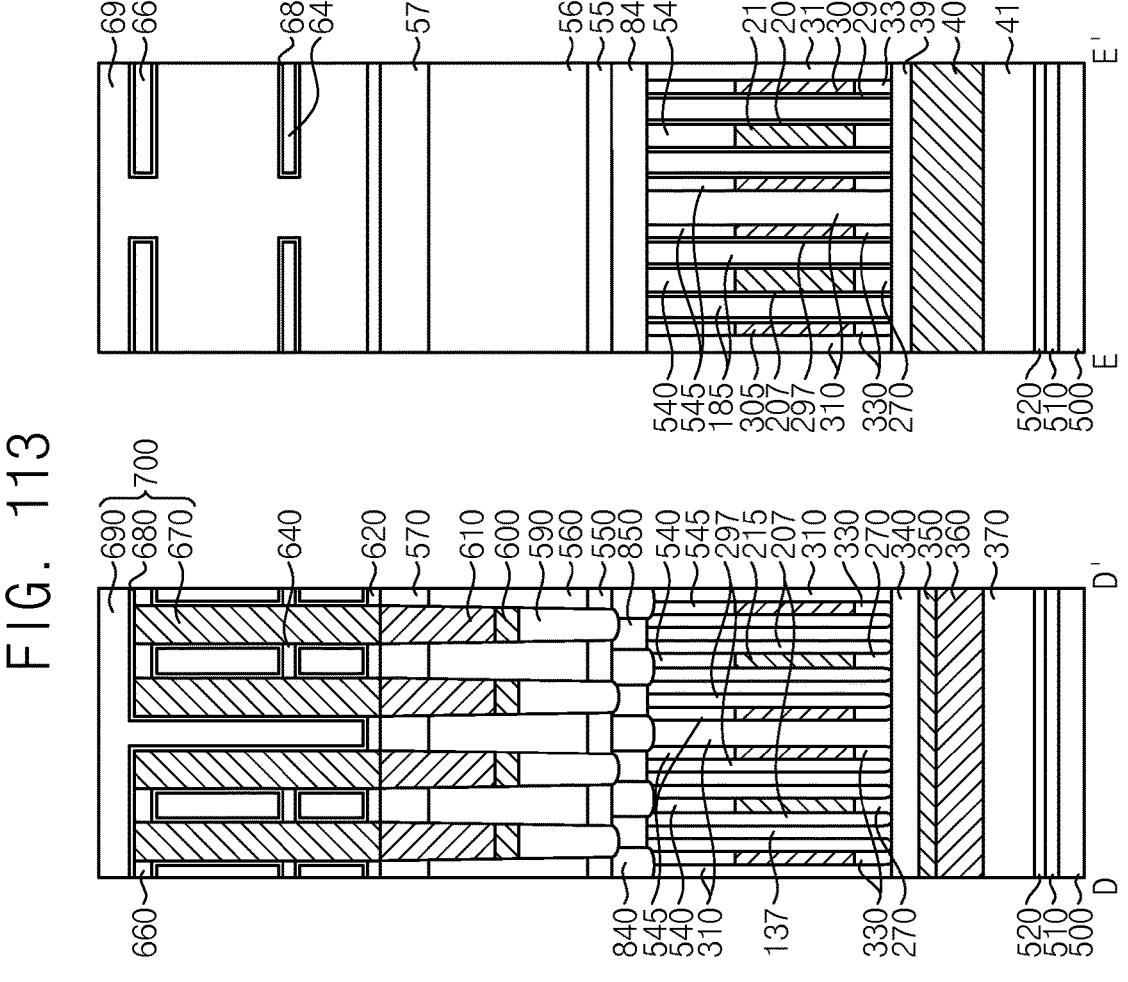
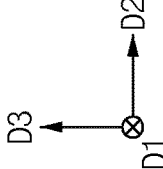

FIG. 114
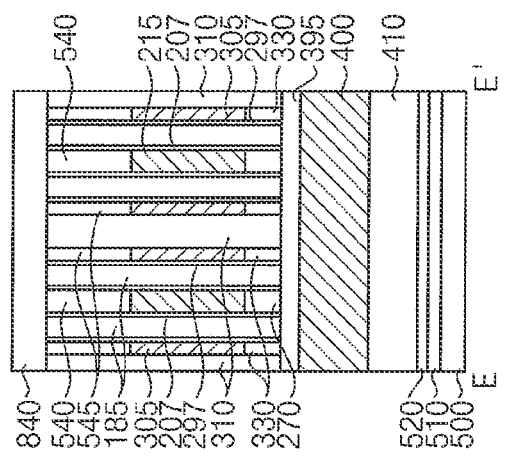
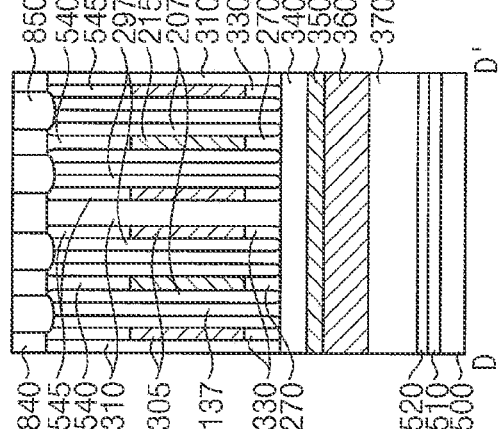
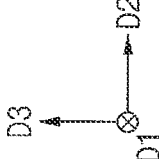

FIG. 115
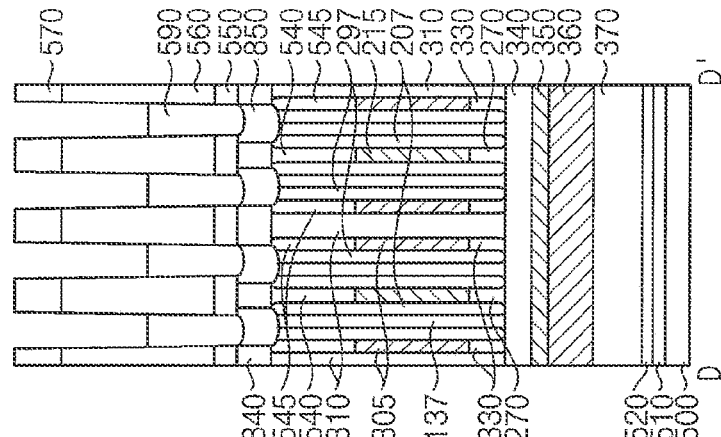
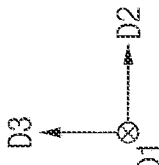

FIG. 116
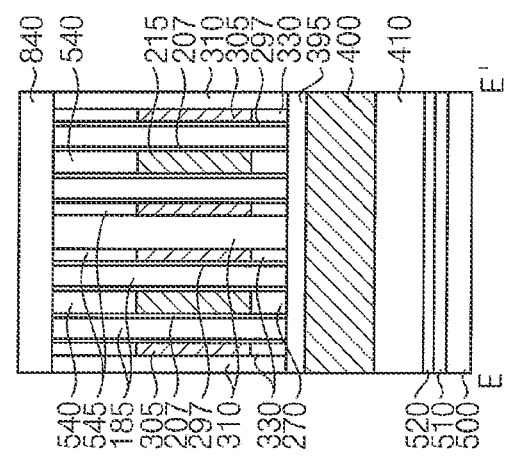
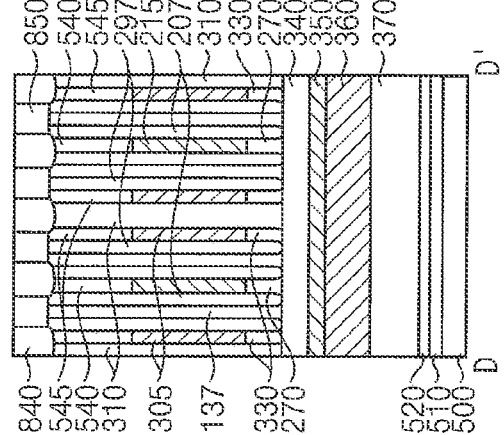
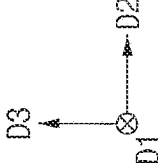

FIG. 118
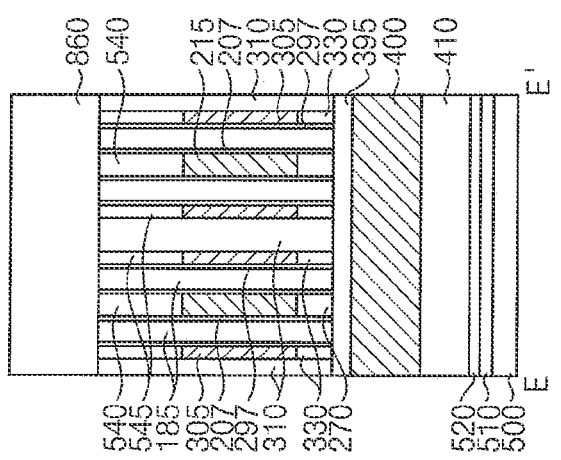
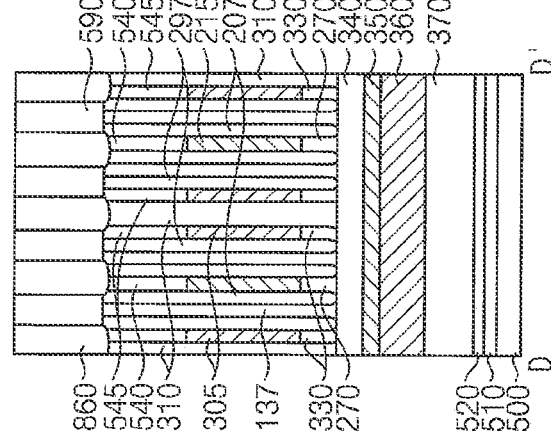
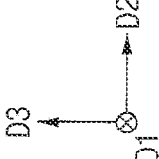

FIG. 119
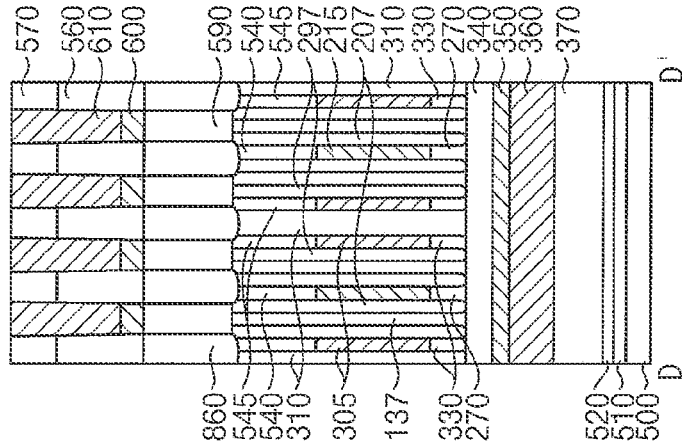
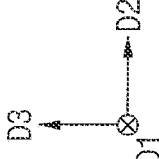

SEMICONDUCTOR DEVICES AND METHODS OF MANUFACTURING THE SAME

CROSS-REFERENCE TO RELATED APPLICATION

This application claims priority under 35 U.S.C. § 119 to Korean Patent Application No. 10-2022-0065188, filed on May 27, 2022 in the Korean Intellectual Property Office, the disclosure of which is hereby incorporated by reference in its entirety.

TECHNICAL FIELD

Example embodiments of the present disclosure relate to a semiconductor device and a method of manufacturing the same. More particularly, example embodiments of the present disclosure relate to a semiconductor device including a vertical channel and a method of manufacturing the same.

DISCUSSION OF RELATED ART

A memory device including a vertical channel transistor has been developed to increase the integration degree of the memory device, and the memory device includes bit lines and word lines extending in directions crossing each other. However, due to the increased integration degree of the memory device, interference between neighboring word lines or bit lines may increase.

SUMMARY

According to example embodiments of the present disclosure, a semiconductor device includes a plurality of bit line structures disposed on a substrate, each of the bit line structures extending in a second direction substantially parallel to an upper surface of the substrate, and the bit line structures being spaced apart from each other in a first direction substantially parallel to the upper surface of the substrate and crossing the second direction. The semiconductor device further includes a plurality of semiconductor patterns spaced apart from each other in the second direction on each of the bit line structures, a plurality of insulating interlayer patterns disposed between neighboring ones of the semiconductor patterns in the first direction, a plurality of word lines spaced apart from each other in the second direction on the bit line structures, each of the word lines extending in the first direction adjacent to the semiconductor patterns, and a plurality of capacitors disposed on and electrically connected to the semiconductor patterns, respectively. A seam extending in the second direction is formed in each of the insulating interlayer patterns.

According to example embodiments of the present disclosure, a semiconductor device includes a plurality of bit line structures disposed on a substrate, each of the bit line structures extending in a second direction substantially parallel to an upper surface of the substrate, and the bit line structures being spaced apart from each other in a first direction substantially parallel to the upper surface of the substrate and crossing the second direction. The semiconductor device further includes a plurality of semiconductor patterns spaced apart from each other in the second direction on each of the bit line structures, a plurality of insulating interlayer patterns disposed between neighboring ones of the semiconductor patterns in the first direction, a plurality of gate insulation patterns each extending in the first direction and contacting sidewalls of the semiconductor patterns and the insulating interlayer patterns disposed in the first direction, a plurality of word lines disposed on the bit line structures, each of the word lines extending in the first direction on sidewalls of the gate insulation patterns, and a plurality of capacitors disposed on and electrically connected to the semiconductor patterns, respectively. Each of the gate insulation patterns includes a first portion contacting the sidewalls of the semiconductor patterns and a second portion contacting the sidewalls of the insulating interlayer patterns, and a width in the second direction of the first portion is greater than a width in the second direction of the second portion.

According to example embodiments of the present disclosure, a semiconductor device includes a plurality of bit line structures disposed on a substrate, each of the bit line structures extending in a second direction substantially parallel to an upper surface of the substrate, and the bit line structures being spaced apart from each other in a first direction substantially parallel to the upper surface of the substrate and crossing the second direction, a plurality of semiconductor patterns spaced apart from each other in the second direction on each of the bit line structures, each of the semiconductor patterns having first and second sidewalls disposed opposite to each other in the second direction, a plurality of word lines disposed on the bit line structures, each of the word lines extending in the first direction on the first sidewalls of the semiconductor patterns, a plurality of back gate electrodes disposed on the bit line structures, each of the back gate electrodes extending in the first direction adjacent to the second sidewalls of the semiconductor patterns, and a plurality of capacitors disposed on and electrically connected to the semiconductor patterns, respectively. A width in the second direction of each of the back gate electrodes periodically changes in the first direction.

According to example embodiments of the present disclosure, a semiconductor device includes a plurality of bit line structures disposed on a substrate, each of the bit line structures extending in a second direction substantially parallel to an upper surface of the substrate, and the bit line structures being spaced apart from each other in a first direction substantially parallel to the upper surface of the substrate and crossing the second direction. The semiconductor device further includes a plurality of first shield patterns disposed between neighboring ones of the bit line structures in the first direction, each of the first shield patterns extending in the second direction, a plurality of semiconductor patterns spaced apart from each other in the second direction on each of the bit line structures, each of the semiconductor patterns having first and second sidewalls disposed opposite to each other in the second direction, a plurality of insulating interlayer patterns disposed between neighboring ones of the semiconductor patterns in the first direction, each of the insulating interlayer patterns having third and fourth sidewalls disposed opposite to each other in the second direction, a plurality of first gate insulation patterns, each extending in the first direction and commonly contacting the first sidewalls of the semiconductor patterns and the third sidewalls of the insulating interlayer patterns disposed in the first direction, a plurality of second gate insulation patterns, each extending in the first direction and commonly contacting the second sidewalls of the semiconductor patterns and the fourth sidewalls of the insulating interlayer patterns disposed in the first direction, a plurality of word lines disposed on the bit line structures and the first shield patterns, each of the word lines extending in the first direction and contacting sidewalls of the first gate insulation patterns, a plurality of back gate electrodes disposed on the bit line structures and the first shield patterns, each of the back gate electrodes extending in the first direction and contacting sidewalls of the second gate insulation patterns, a plurality of contact plug structures disposed on upper surfaces of the semiconductor patterns, respectively, and a plurality of capacitors disposed on upper surfaces of the contact plug structures, respectively.

According to example embodiments of the present disclosure, a method of manufacturing a semiconductor device. includes preparing a first substrate structure including a first substrate, a buried insulation structure and a semiconductor layer sequentially stacked, patterning the semiconductor layer to form preliminary semiconductor patterns each extending in a second direction substantially parallel to an upper surface of the first substrate, forming a preliminary back gate electrode through the preliminary semiconductor patterns, the preliminary back gate electrode extending in a first direction substantially parallel to the upper surface of the first substrate and crossing the second direction, patterning the preliminary semiconductor patterns to form semiconductor patterns on opposite sides in the second direction of the preliminary back gate electrode, removing an upper portion of the preliminary back gate electrode to form a back gate electrode, forming a word line extending in the first direction adjacent to a sidewall of each of the semiconductor patterns, forming bit line structures on the semiconductor patterns, each of the bit line structures extending in the second direction, removing the first substrate and the buried insulation structure to expose the semiconductor patterns, and forming a plurality of capacitors electrically connected to the semiconductor patterns, respectively.

In the method of manufacturing the semiconductor device, the channel may be formed before forming the back gate electrode. As a result, efficiency of the manufacturing process may be increased. In the semiconductor device, one back gate electrode may be formed between two word lines, and may commonly apply voltage to channels at opposite sides thereof. As a result, the integration of the semiconductor device may be increased. Additionally, the back gate electrode may increase the threshold voltage of the vertical channel transistor so as to decrease the leakage current due to the reduction of the threshold voltage.

BRIEF DESCRIPTION OF THE DRAWINGS

The above and other features of the present disclosure will become more apparent by describing in detail embodiments thereof with reference to the accompanying drawings.

FIGS. 1 to 4 are a perspective view, a plan view and cross-sectional views illustrating a semiconductor device according to example embodiments.

FIGS. 5 to 81 are plan views and cross-sectional views illustrating a method of manufacturing a semiconductor device according to example embodiments.

FIGS. 86 to 88 are cross-sectional views illustrating methods of manufacturing the semiconductor devices shown in FIGS. 83 to 85, respectively, according to example embodiments.

FIGS. 91 and 92 are cross-sectional views illustrating methods of manufacturing the semiconductor devices shown in FIGS. 89 and 90, respectively, according to example embodiments.

FIG. 93 includes cross-sectional views illustrating heights of first and second gate electrodes included in the semiconductor device in accordance with example embodiments.

FIGS. 100, 101, 102 and 103 are cross-sectional views illustrating methods of manufacturing the semiconductor devices of FIGS. 94, 95, 97 and 98, respectively, according to example embodiments.

FIG. 108 is a cross-sectional view illustrating a semiconductor device in accordance with example embodiments.

FIG. 109 includes cross-sectional views illustrating heights of a second conductive pattern and a first shield pattern included in a semiconductor device in accordance with example embodiments.

FIG. 111 is a cross-sectional view illustrating a method of manufacturing the semiconductor device of FIG. 110 according to example embodiments.

FIGS. 112 and 113 are cross-sectional views illustrating semiconductor devices in accordance with example embodiments.

FIGS. 114 to 116 are cross-sectional views illustrating methods of manufacturing the semiconductor devices of FIGS. 112 and 113 in accordance with example embodiments.

FIGS. 118 and 119 are cross-sectional views illustrating a method of manufacturing the semiconductor device of FIG. 117 in accordance with example embodiments.

DETAILED DESCRIPTION

Figure 1:
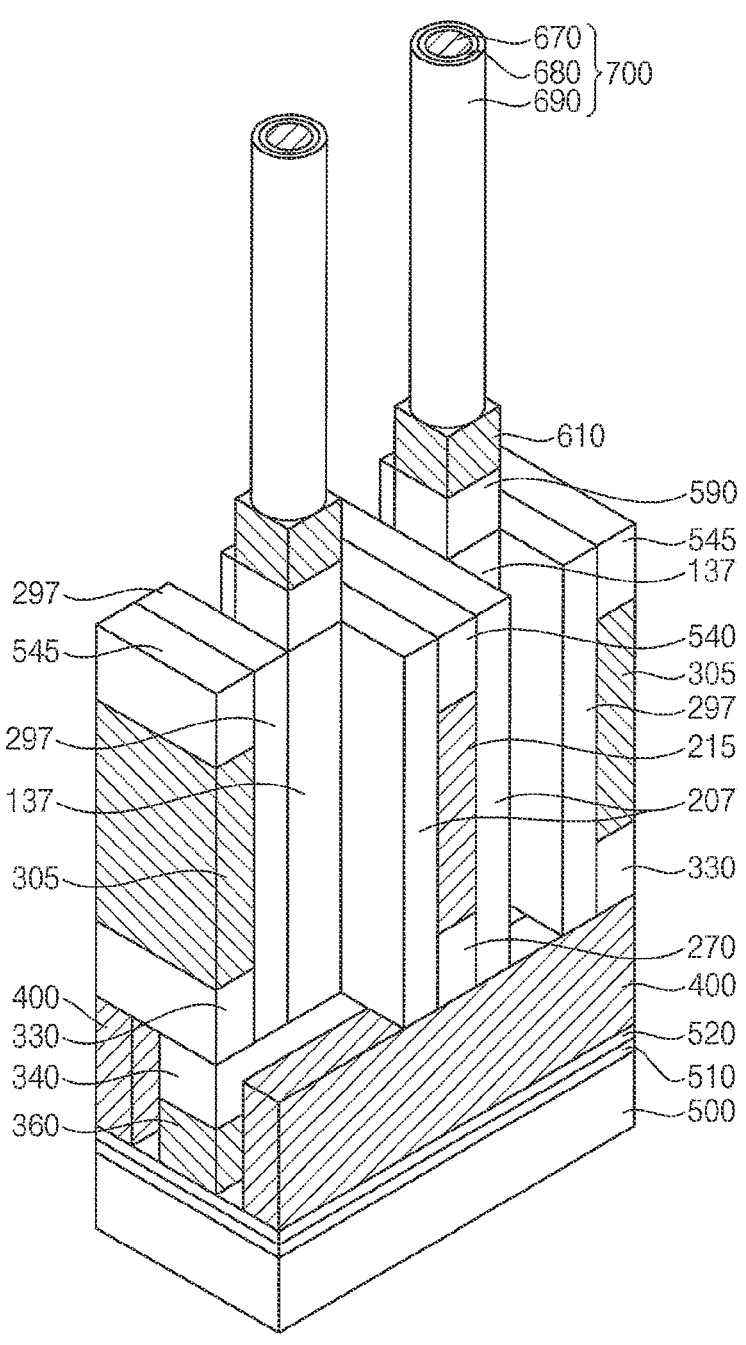

Embodiments of the present disclosure will be described more fully hereinafter with reference to the accompanying drawings. Like reference numerals may refer to like elements throughout the accompanying drawings.

It will be understood that, although the terms "first," "second," "third", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of the present disclosure.

Hereinafter, two horizontal directions substantially parallel to an upper surface of a first substrate or a second substrate may be referred to as first and second directions D1 and D2, respectively, and a vertical direction substantially perpendicular to the upper surface of the first substrate or the second substrate may be referred to as a third direction D3. In example embodiments, the first and second directions are substantially perpendicular to each other.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 2:
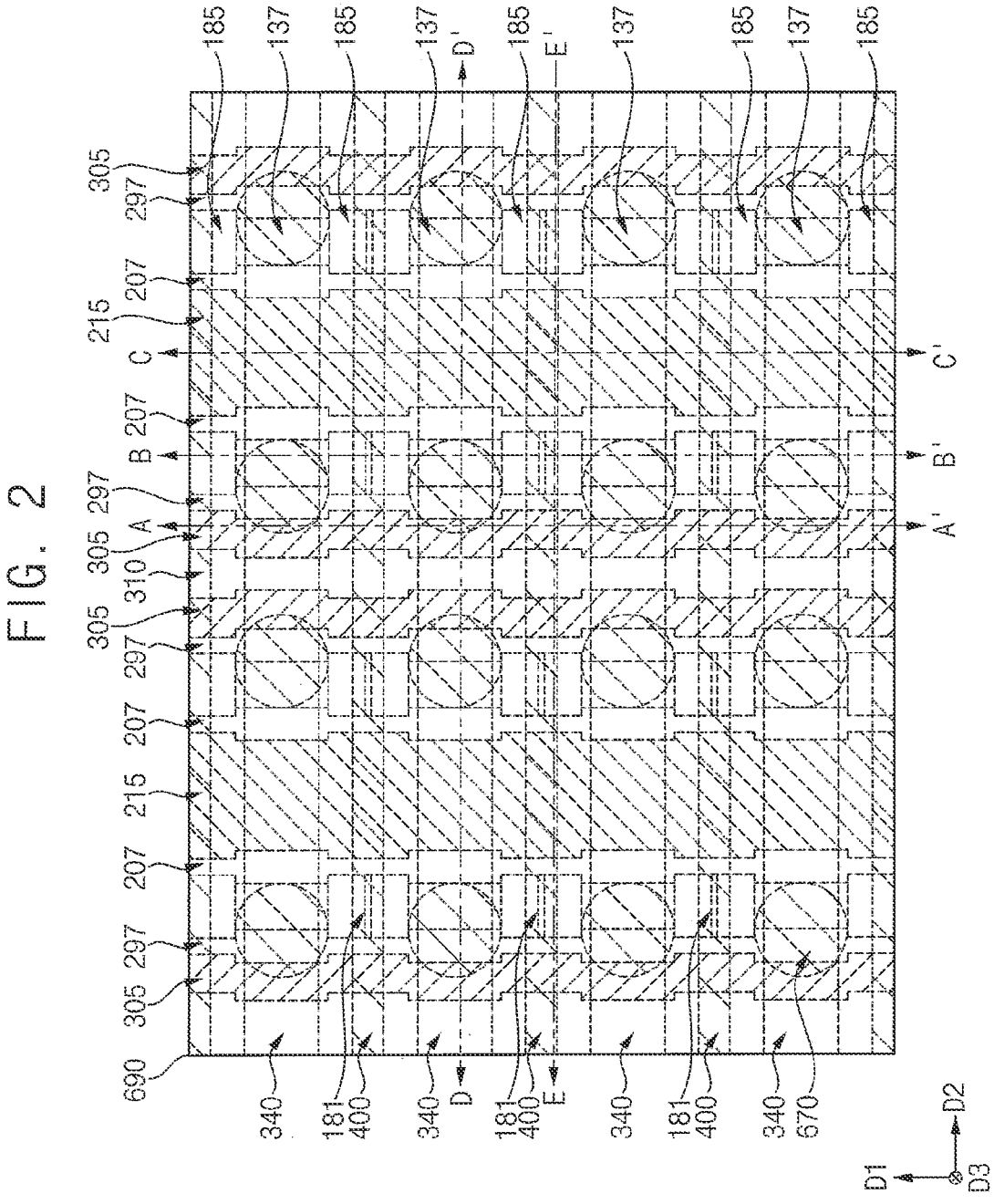
Figure 4:
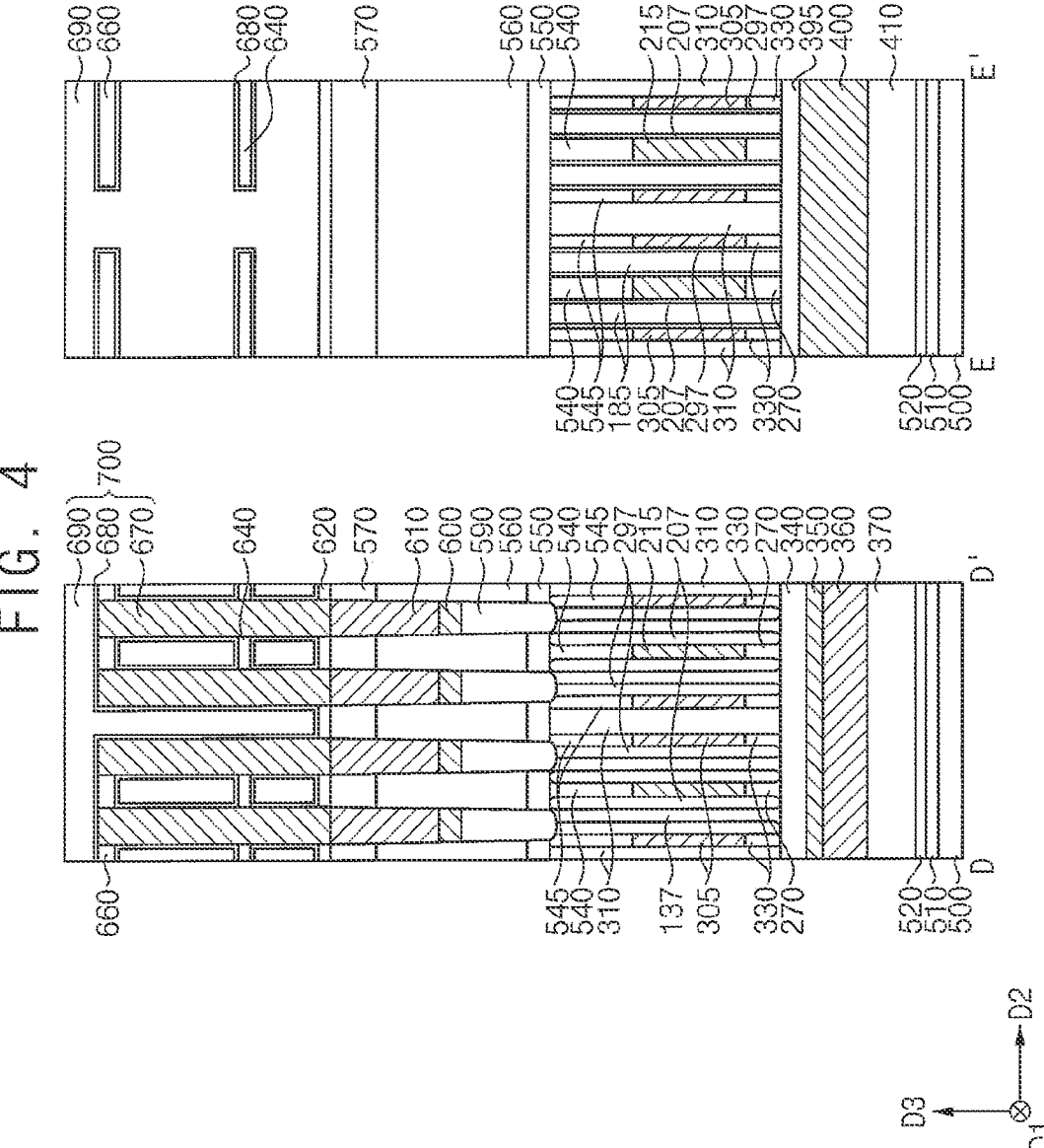

FIGS. 1 to 4 are a perspective view, a plan view and cross-sectional views illustrating a semiconductor device according to example embodiments. For example, FIG. 1 is the perspective view, FIG. 2 is the plan view, and FIGS. 3 and 4 are the cross-sectional views. FIG. 3 includes cross-sectional views taken along lines A-A', B-B' and C-C', respectively, of FIG. 2, and FIG. 4 includes cross-sectional views taken along lines D-D' and E-E', respectively, of FIG. 2.

FIG. 1 does not show some elements in order to avoid unnecessary complexity of the drawing.

Referring to FIGS. 1 to 4, the semiconductor device may include a bit line structure, a first shield pattern 400, a semiconductor pattern 137, first and second gate electrodes 215 and 305, first and second gate insulation patterns 207 and 297, a contact plug structure and a capacitor 700 disposed on a second substrate 500.

The semiconductor device may further include first and second adhesion layers 520 and 510, a third spacer 395, a first insulating interlayer pattern 185, second and third insulating interlayers 310 and 560, a third insulation layer 270, fourth to seventh insulation patterns 330, 410, 540 and 545, first and second etch stop layers 550 and 620, a capping layer 570, and first and second support layers 640 and 660.

The second substrate 500 may include, e.g., a semiconductor material, an insulation material or a conductive material.

The second adhesion layer 510 and the first adhesion layer 520 may be stacked in the third direction D3, and may include an insulating material, e.g., silicon carbonitride.

The bit line structure may include a second conductive pattern 360, a barrier pattern 350 and a first conductive pattern 340 sequentially stacked in the third direction D3.

In an example embodiment, the first conductive pattern 340 may include polysilicon doped with n-type or p-type impurities, the barrier pattern 350 may include a metal nitride, e.g., titanium nitride, tantalum nitride, tungsten nitride, etc., and the second conductive pattern 360 may include a metal, e.g., tungsten, titanium, tantalum, etc.

In example embodiments, a plurality of bit line structures may be spaced apart from each other in the first direction D1, and each of the plurality of bit line structures may extend in the second direction D2 on and contacting an upper surface of the first adhesion layer 520.

The first shield pattern 400 may extend in the second direction D2 between neighboring ones of the bit line structures in the first direction D1. In example embodiments, an upper surface and a sidewall of the first shield pattern 400 may be covered by the third spacer 395 extending in the second direction D2, and a lower surface of the first shield pattern 400 may be covered by a fifth insulation pattern 410 extending in the second direction D2. As the first shield pattern 400 is formed, the disturbance and parasitic capacitance between the bit line structures may decrease, and thus, the RC-delay may be reduced, which may increase the operation speed of the semiconductor device.

A sidewall of the fifth insulation pattern 410 may be covered by the third spacer 395. Lower surfaces of the third spacer 395 and the fifth insulation pattern 410 may contact an upper surface of the first adhesion layer 520.

In example embodiments, the third spacer 395 may contact a sidewall of the bit line structure. Upper and lower surfaces of the third spacer 395 may be substantially coplanar with upper and lower surfaces, respectively, of the bit line structure.

The first shield pattern 400 may include a metal nitride, e.g., titanium nitride, tantalum nitride, etc., and the third spacer 395 and the fifth insulation pattern 410 may include an oxide, e.g., silicon oxide.

In example embodiments, a plurality of semiconductor patterns 137 may be spaced apart from each other in the second direction D2 on each of the bit line structures, and each of the plurality of semiconductor patterns 137 may contact the first conductive pattern 340 included in each of the bit line structures. As the bit line structures are spaced apart from each other in the first direction D1, a plurality of semiconductor patterns 137 may be spaced apart from each other in the first and second directions D1 and D2.

In an example embodiment, the semiconductor pattern 137 may include a single crystalline semiconductor material, e.g., single crystalline silicon, single crystalline germanium, etc., or a polycrystalline semiconductor material, e.g., poly-silicon, polygermanium, etc., and may serve as a channel of the semiconductor device. However, n-type or p-type impurities may be doped into upper and lower portions of the semiconductor pattern 137, and may serve as source/drain regions of the semiconductor device, unlike a central portion of the semiconductor pattern 137 serving as the channel. Thus, current may flow in the vertical direction, that is, in the third direction D3 in the semiconductor pattern 137, and thus the semiconductor device may include a vertical channel transistor (VCT) having a vertical channel.

Alternatively, the semiconductor pattern 137 may include a single crystalline semiconductor material or a polycrystalline semiconductor material doped with n-type or p-type impurities. In this case, a concentration of the impurities in a central portion of the semiconductor pattern 137 serving as a channel may be lower than concentrations of the impurities in upper and lower portions of the semiconductor pattern 137 serving as source/drain regions, respectively.

In an example embodiment, p-type impurities may be doped into the central portion of the semiconductor pattern 137 with a relatively low concentration, and n-type impurities may be doped into the upper and lower portions of the semiconductor pattern 137 with relatively high concentrations, respectively.

The first insulating interlayer pattern 185 may be formed between neighboring ones of the semiconductor patterns 137 in the first direction D1. Thus, the semiconductor pattern 137 and the first insulating interlayer pattern 185 may be alternately and repeatedly disposed in the first direction D1.

A lower surface of the first insulating interlayer pattern 185 may contact an upper surface of the third spacer 395. In example embodiments, a width in the second direction D2 of the first insulating interlayer pattern 185 may be greater than a width in the second direction D2 of the semiconductor pattern 137. The first insulating interlayer pattern 185 may include an oxide, e.g., silicon oxide.

In example embodiments, a seam 181 or a void may be formed in a central portion in the first direction D1 of the first insulating interlayer pattern 185.

The second gate electrode 305 may extend in the first direction D1 at sides in the second direction D2 of the semiconductor patterns 137 and the first insulating interlayer patterns 185, and the first gate electrode 215 may extend in the first direction D1 at other sides in the second direction D2 of the semiconductor patterns 137 and the first insulating interlayer patterns 185.

For example, each of the semiconductor patterns 137 may include first and second sidewalls disposed opposite to each other in the second direction D2, each of the first insulating interlayer patterns 185 may include third and fourth sidewalls disposed opposite to each other in the second direction D2, the second gate electrode 305 may be disposed adjacent to the first sidewalls of the semiconductor patterns 137 and the third sidewalls of the first insulating interlayer patterns 185, and the first gate electrode 215 may be disposed adjacent to the second sidewalls of the semiconductor patterns 137 and the fourth sidewalls of the first insulating interlayer patterns 185.

The first and second gate electrodes 215 and 305 may include a metal, e.g., molybdenum, ruthenium, tungsten, etc., a metal nitride, e.g., titanium nitride, tantalum nitride, tungsten nitride, etc., or a metal silicide.

In example embodiments, the second gate electrode 305 may be a front gate electrode with respect to each of the semiconductor patterns 137, and may serve as a word line in the semiconductor device. The first gate electrode 215 may be a back gate electrode with respect to each of the semiconductor patterns 137.

In example embodiments, the semiconductor patterns 137 may include first semiconductor patterns disposed in the first direction D1, and second semiconductor patterns disposed in the first direction D1 and spaced apart from the first semiconductor patterns in the second direction D2.

In example embodiments, the word lines 305 may include a first word line extending in the first direction D1 adjacent to the first sidewalls of the first semiconductor patterns and a second word line extending in the first direction D1 adjacent to the first sidewalls of the second semiconductor patterns, and the second sidewalls of the first and second semiconductor patterns may face each other in the second direction D2. The back gate electrode 215 may be formed between the second sidewalls of the first semiconductor patterns and the second sidewalls of the second semiconductor patterns.

For example, the first word line, the first sidewall and the second sidewall of each of the first semiconductor patterns, the back gate electrode 215, the second and first sidewalls of each of the second semiconductor patterns, and the second word line may be disposed in the second direction D2 in this order.

In example embodiments, the first and second word lines at opposite sides, respectively, in the second direction D2 of the back gate electrode 215 may form a word line pair, and a plurality of word line pairs may be disposed in the second direction D2. The second insulating interlayer 310 may be formed between neighboring ones of the word line pairs in the second direction D2, and may include an oxide, e.g., silicon oxide.

In example embodiments, a width in the second direction D2 of a portion of the first gate electrode 215 adjacent to each of the first insulating interlayer patterns 185 may be greater than a width in the second direction D2 of a portion of the first gate electrode 215 adjacent to each of the semiconductor patterns 137. Thus, a width of the first gate electrode 215 in the second direction D2 may periodically vary in the first direction D1.

In example embodiments, a width of the second gate electrode 305 in the second direction D2 may be constant in the first direction D1. The second gate electrode 305 may extend in the first direction D1, and a concave portion and a convex portion in the second direction D2 may be alternately and repeatedly disposed in the first direction D1.

In example embodiments, upper and lower surfaces of the first gate electrode 215 may be substantially coplanar with upper and lower surfaces, respectively, of the second gate electrode 305. However, embodiments of the present disclosure are not limited thereto.

In example embodiments, a lower surface of the first gate electrode 215 may be covered by the third insulation layer 270, and an upper surface of the first gate electrode 215 may be covered by the sixth insulation pattern 540. Additionally, a lower surface of the second gate electrode 305 may be covered by the fourth insulation pattern 330, and an upper surface of the second gate electrode 305 may be covered by the seventh insulation pattern 545.

In example embodiments, lower surfaces of the third insulation layer 270 and the fourth insulation pattern 330 may be substantially coplanar with each other, and may contact upper surfaces of the bit line structure and the third spacer 395. Additionally, upper surfaces of the sixth insulation pattern 540 and the seventh insulation pattern 545 may be substantially coplanar with each other.

The third insulation layer 270, and the fourth, sixth and seventh insulation patterns 330, 540 and 545 may include an oxide, e.g., silicon oxide.

The second gate insulation pattern 297 may extend in the first direction D1 on and contacting the first sidewalls of the semiconductor patterns 137 and the third sidewalls of the first insulating interlayer patterns 185, and the first gate insulation pattern 207 may extend in the first direction D1 on and contacting the second sidewalls of the semiconductor patterns 137 and the fourth sidewalls of the first insulating interlayer patterns 185. Thus, the second gate insulation pattern 297 may be formed of each of the semiconductor patterns 137 and the second gate electrode 305, and the first gate insulation pattern 207 may be formed of each of the semiconductor patterns 137 and the first gate electrode 215.

The first gate insulation pattern 207 may cover not only the sidewall of the first gate electrode 215, but also sidewalls of the sixth insulation pattern 540 and the third insulation layer 270 on and beneath, respectively, the first gate electrode 215. The second gate insulation pattern 297 may cover not only the sidewall of the second gate electrode 305, but also sidewalls of the seventh insulation pattern 545 and the fourth insulation pattern 330 on and beneath, respectively, the second gate electrode 305.

Each of the first and second gate insulation patterns 207 and 297 may include an oxide, e.g., silicon oxide. Alternatively, each of the first and second gate insulation patterns 207 and 297 may have a multi-layered structure including a first layer containing silicon oxide and contacting the semiconductor pattern 137 and a second layer containing a metal oxide, e.g., hafnium oxide, zirconium oxide, etc., and contacting a sidewall of the first layer and a sidewall of the first insulating interlayer pattern 185.

In example embodiments, a width in the second direction D2 of a portion of each of the first and second gate insulation patterns 207 and 297 adjacent to the sidewall of each of the semiconductor patterns 137 may be greater than a width in the second direction D2 of a portion of each of the first and second gate insulation patterns 207 and 297 adjacent to the sidewall of each of the second insulating interlayer patterns 185. Thus, a width in the second direction D2 of each of the first and second gate insulation patterns 207 and 297 may be periodically changed in the first direction D1.

As illustrated above, if each of the first and second gate insulation patterns 207 and 297 has the multi-layered structure including the first and second layers, the portion of each of the first and second gate insulation patterns 207 and 297 contacting each of the semiconductor patterns 137 may include both of the first and second layers, while the portion of each of the first and second gate insulation patterns 207 and 297 contacting each of the second insulating interlayer patterns 185 may include only the second layer.

The first etch stop layer 550, the third insulating interlayer 560 and the capping layer 570 may be sequentially stacked on the semiconductor pattern 137, the first insulating interlayer pattern 185, the second insulating interlayer 310, the first and second gate insulation patterns 207 and 297, and the sixth and seventh insulation patterns 540 and 545, and the contact plug structure may extend through the first etch stop layer 550, the third insulating interlayer 560 and the capping layer 570 to contact an upper surface of the semiconductor pattern 137.

The first etch stop layer 550 and the capping layer 570 may include an insulating nitride, e.g., silicon nitride, and the third insulating interlayer 560 may include an oxide, e.g., silicon oxide.

As a plurality of semiconductor patterns 137 are spaced apart from each other in the first and second directions D1 and D2, a plurality of contact plug structures may also be spaced apart from each other in the first and second directions D1 and D2. In an example embodiment, the contact plug structures may be arranged in a lattice pattern in a plan view. Alternatively, the contact plug structures may be arranged in a honeycomb pattern in a plan view.

The contact plug structure may contact not only the upper surface of each of the semiconductor patterns 137, but also upper surfaces of the first and second gate insulation patterns 207 and 297 and the sixth and seventh insulation patterns 540 and 545 adjacent to each of the semiconductor patterns 137.

The contact plug structure may include a lower contact plug 590, an ohmic contact pattern 600 and an upper contact plug 610 sequentially stacked in the third direction D3.

The lower contact plug 590 may include polysilicon doped with n-type or p-type impurities, the ohmic contact pattern 600 may include a metal silicide, e.g., cobalt silicide, nickel silicide, titanium silicide, etc., and the upper contact plug 610 may include a conductive material, e.g., a metal, a metal nitride, a metal silicide, etc.

The second etch stop layer 620 may be formed on the third insulating interlayer 560 and the contact plug structure, and a first capacitor electrode 670 may extend through the second etch stop layer 620 in the third direction D3.

As the plurality of contact plug structures are spaced apart from each other in the first and second directions D1 and D2, a plurality of first capacitor electrodes 670 may also be spaced apart from each other in the first and second directions D1 and D2.

Figure 120:
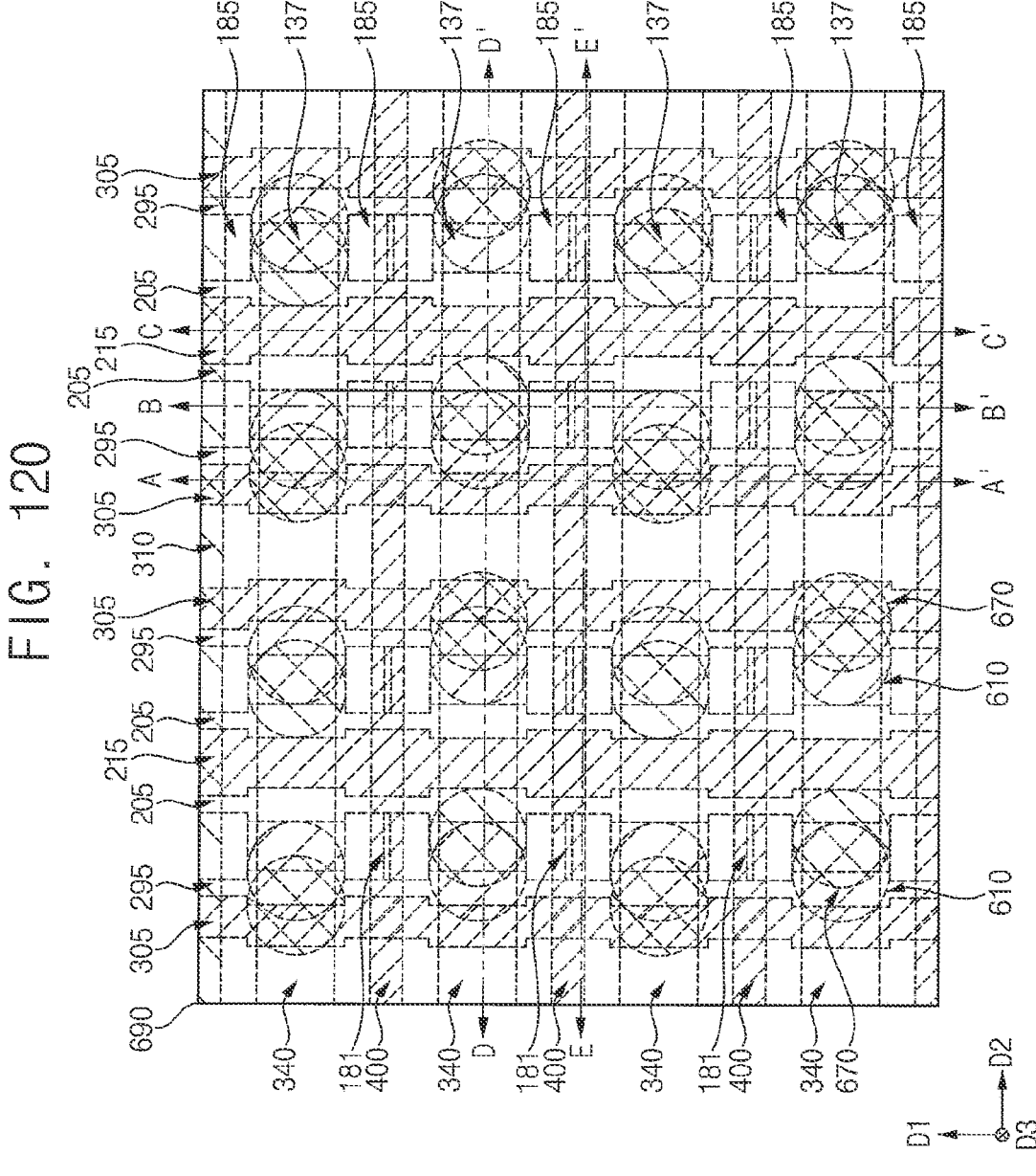
FIG. 120 is a plan view illustrating a semiconductor device in accordance with example embodiments.

In example embodiments, the first capacitor electrode 670 may have a shape of, for example, a circle, an ellipse, a polygon, a polygon with rounded corners, etc., in a plan view. In an example embodiment, the first capacitor electrodes 670 may be arranged in a lattice pattern in a plan view. Alternatively, the first capacitor electrodes 670 may be arranged in a honeycomb pattern in a plan view, which is shown in FIG. 120.

The first and second support layers 640 and 660 may contact central and upper portions, respectively, of each of the first capacitor electrodes 670 which may prevent the first capacitor electrodes 670 from falling down.

A dielectric layer 680 may be formed on surfaces of the first capacitor electrodes 670 and the first and second support layers 640 and 660, and a second capacitor electrode 690 may be formed on the dielectric layer 680. The first and second capacitor electrodes 670 and 690 and the dielectric layer 680 may collectively form the capacitor 700.

The second etch stop layer 620 may include an insulating nitride, e.g., silicon boronitride, silicon carbonitride, etc., and the first and second support layers 640 and 660 may include an insulating nitride, e.g., silicon nitride. The first capacitor electrode 670 may include a metal nitride, e.g., titanium nitride, tantalum nitride, etc., or a metal, e.g., titanium, tantalum, tungsten. The dielectric layer 680 may include a metal oxide having a high dielectric constant, e.g., hafnium oxide, zirconium oxide, etc., and the second capacitor electrode 690 may include, e.g., silicon-germanium doped with impurities.

In some embodiments, another type of data storage structure instead of the capacitor 700 may be formed on each of the contact plug structures, and the data storage structure may include a variable resistance pattern containing, e.g., a phase-change material, a transition metal oxide, a magnetic material, etc.

FIGS. 1 to 4 show only a cell region of the semiconductor device, however, some elements shown in FIGS. 1 to 4 may also be formed on a peripheral circuit region of the semiconductor device.

For example, FIG. 2 shows the second gate electrode 305 serving as a word line extends in the first direction D1. However, according to example embodiments, each of the first and second word lines forming a word line pair may include an extension portion extending in the second direction D2 on the peripheral circuit region, and the first and second word lines may have a ring shape on the cell region and the peripheral circuit region in a plan view. In some embodiments, a division layer may be formed between the first and second word lines on the peripheral circuit region or on the cell region so that the first and second word lines may be electrically insulated from each other.

Additionally, the first shield pattern 400 extending in the second direction D2 between neighboring bit line structures may include an extension portion extending in the first direction D1 on the peripheral circuit region, and the first shield patterns 400 spaced apart from each other in the first direction D1 on the cell region may be connected with each other on the peripheral circuit region. Contact plugs and wirings may be further formed on the peripheral circuit region to be electrically connected to the bit line structure and the first shield pattern 400.

In example embodiments, the semiconductor device may include a vertical channel transistor (VCT), which may include the semiconductor pattern 137 serving as a channel, the second gate electrode 305 serving as a front gate electrode, and the first gate electrode 215 serving as a back gate electrode. The back gate electrode 215 may increase a threshold voltage of the VCT. As a result, leakage current characteristics may not be deteriorated even if the VCT has a minute size.

Additionally, the back gate electrode 215 may be disposed between two word lines 305 to commonly apply a voltage to channels in the semiconductor patterns 137 at opposite sides, respectively. As a result, the integration degree of the semiconductor device may increase when compared to a VCT having a double gate structure in which two gate electrodes are disposed at opposite sides, respectively, of a channel.

According to embodiments, the semiconductor pattern 137 of the VCT includes a single crystalline semiconductor material. As a result, the leakage current characteristics may be further enhanced.

Figure 5:
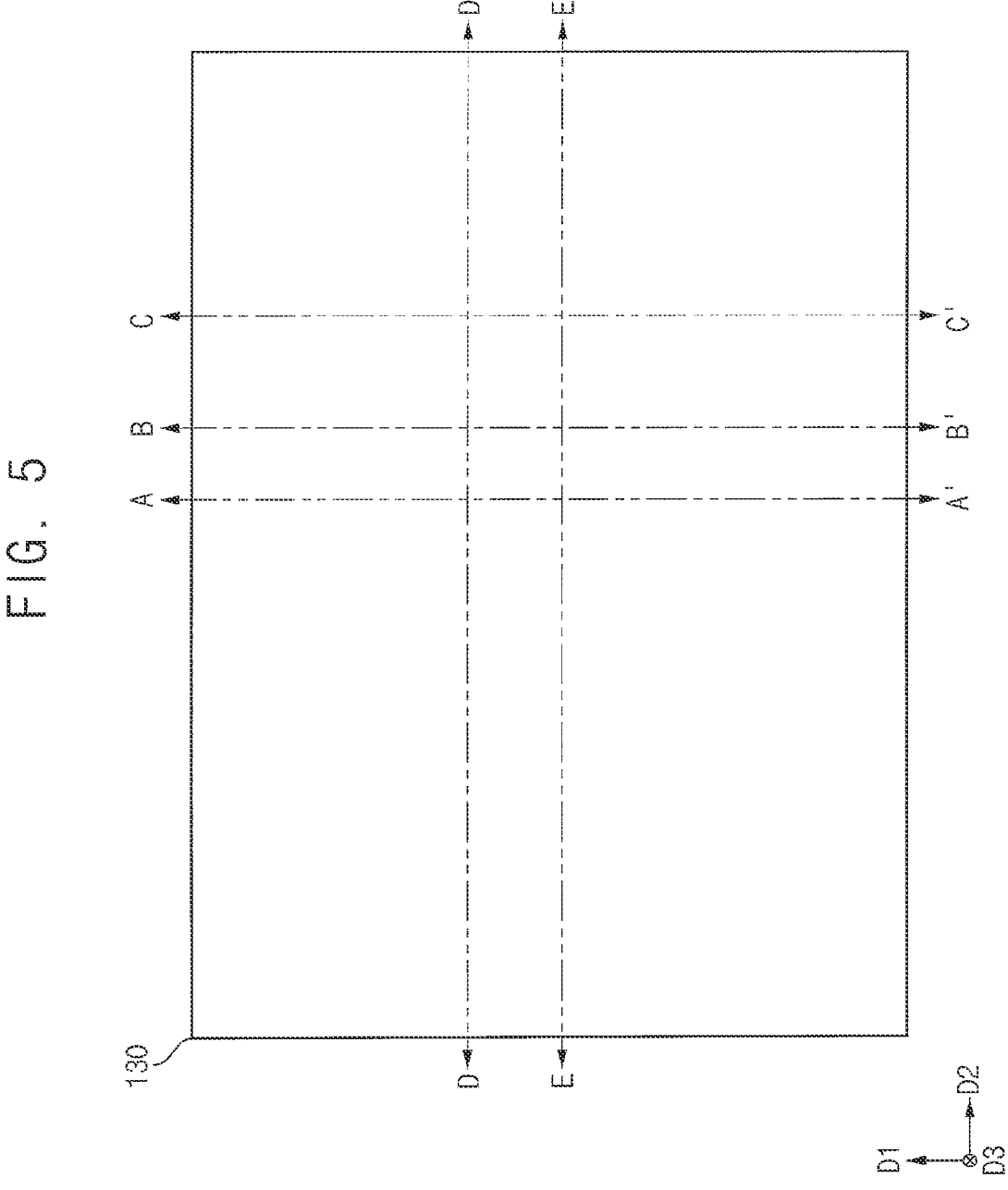

FIGS. 5 to 81 are plan views and cross-sectional views illustrating a method of manufacturing a semiconductor device, that is, a vertical channel memory device, in accordance with example embodiments. For example, FIGS. 5, 8, 13, 16, 19, 22, 25, 32, 35, 38, 49, 52, 57, 68, 71, 74 and 77 are the plan views, and FIGS. 6-7, 9-12, 14-15, 17-28, 20-21, 23-24, 26-31, 33-34, 36-37, 39-48, 50-51, 53-56, 58-67, 69-70, 72-73, 75-76 and 78-81 are the cross-sectional views.

Each of FIGS. 6, 9, 11, 14, 17, 20, 23, 26, 28, 30, 33, 36, 39, 41, 43, 45, 47, 50, 53, 55, 58, 60, 62, 64, 66, 69, 72, 75,

12

78 and 80 includes cross-sectional views taken along lines A-A', B-B' and C-C' of corresponding plan views, and each of FIGS. 7, 10, 12, 15, 18, 21, 24, 27, 29, 31, 34, 37, 40, 42, 44, 46, 48, 51, 54, 56, 59, 61, 63, 65, 67, 70, 73, 76, 79 and 81 includes cross-sectional views taken along lines D-D' and E-E' of corresponding plan views.

Referring to FIGS. 5 to 7, a first substrate structure may be prepared.

In example embodiments, the first substrate structure may be a silicon-on-insulator (SOI) substrate or a germanium-on-insulator (GOI) substrate. Thus, the first substrate structure may include a first substrate 100, a buried insulation structure and a semiconductor layer 130 sequentially stacked in the third direction D3.

The first substrate 100 may include a single crystalline semiconductor material, e.g., single crystalline silicon or single crystalline germanium.

In example embodiments, the buried insulation structure may include a first insulation layer 110 and a second insulation layer 120 stacked in the third direction D3. The first insulation layer 110 may include an insulating material, e.g., silicon nitride, and the second insulation layer 120 may include an oxide, e.g., silicon oxide.

Figure 8:
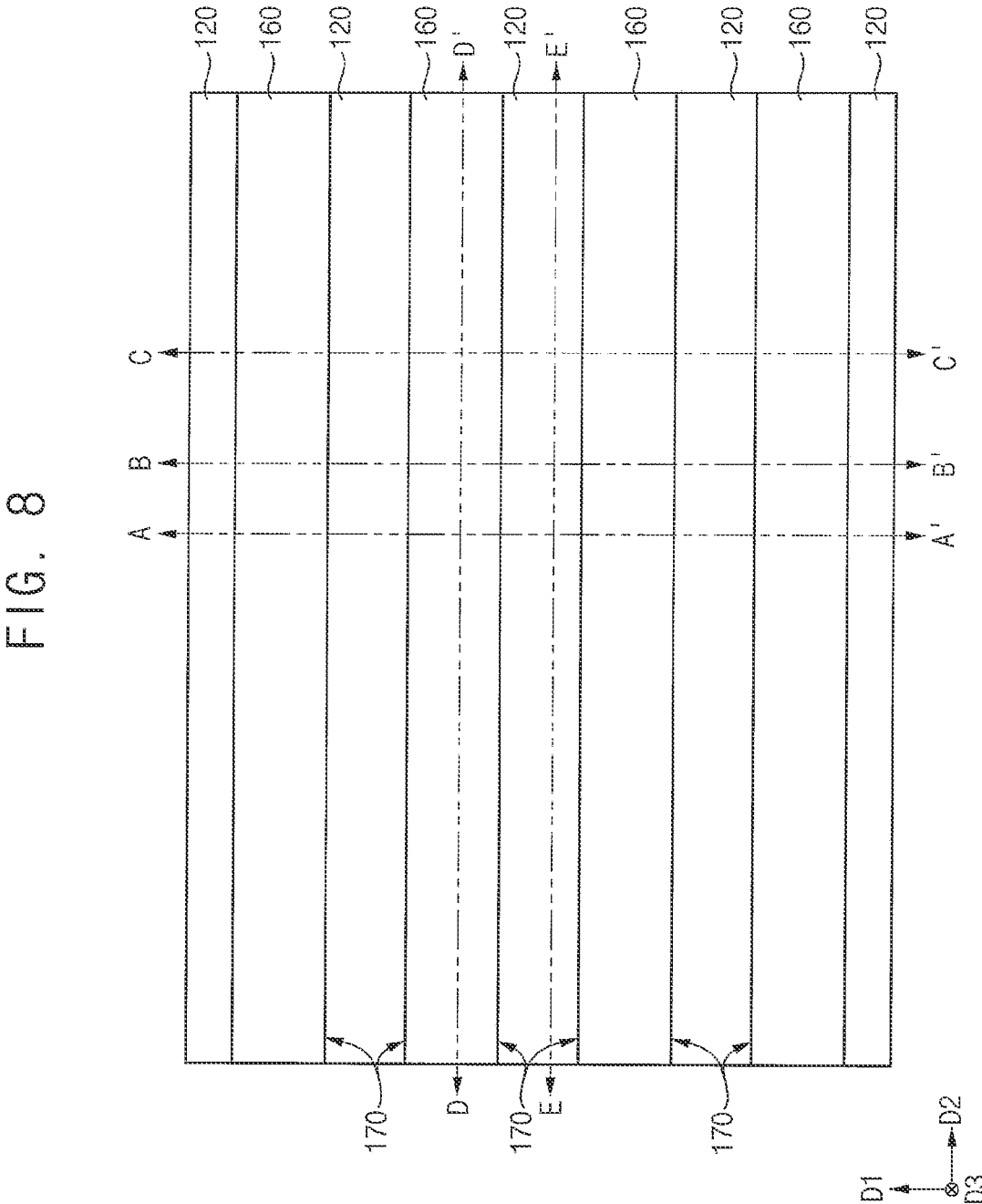

Referring to FIGS. 8 to 10, a mask structure may be formed on the semiconductor layer 130, and the semiconductor layer 130 may be etched using the mask structure as an etching mask to form a preliminary semiconductor pattern 135.

In example embodiments, the mask structure may include first to third masks 140, 150 and 160 sequentially stacked in the third direction D3. The mask structure may extend in the second direction D2, and a plurality of mask structures may be spaced apart from each other in the first direction D1.

Thus, the preliminary semiconductor pattern 135 may extend in the second direction D2, and a plurality of preliminary semiconductor patterns 135 may be spaced apart from each other in the first direction D1. The preliminary semiconductor pattern 135 and the mask structure on the second insulation layer 120 may collectively form a first bar structure extending in the second direction D2, and a first opening 170 extending in the second direction D2 may be formed between neighboring ones of the first bar structures to expose an upper surface of the second insulation layer 120.

The first and third masks 140 and 160 may include an oxide, e.g., silicon oxide, and the second mask 150 may include an insulating nitride, e.g., silicon nitride.

In an example embodiment, a gas phase doping (GPD) process or a plasma doping (PLAD) process may be performed on the preliminary semiconductor patterns 135 through the first opening 170 so that n-type or p-type impurities may be doped thereinto.

Referring to FIGS. 11 and 12, a first insulating interlayer 180 may be formed on the second insulation layer 120 to fill the first opening 170.

In example embodiments, the first insulating interlayer 180 may be formed by a deposition process, e.g., a chemical vapor deposition (CVD) process, an atomic layer deposition (ALD) process, etc., and may be deposited from a sidewall of the first bar structure and an upper surface of the second insulation layer 120. Thus, a seam 181 or a void extending in the second direction D2 may be formed in a central portion in the first direction D1 of the first insulating interlayer 180 between neighboring ones of the first bar structures in the first direction D1.

Figure 13:
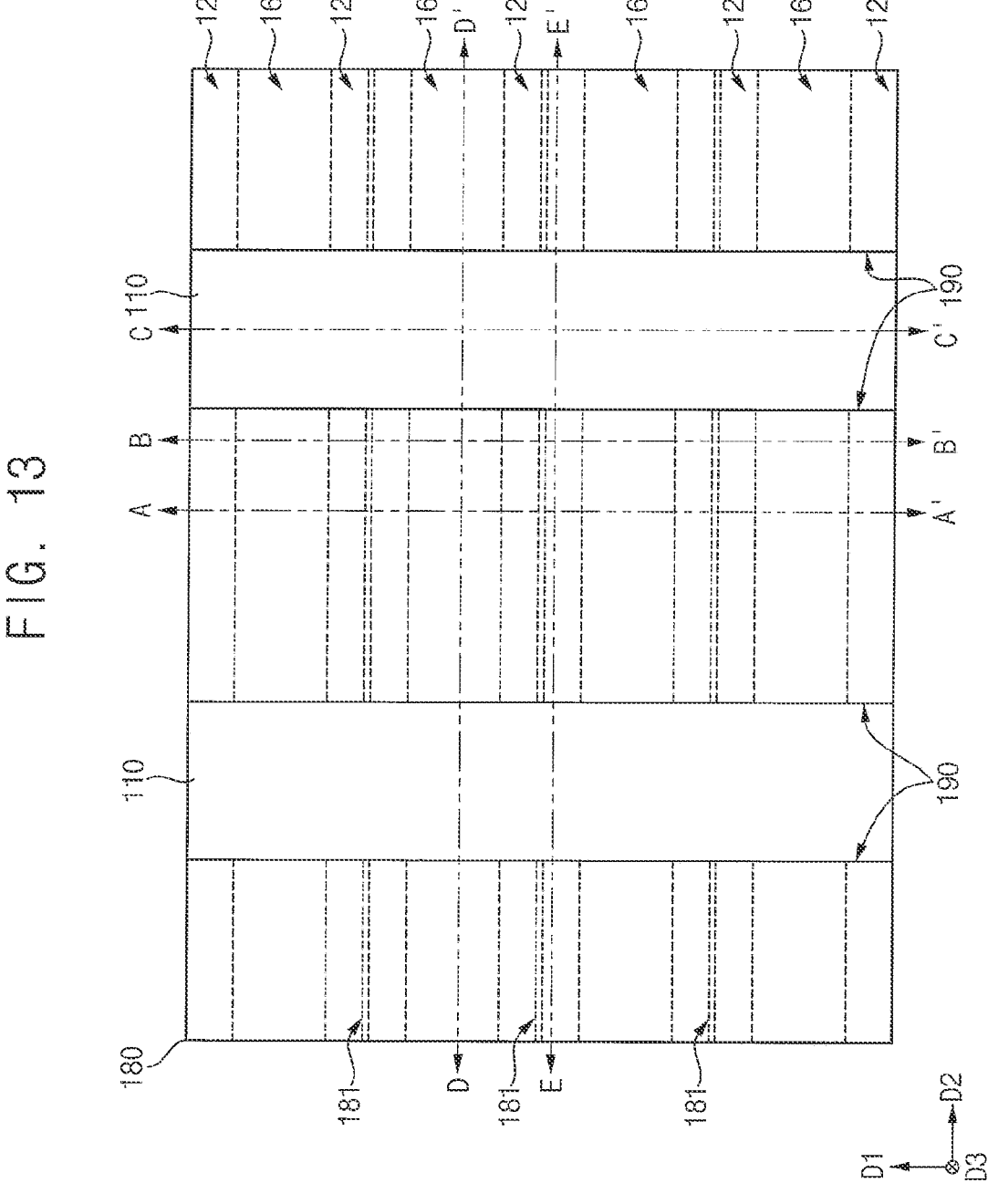

Referring to FIGS. 13 to 15, for example, a dry etching process may be performed to pattern the first insulating interlayer 180, the mask structure, the preliminary semiconductor pattern 135 and the second insulation layer 120, and thus, a second opening 190 extending in the first direction D1 may be formed to expose an upper surface of the first insulation layer 110.

As the dry etching process is performed, the mask structure extending in the second direction D2 may be divided into a plurality of pieces spaced apart from each other in the second direction D2, each of the second insulation layer 120 and the first insulating interlayer 180, which are entirely formed on the first substrate 100, may be divided into a plurality of pieces, each of which may extend in the first direction D1, spaced apart from each other in the second direction D2, and the preliminary semiconductor pattern 135 extending in the second direction D2 may be divided into a plurality of pieces spaced apart from each other in the second direction D2.

In an example embodiment, a gas phase doping (GPD) process or a plasma doping (PLAD) process may be performed on each of the semiconductor patterns 137 through the second opening 190, so that n-type or p-type impurities may be further doped thereinto.

Figure 16:
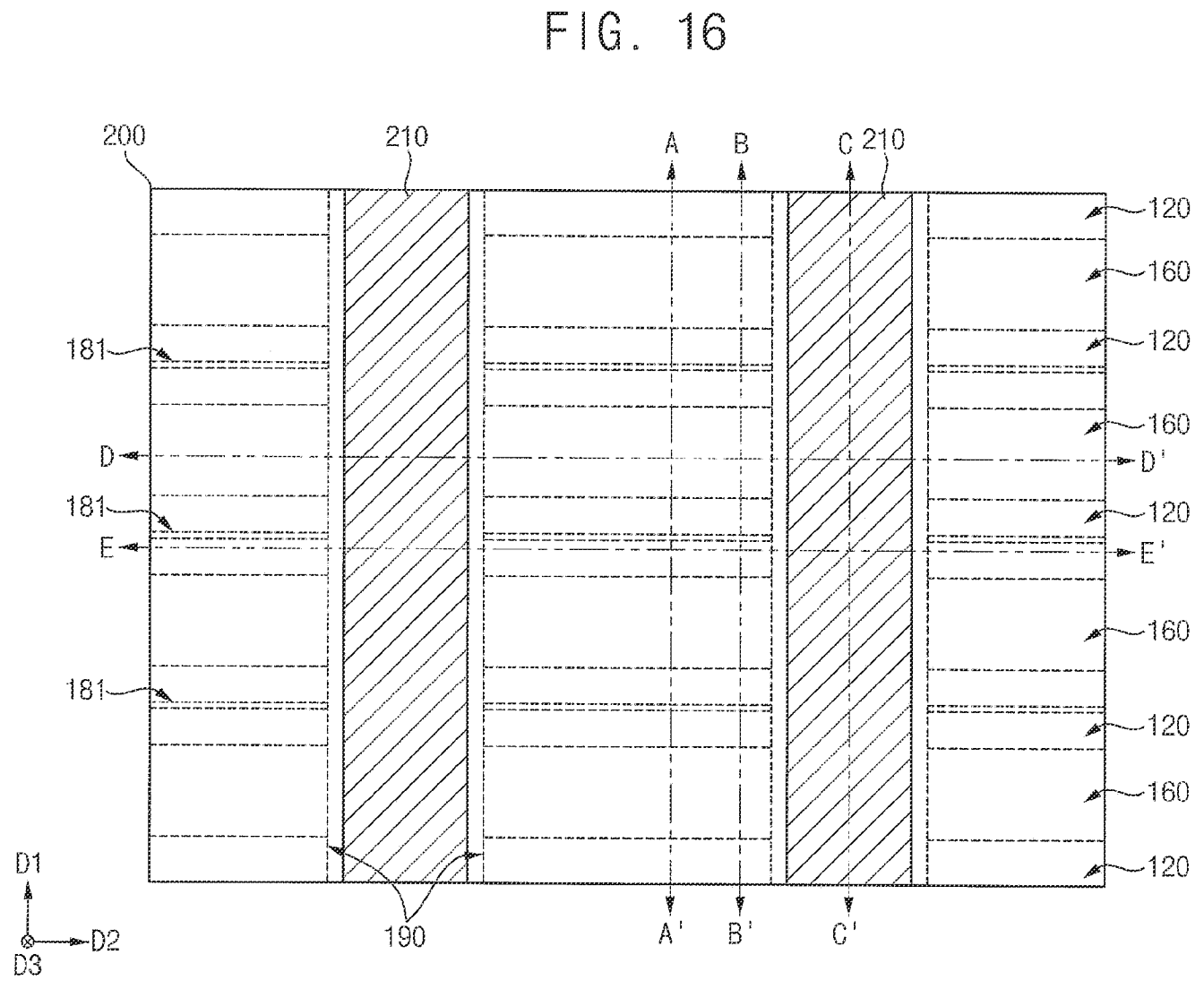

Referring to FIGS. 16 to 18, for example, a thermal oxidation process may be performed on a sidewall of each of the semiconductor patterns 137 exposed by the second opening 190 to form a first gate insulation layer 200, and a deposition process, e.g., a CVD process, an ALD process, etc., may be performed to further form the first gate insulation layer 200 on a bottom and a sidewall of the second opening 190 and an upper surface of the first insulating interlayer 180.

Thus, a portion of the first gate insulation layer 200 on the sidewall of the semiconductor pattern 137 may have a thickness greater than thicknesses of other portion of the first gate insulation layer 200. Alternatively, the first gate insulation layer 200 may be formed by the deposition process without the thermal oxidation process, and in this case, the first gate insulation layer 200 may have a constant thickness.

In an example embodiment, a portion of the first gate insulation layer 200 that may be formed by the thermal oxidation process may include an oxide, e.g., silicon oxide, and a portion of the first gate insulation layer 200 that may be formed by the deposition process may include a metal oxide having a high dielectric constant, e.g., hafnium oxide, zirconium oxide, etc. In this case, the first gate insulation layer 200 may have a multi-layered structure including a first layer containing silicon oxide and contacting a sidewall of the semiconductor pattern 137, and a second layer including a metal oxide and contacting sidewalls of the first insulating interlayer 180 and the mask structure and an upper surface of the second insulation layer 120.

A first gate electrode layer may be formed on the first gate insulation layer 200 to fill the second opening 190, and may be planarized until a portion of the first gate insulation layer 200 on the first insulating interlayer 180 is exposed. Thus, a preliminary first gate electrode 210 may be formed in the second opening 190.

The planarization process may include, e.g., a chemical mechanical polishing (CMP) process.

Figure 19:
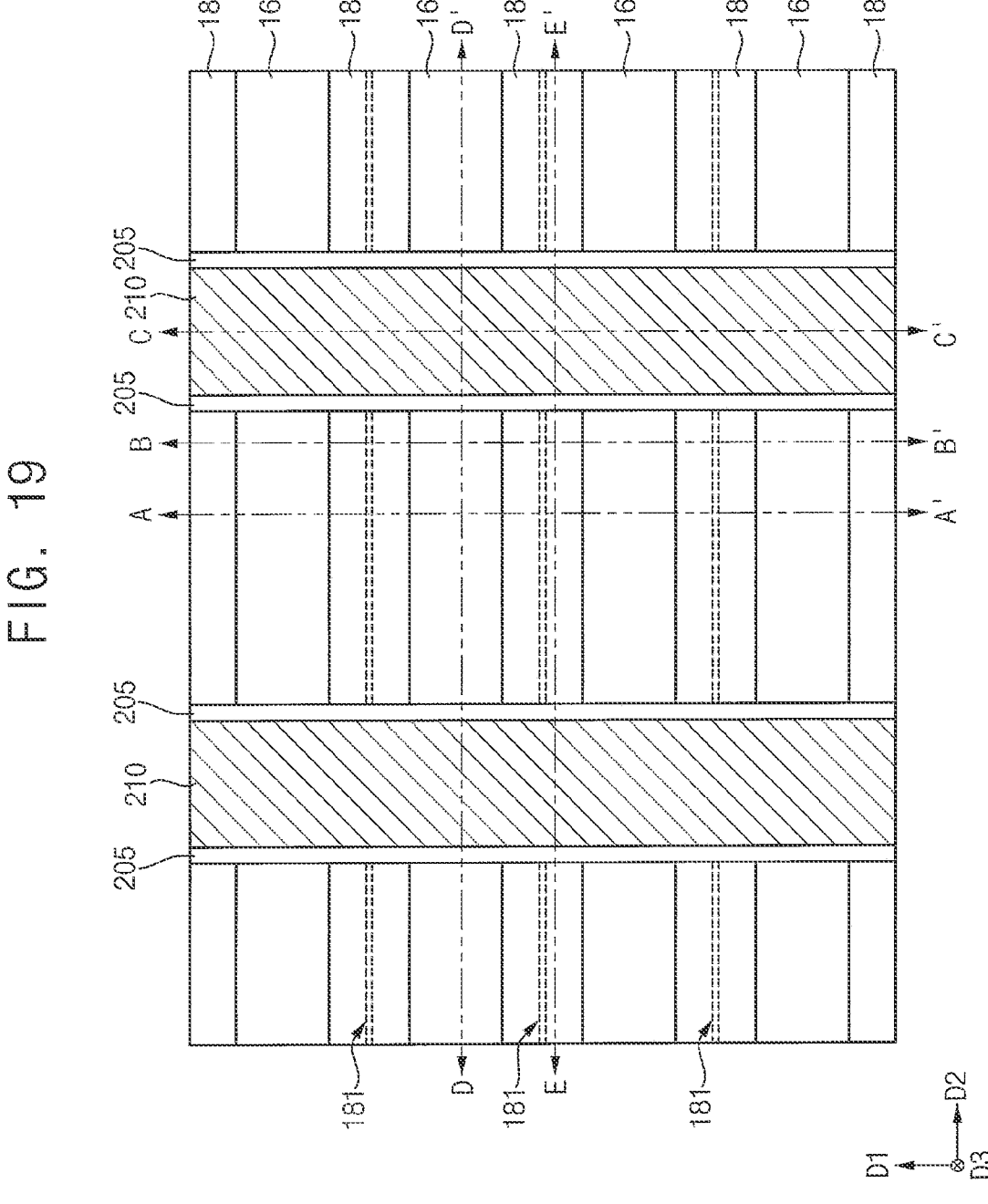
Figure 21:
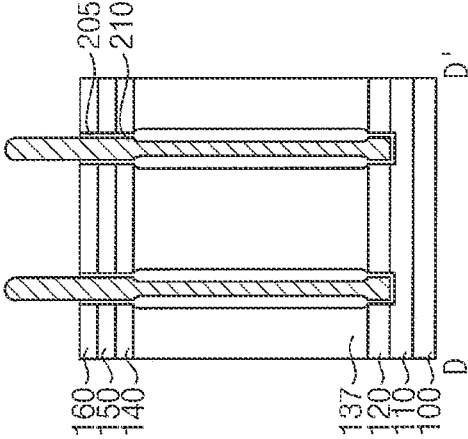

Referring to FIGS. 19 to 21, upper portions of the first gate insulation layer 200, the first insulating interlayer 180 and the third mask 160 may be removed by, e.g., an etch back process.

Thus, the preliminary first gate electrode 210 may protrude upwardly from the remaining third mask 160. Portions of the first gate insulation layer 200 on the upper surface of the first insulating interlayer 180 and an upper sidewall of the second opening 190 may be removed to form a preliminary first gate insulation pattern 205 extending in the second direction D1 and covering a sidewall in the second direction D2 and a lower surface of the preliminary first gate electrode 210. Additionally, the first insulating interlayer 180 extending in the first direction D1 may be divided into a plurality of first insulating interlayer patterns 185 spaced apart from each other in the first direction D1 by the semiconductor pattern 137 and the mask structure.

Figure 22:
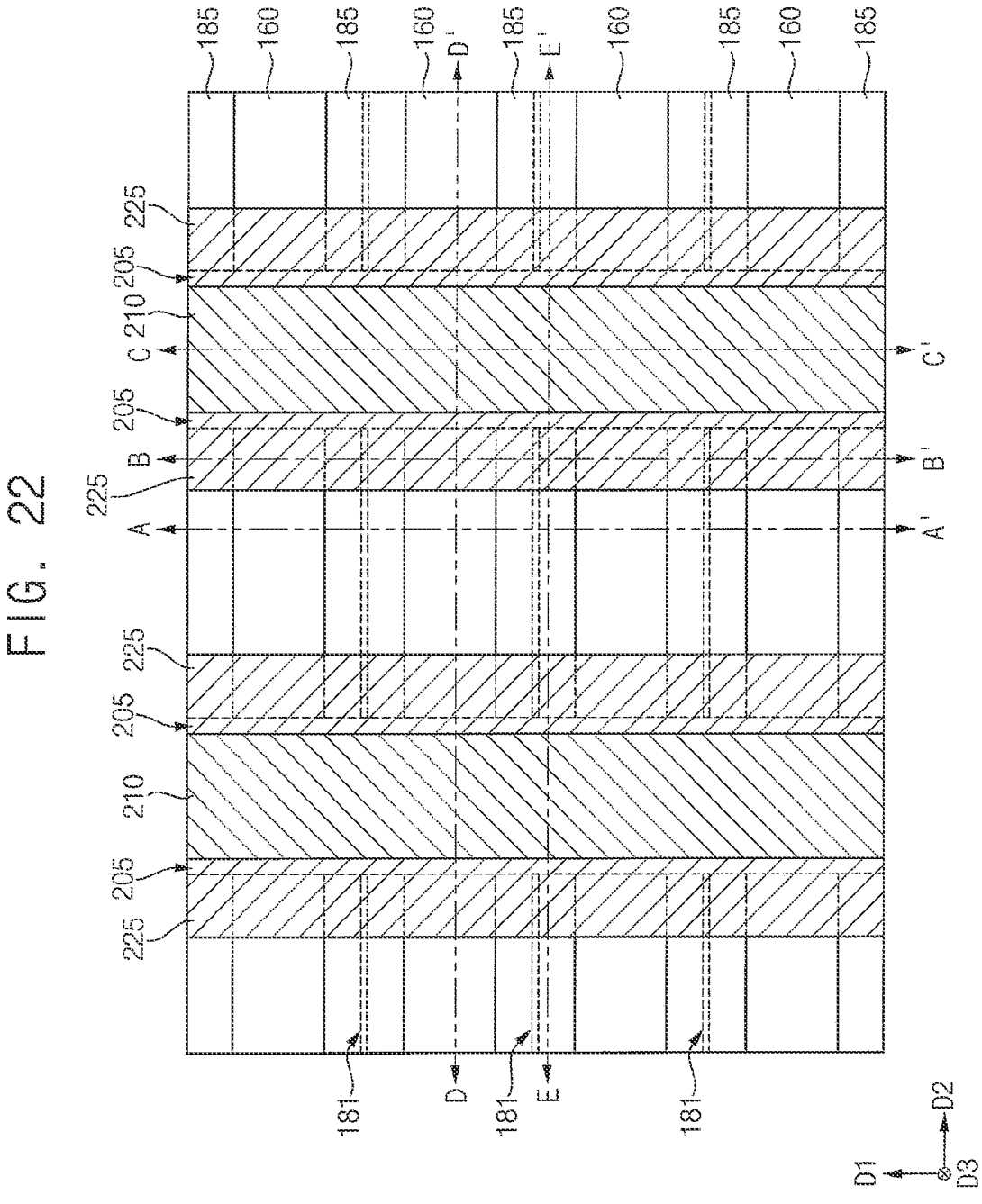

Referring to FIGS. 22 to 24, a first spacer layer may be formed on the first insulating interlayer pattern 185, the third mask 160 and the preliminary first gate insulation pattern 205 to cover the preliminary first gate electrode 210, and may be anisotropically etched.

Thus, a first spacer 225 may be formed on each of opposite sidewalls in the second direction D2 on a protruding portion of the preliminary first gate electrode 210. The first spacer 225 may include a conductive material, e.g., a metal, a metal nitride, a metal silicide, etc. In an example embodiment, the first spacer 225 may include substantially the same material as the preliminary first gate electrode 210 so as to be merged thereto.

Figure 25:
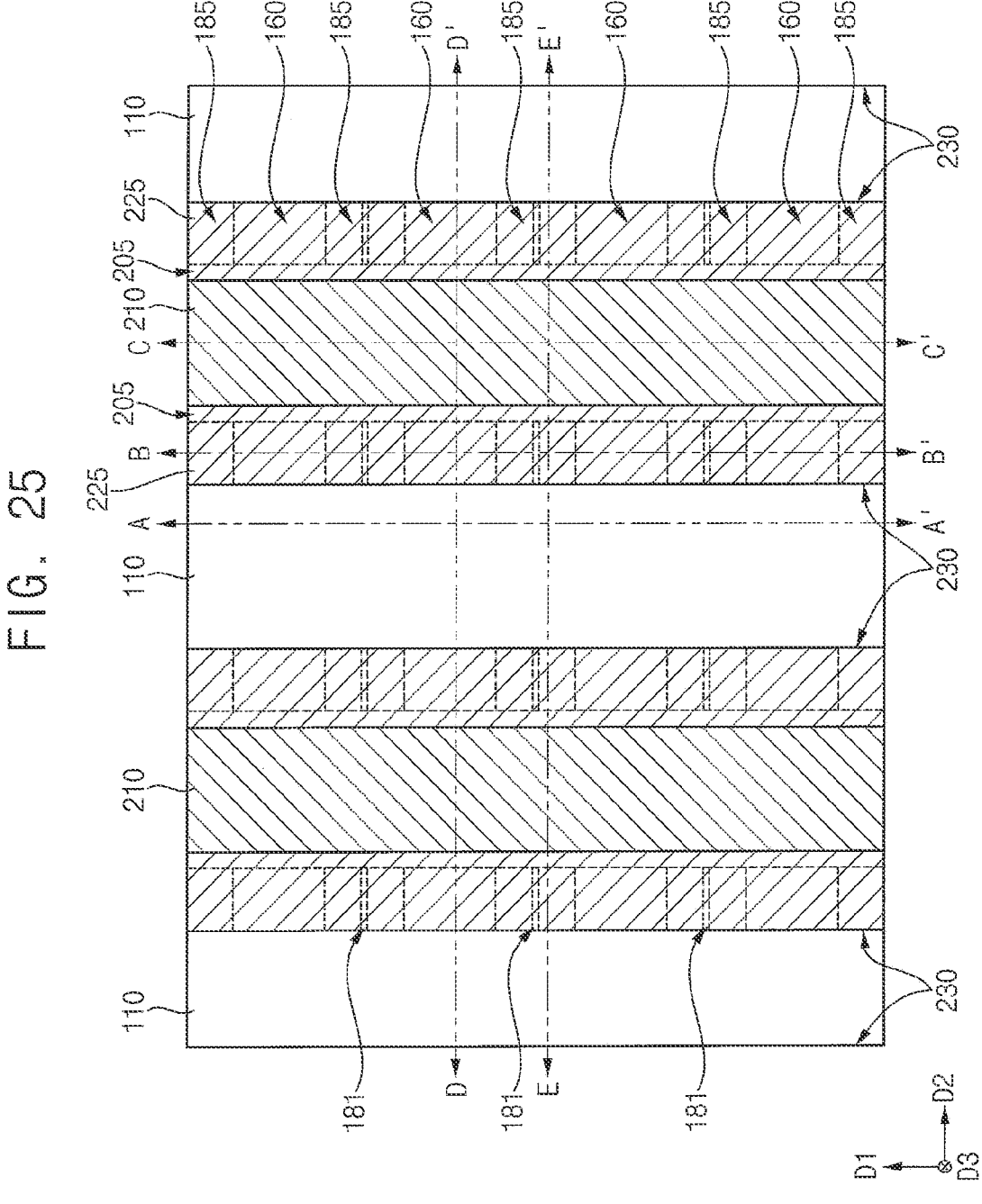

Referring to FIGS. 25 to 27, a dry etching process may be performed using the preliminary first gate electrode 210 and the first spacer 225 as an etching mask to etch the mask structure, the semiconductor pattern 137, the second insulation layer 120 and the first insulating interlayer pattern 185.

Thus, each of the mask structure, the semiconductor pattern 137, the second insulation layer 120 and the first insulating interlayer pattern 185 between neighboring ones of the preliminary first gate electrodes 210 in the second direction D2 may be divided into pieces spaced apart from each other in the second direction D2. The preliminary first gate electrode 210, the preliminary first gate insulation pattern 205, the second insulation layer 120, the semiconductor pattern 137, the mask structure, the first insulating interlayer pattern 185 and the first spacer 225 on the first insulation layer 110 may collectively form a second bar structure extending in the first direction D1, and a third opening 230 may be formed between neighboring ones of the second bar structures in the second direction D2 to expose an upper surface of the first insulation layer 110.

In an example embodiment, a GPD process or a PLAD process may be performed on each of the semiconductor patterns 137 through the third opening 230 so that n-type or p-type impurities may be further doped thereinto.

Figure 29:
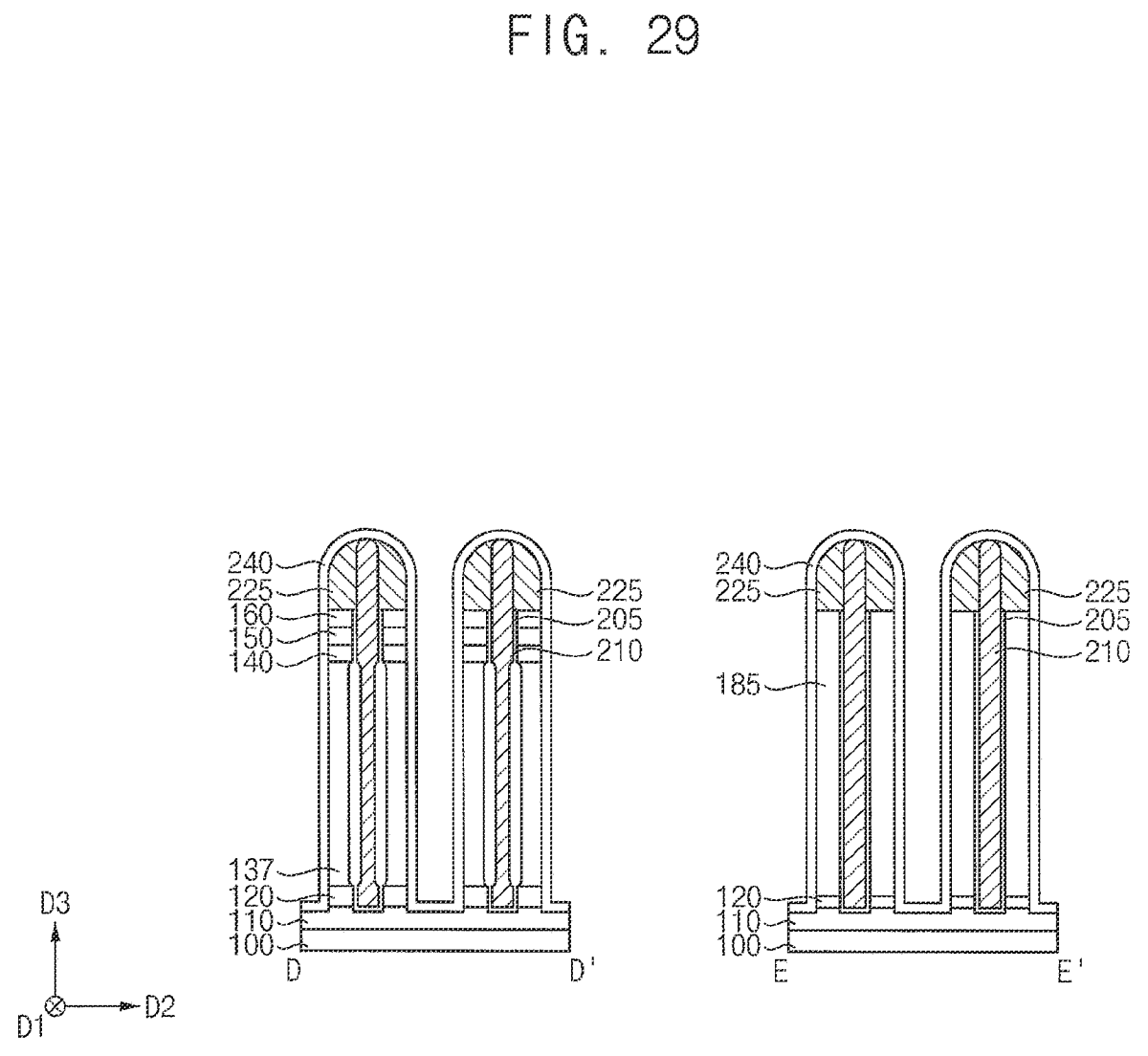

Referring to FIGS. 28 and 29, a second spacer layer 240 may be formed on the first insulation layer 110 to cover the second bar structure.

The second spacer layer 240 may include an oxide, e.g., silicon oxide, and may be formed by, e.g., an ALD process.

Figure 31:
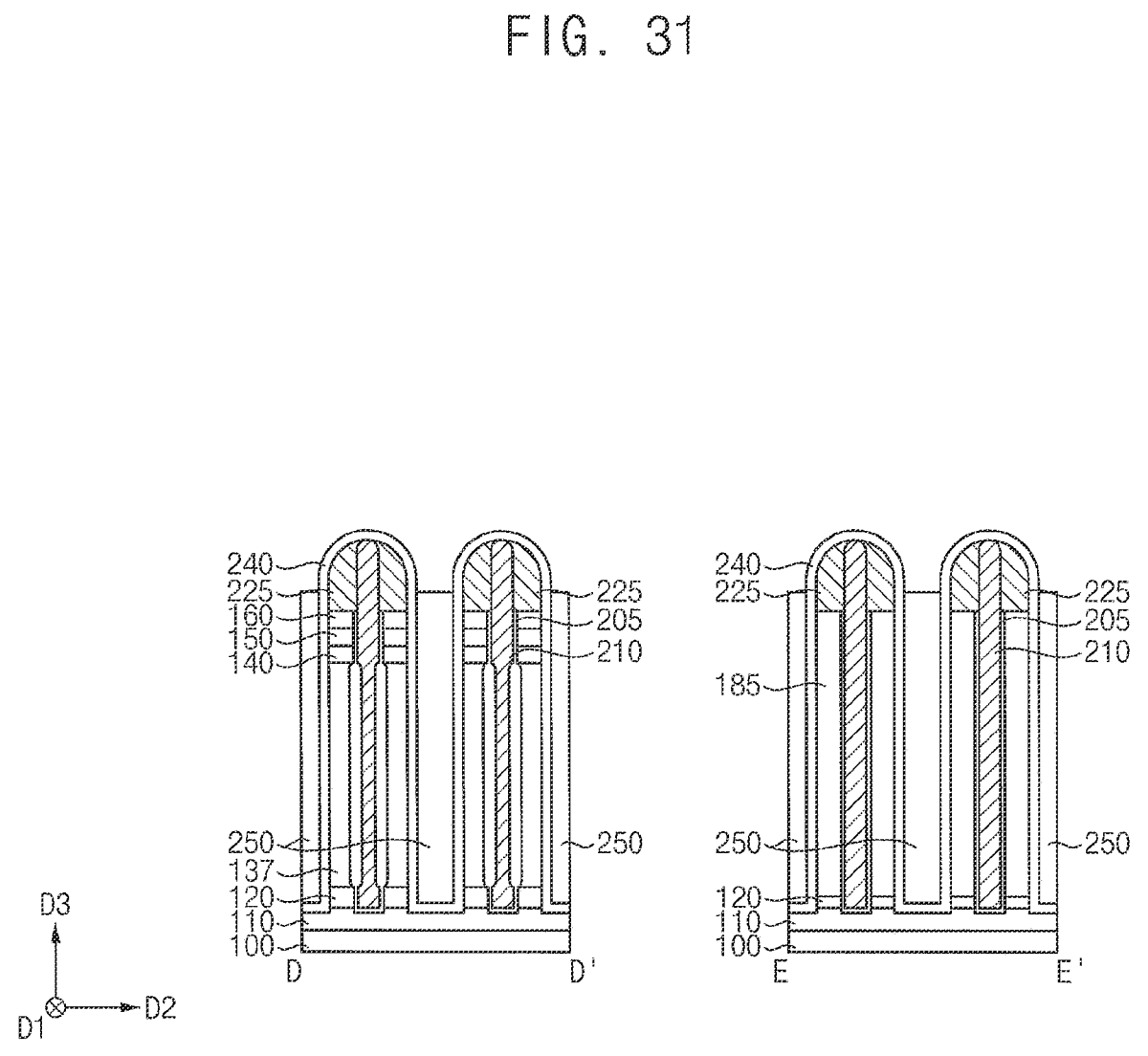

Referring to FIGS. 30 and 31, a sacrificial layer 250 may be formed on the second spacer layer 240 to fill the third opening 230, and an upper portion of the sacrificial layer 250 may be removed by, e.g., an etch back process.

The sacrificial layer 250 may include, e.g., a spin on hardmask (SOH) or an amorphous carbon layer (ACL).

In example embodiments, an upper surface of the remaining sacrificial layer 250 after the etch back process may be higher than upper surfaces of the third mask 160 and the first insulating interlayer pattern 185, and lower than upper surfaces of the preliminary first gate electrode 210 and the first spacer 225.

Figure 32:
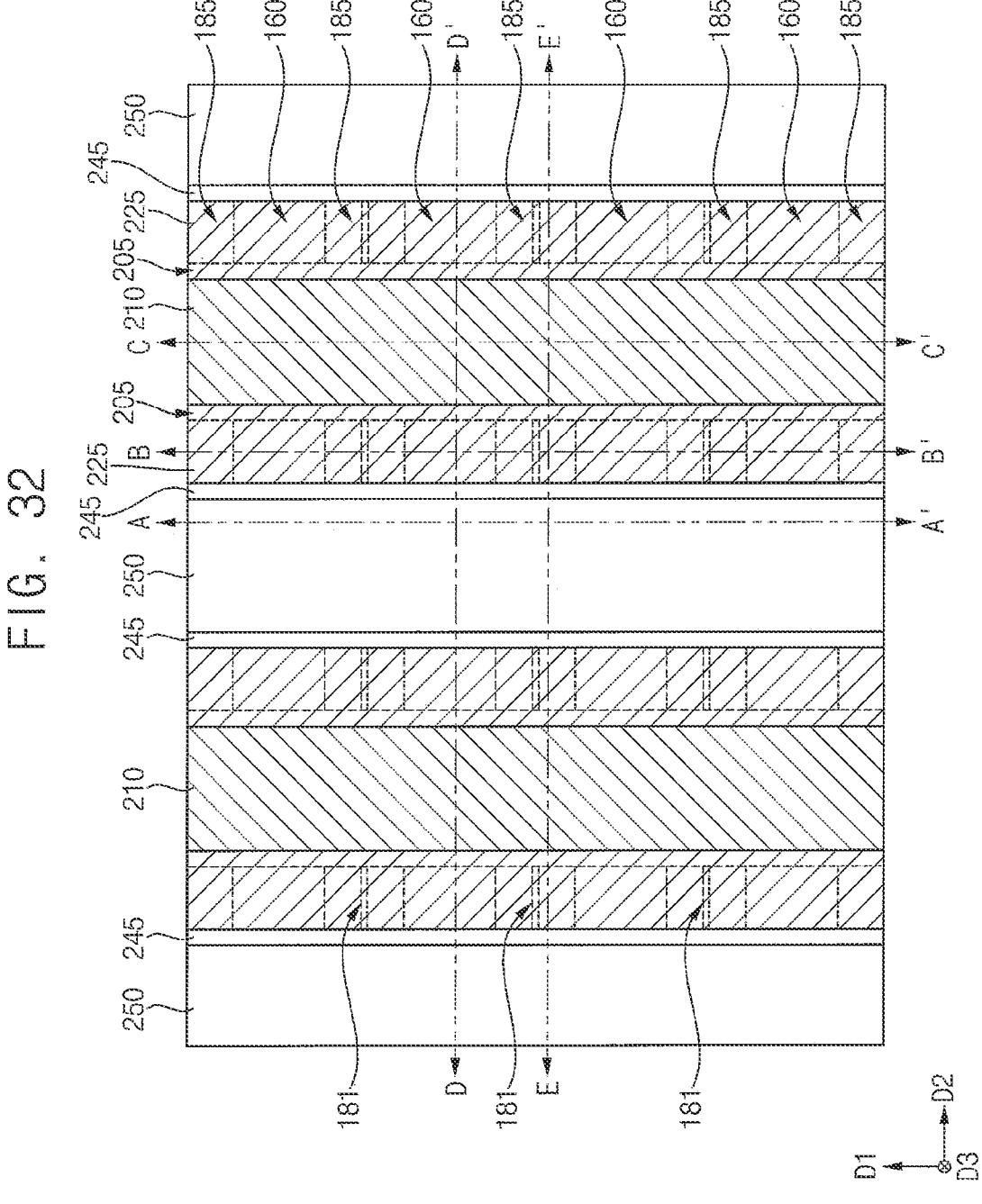

Referring to FIGS. 32 to 34, a portion of the second spacer layer 240 on the preliminary first gate electrode 210 and the first spacer 225 may be removed by, e.g., an etch back process.

Thus, a portion of the second spacer layer 240 at a height higher than the upper surface of the sacrificial layer 250 may be removed, and a remaining portion of the second spacer layer 240 may be referred to as a second spacer 245 extending in the first direction D1 between neighboring ones of the second bar structures in the second direction D2.

Figure 35:
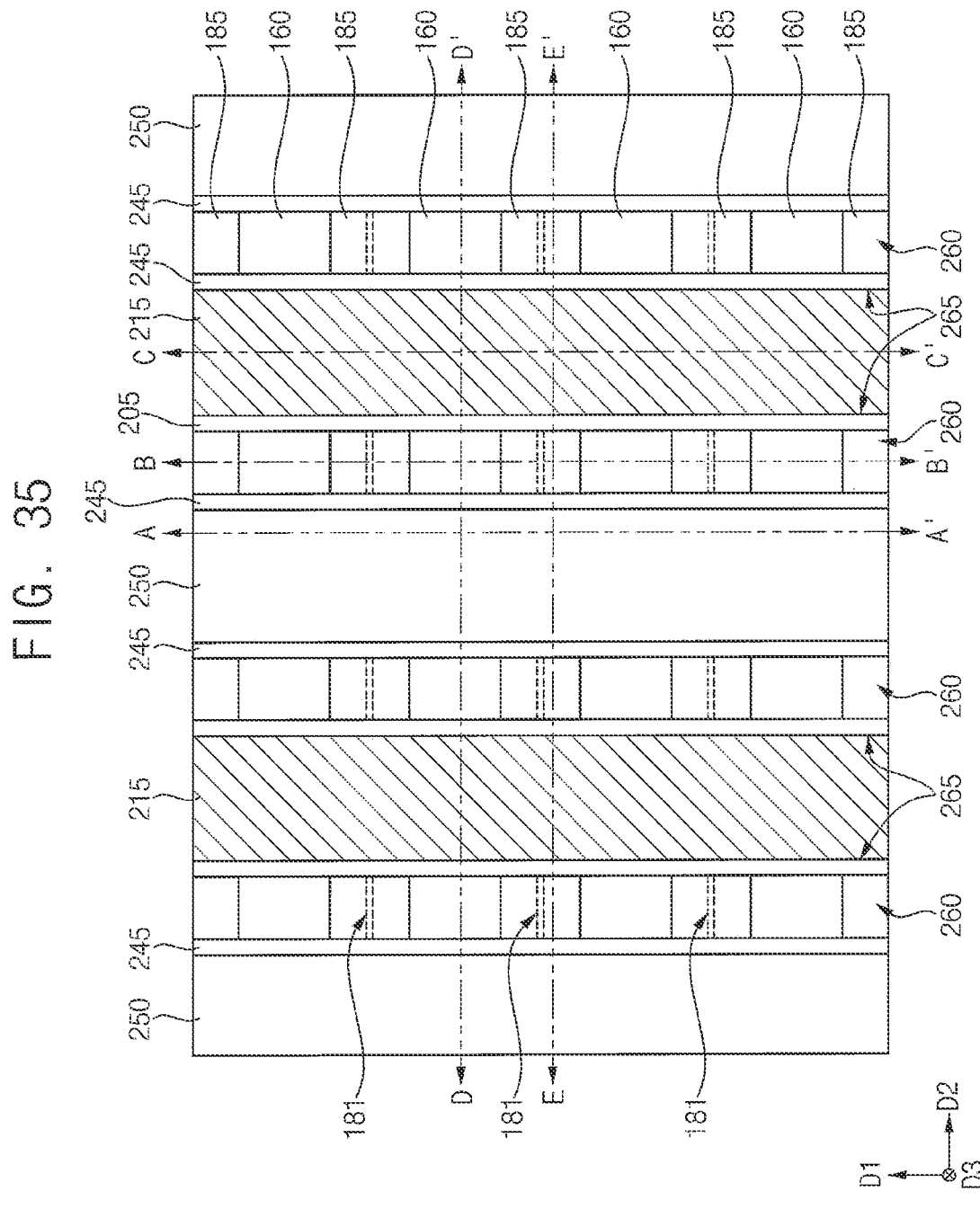

Referring to FIGS. 35 to 37, an upper portion of the preliminary first gate electrode 210 and the first spacer 225 may be removed by, e.g., an etch back process to form a fourth opening 260 and a first recess 265.

By the etch back process, the preliminary first gate electrode 210 may be transformed into a first gate electrode 215, and an upper surface of the first gate electrode 215 may be lower than an upper surface of the semiconductor pattern 137. The first gate electrode 215 may also be referred to as a back gate electrode.

The fourth opening 260 may be formed by removing the first spacer 225 and a portion of the preliminary first gate electrode 210 on the mask structure, and the first recess 265 may be formed by removing a portion of the preliminary first gate electrode 210 at a height lower than the upper surface of the mask structure to be connected to the fourth opening 260.

Figure 38:
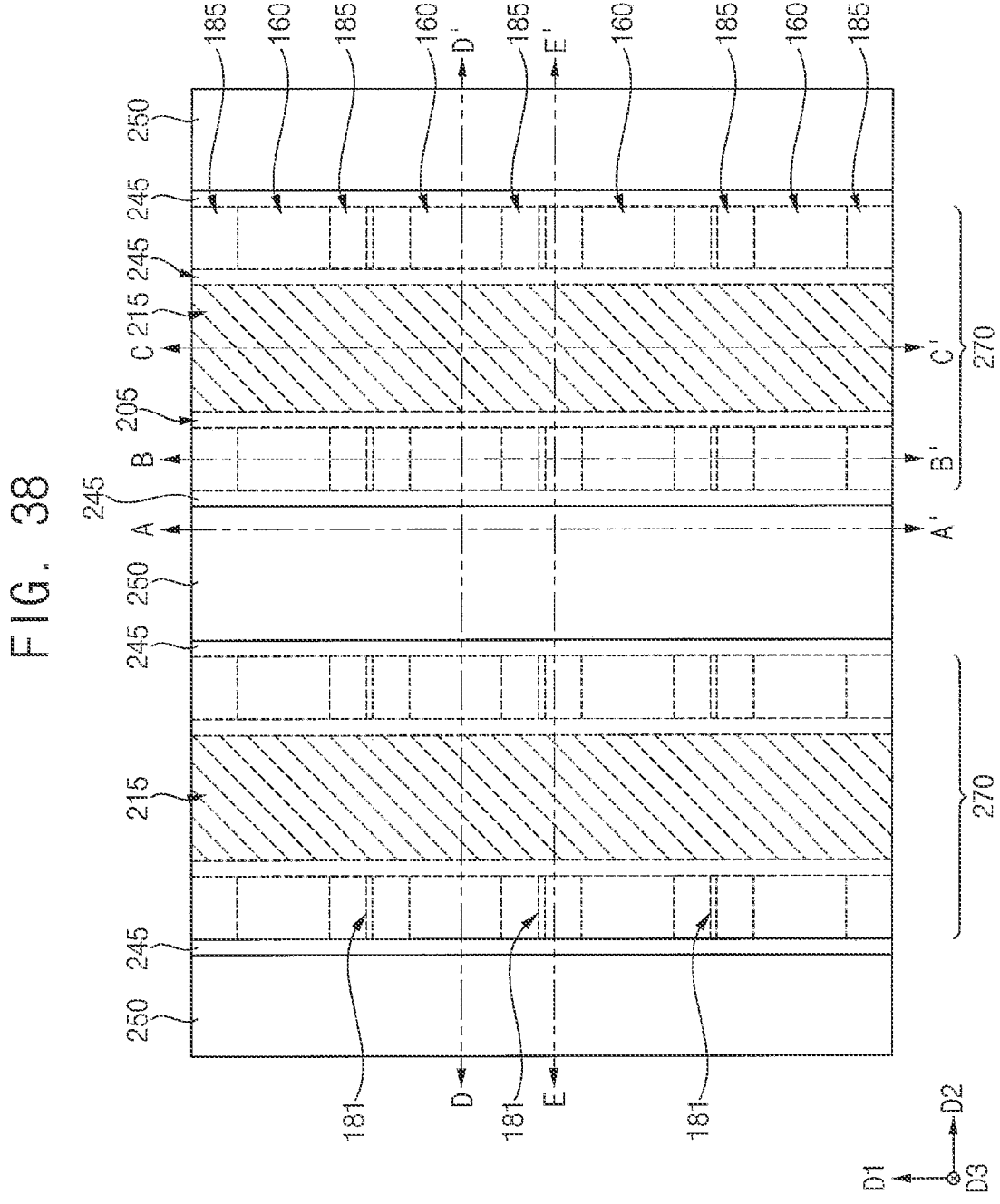

Referring to FIGS. 38 to 40, a third insulation layer 270 may be formed on the mask structure, the preliminary first gate electrode 210, the preliminary first gate insulation pattern 205, the second spacer 245 and the sacrificial layer 250 to fill the fourth opening 260 and the first recess 265, and an upper portion of the third insulation layer 270 may be removed by, e.g., an etch back process until an upper surface of the sacrificial layer 250 is exposed.

Thus, the third insulation layer 270 may be formed in the fourth opening 260 and the first recess 265. Hereinafter, the first gate electrode 215, the preliminary first gate insulation pattern 205, the second insulation layer 120, the semiconductor pattern 137, the mask structure, the first insulating interlayer pattern 185 and the third insulation layer 270 disposed on the first insulation layer 110 may collectively form a third bar structure, which may extend in the first direction D1.

Figure 42:
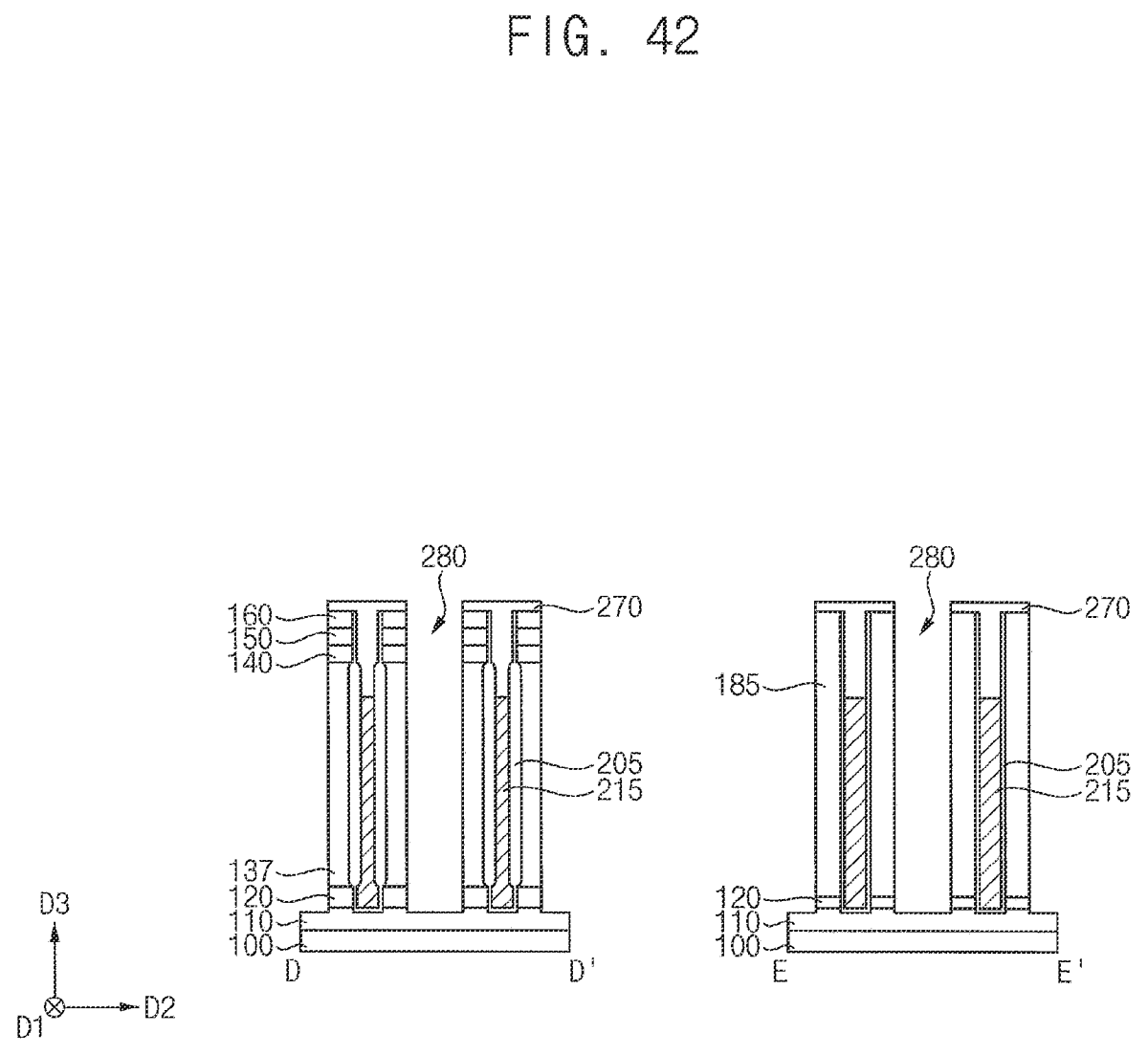

Referring to FIGS. 41 and 42, the sacrificial layer 250 and the second spacer 245 may be removed by, e.g., an ashing process and/or a stripping process.

Thus, a fifth opening 280 may be formed between neighboring ones of the third bar structures to expose an upper surface of the first insulation layer 110, and sidewalls of the second insulation layer 120, the semiconductor pattern 137, the mask structure, the first insulating interlayer pattern 185 and the third insulation layer 270 covered by the second spacer 245 may be exposed.

Referring to FIGS. 43 and 44, a thermal oxidation process may be performed on the sidewall of each of the semiconductor patterns 137 exposed by the fifth opening 280 to form a second gate insulation layer 290, and a deposition process, e.g., a CVD process, an ALD process, etc., may be performed on a bottom and a sidewall of the fifth opening 280 and an upper surface of the third insulation layer 270 to further form the second gate insulation layer 290.

Thus, a portion of the second gate insulation layer 290 disposed on the sidewall of the semiconductor pattern 137 may have a thickness greater than thicknesses of other portions of the second gate insulation layer 290. Alternatively, the second gate insulation layer 290 may be formed by the deposition process only without the thermal oxidation process, and in this case, the second gate insulation layer 290 may have a constant thickness.

The second gate insulation layer 290 may have a multi-layered structure including a first layer containing, e.g., silicon oxide and a second layer containing, e.g., a metal oxide, like the first gate insulation layer 200 described with reference to FIGS. 16 to 18.

A second gate electrode layer 300 may be formed on the second gate insulation layer 290, and a second insulating interlayer 310 may be formed on the second gate electrode layer 300 to fill a remaining portion of the fifth opening 280. The second gate electrode layer 300 may be referred to as a word line layer. In an example embodiment, an upper surface of the second insulating interlayer 310 may be lower than an upper surface of a portion of the second gate electrode layer 300 on the third insulation layer 270.

Figure 46:
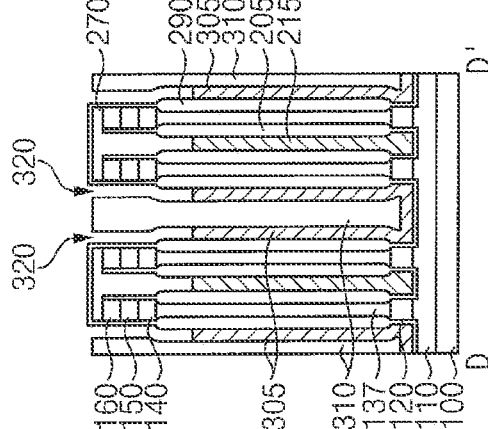

Referring to FIGS. 45 and 46, an upper portion of the second gate electrode layer 300 may be removed by, e.g., an etch back process to form a second recess 320, and a remaining portion of the second gate electrode layer 300 may form a second gate electrode 305. The second gate electrode 305 may also be referred to as a word line.

In an example embodiment, an upper portion of the second gate electrode layer 300 may be removed by, e.g., a dry etching process, and the second gate electrode 305 remaining after the dry etching process may have a flat upper surface.

In example embodiments, the second gate electrode 305 may extend in the first direction D1 between neighboring ones of the first gate electrodes 215 in the second direction D2.

Figure 48:
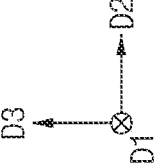

Referring to FIGS. 47 and 48, a fourth insulation layer may be formed on the second gate electrode 305, the second insulating interlayer 310 and the second gate insulation layer 290 to fill the second recess 320, and upper portions of the fourth insulation layer, the second gate insulation layer 290, the third insulation layer 270, the first insulating interlayer pattern 185, the second insulating interlayer 310 and the preliminary first gate insulation pattern 205, and the third mask 160 may be planarized by, e.g., a CMP process.

Thus, a fourth insulation pattern 330 may be formed in the second recess 320, and the third mask 160 may be removed. Additionally, the second gate insulation layer 290 may be divided into preliminary second gate insulation patterns 295, each of which may extend in the first direction D1, spaced apart from each other in the second direction D2.

The preliminary first gate insulation pattern 205 and the preliminary second gate insulation pattern 295 may be formed on opposite sidewalls in the second direction D2 of each of the semiconductor patterns 137. That is, the preliminary first gate insulation pattern 205 may be formed on a sidewall of each of the semiconductor patterns 137 adjacent to the first gate electrode 215, and the preliminary second gate insulation pattern 295 may be formed on a sidewall of each of the semiconductor patterns 137 adjacent to the second gate electrode 305.

Figure 49:
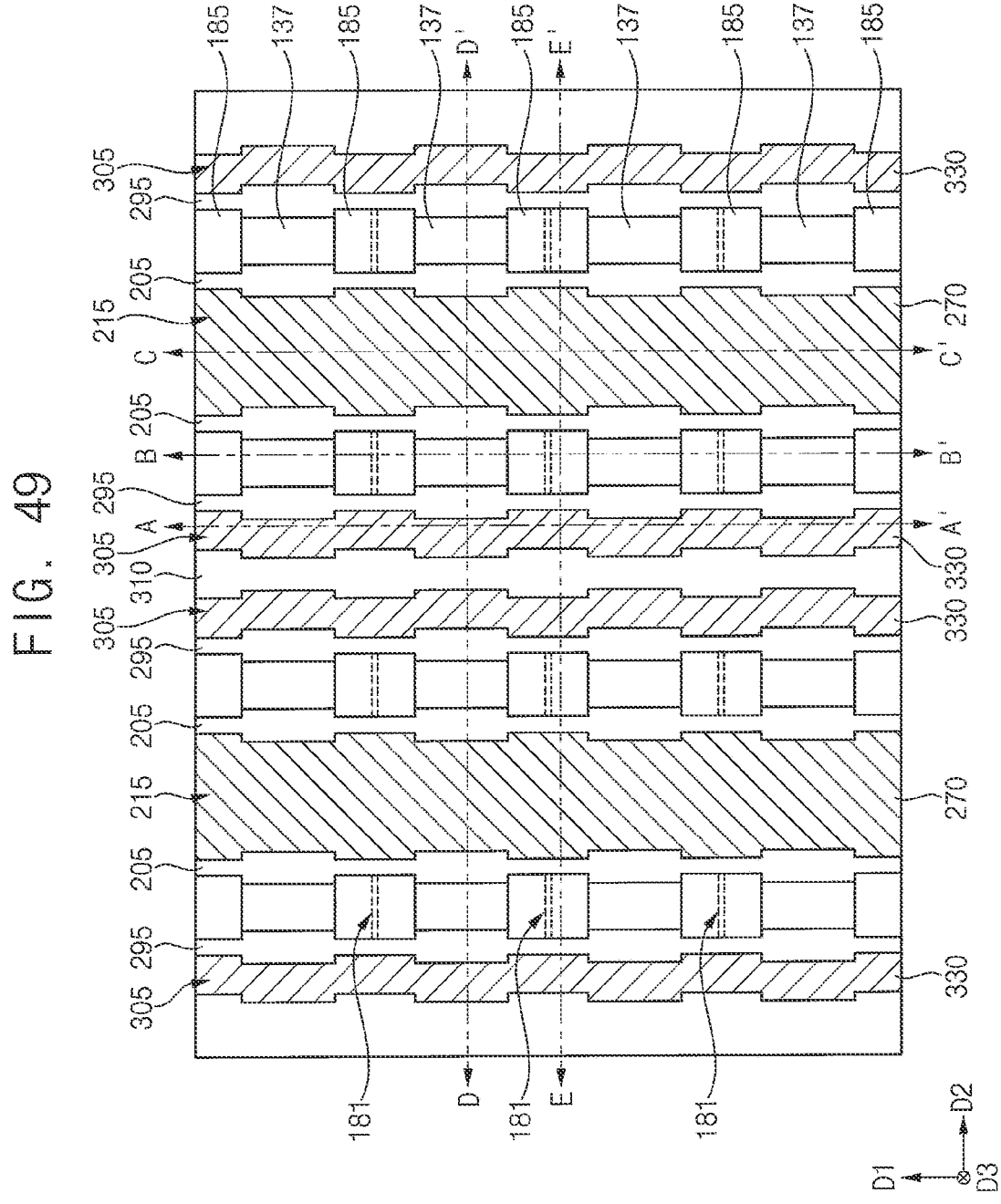
Figure 51:
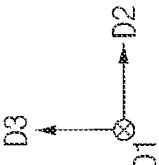

Referring to FIGS. 49 to 51, a planarization process, e.g., a CMP process, may be performed until an upper surface of the semiconductor pattern 137 is exposed.

Thus, the first and second masks 140 and 150 may be removed to expose the upper surface of the semiconductor pattern 137, and upper portions of the first insulating interlayer pattern 185, the second insulating interlayer 310, the third insulation layer 270, the fourth insulation pattern 330 and the preliminary first and second gate insulation patterns 205 and 295 at the same height of the first and second masks 140 and 150 may also be removed.

In an example embodiment, a GPD process or a PLAD process may be performed through the exposed upper surface of the semiconductor pattern 137 so that n-type or p-type impurities may be doped into the semiconductor pattern 137.

Figure 52:
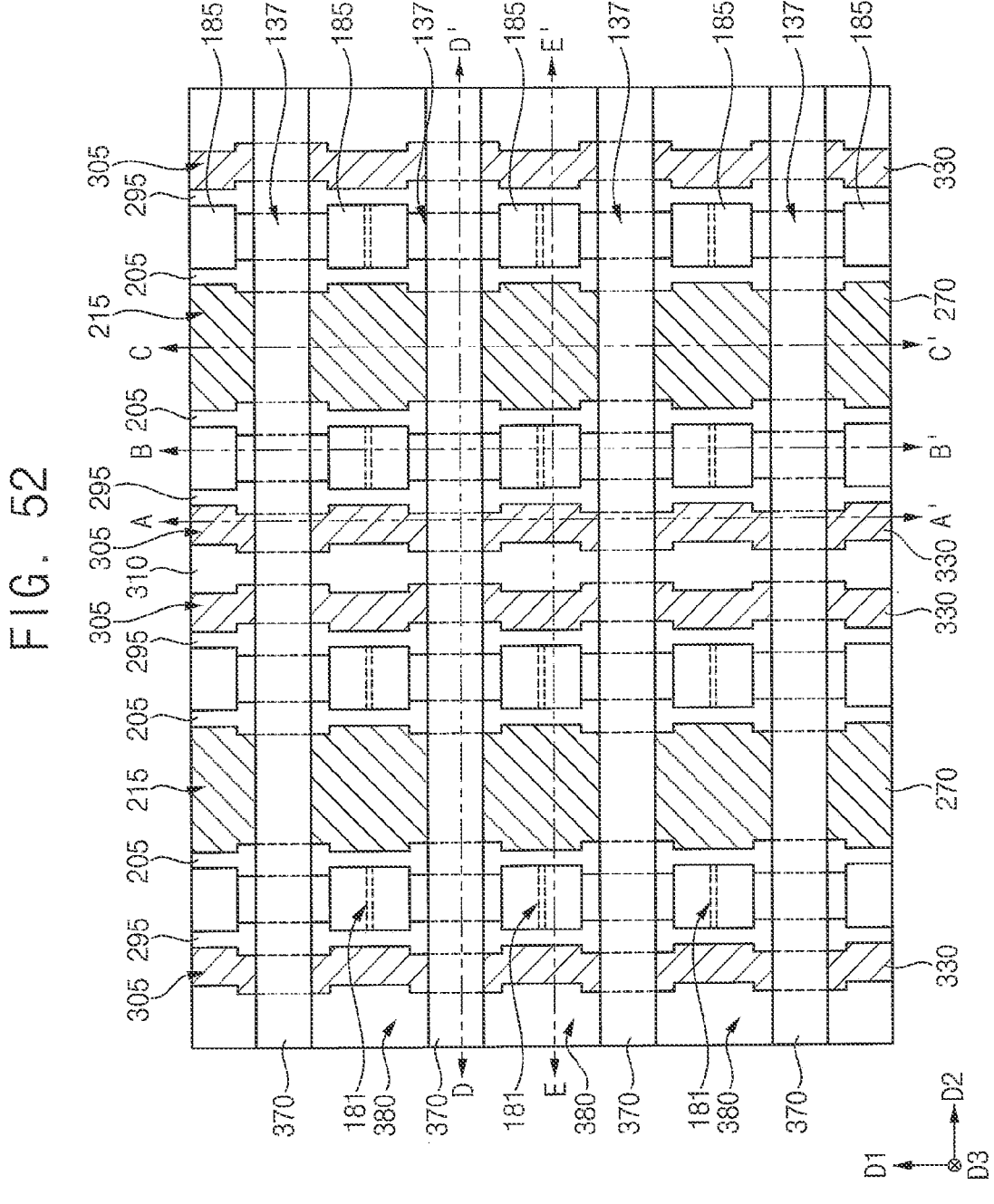

Referring to FIGS. 52 to 54, a first conductive layer, a barrier layer, a second conductive layer and a mask layer may be sequentially stacked on the semiconductor pattern 137, the first insulating interlayer pattern 185, the second insulating interlayer 310, the third insulation layer 270, the fourth insulation pattern 330 and the preliminary first and second gate insulation patterns 205 and 295, and for example, a dry etching process may be performed to form a bit line structure including a first conductive pattern 340, a barrier pattern 350, a second conductive pattern 360 and a fourth mask 370 sequentially stacked.

In example embodiments, the bit line structure may extend on and contact upper surfaces of the semiconductor patterns 137 disposed in the second direction D2, and a plurality of bit line structures may be spaced apart from each other in the first direction D1. The bit line structure may also contact upper surfaces of the preliminary first and second gate insulation patterns 205 and 295, the third insulation layer 270, the fourth insulation pattern 330 and the second insulating interlayer 310.

A sixth opening 380 extending in the second direction D2 may be formed between neighboring ones of the bit line structures in the first direction D1.

Referring to FIGS. 55 and 56, a third spacer layer 390 may be formed on the first insulating interlayer pattern 185, the second insulating interlayer 310, the third insulation layer 270, the fourth insulation pattern 330 and the preliminary first and second gate insulation patterns 205 and 295 to cover the bit line structure, a first shield layer may be formed on the third spacer layer 390 to fill the sixth opening 380, and an upper portion of the first shield layer may be removed by, e.g., an etch back process to form a first shield pattern 400 in a lower portion of the sixth opening 380.

Thus, the first shield pattern 400 may extend in the second direction D2 between neighboring ones of the bit line structures in the first direction D1.

In an example embodiment, an upper surface of the first shield pattern 400 may be substantially coplanar with an upper surface of the second conductive pattern 360. However, embodiments of the present disclosure are not limited thereto, and the upper surface of the first shield pattern 400 may be lower or higher than the upper surface of the second conductive pattern 360 according to example embodiments.

Figure 57:
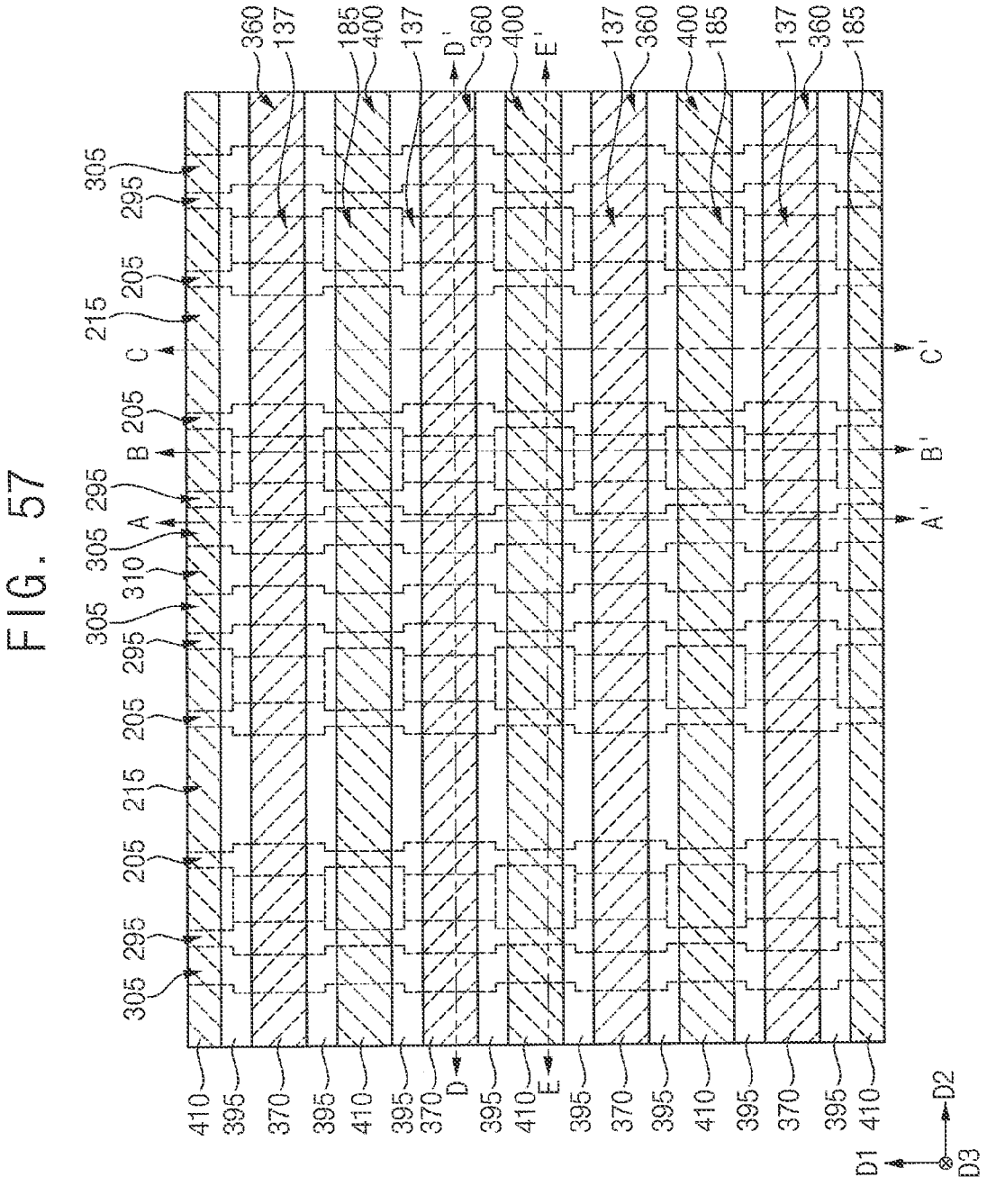
Figure 59:
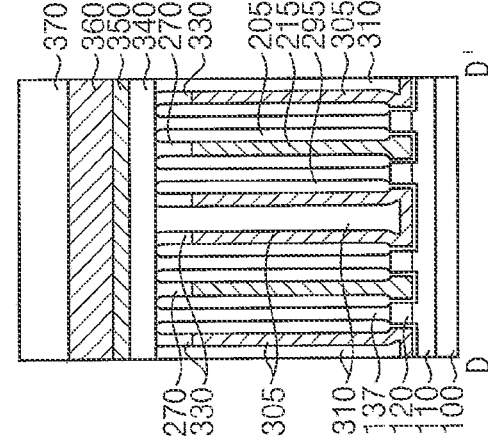

Referring to FIGS. 57 to 59, a fifth insulation layer may be formed on the first shield pattern 400 and the third spacer layer 390, and for example, an etch back process may be performed to remove upper portions of the fifth insulation layer and the third spacer layer 390.

Thus, an upper surface of the fourth mask 370 may be exposed, and a fifth insulation pattern 410 may be formed on the first shield pattern 400 between neighboring ones of the bit line structures. Additionally, a third spacer 395 may be formed on each of opposite sidewalls in the first direction D1 of the bit line structure.

An upper portion of the fourth mask protruding upwardly may be planarized, so that an upper surface of the fourth mask 370 may be substantially coplanar with upper surfaces of the third spacer 395 and the fifth insulation pattern 410.

Figure 61:
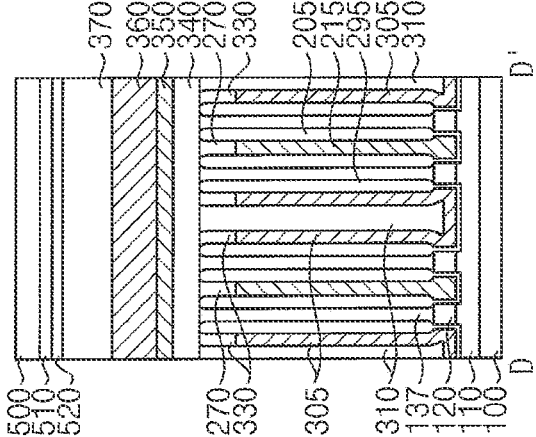

Referring to FIGS. 60 and 61, a first adhesion layer 520 may be formed on the fourth mask 370, the third spacer 395 and the fifth insulation pattern 410, and the first substrate 100 having the above structures disposed thereon and a second substrate 500 having a second adhesion layer 510 disposed thereon may be bonded with each other.

For example, the second adhesion layer 510 may be formed on the second substrate 500, the second substrate 500 may be turned over, and the second adhesion layer 510 may be bonded with the first adhesion layer 520. The first and second adhesion layers 520 and 510 may form an adhesion structure, and all structure bonded through the adhesion structure may be collectively referred to as a bonded structure.

Referring to FIGS. 62 and 63, the bonded structure may be turned over so that the second substrate 500 may be placed at a downside, and the first substrate 100 may be removed.

In example embodiments, the first substrate 100 may be removed by a grinding process, and a CHIP process may be further performed. Thus, an upper surface of the first insulation layer 110 may be exposed.

Hereinafter, upside and downside of the structures on the first substrate 100 may be referred to as downside and upside, respectively.

Figure 64:
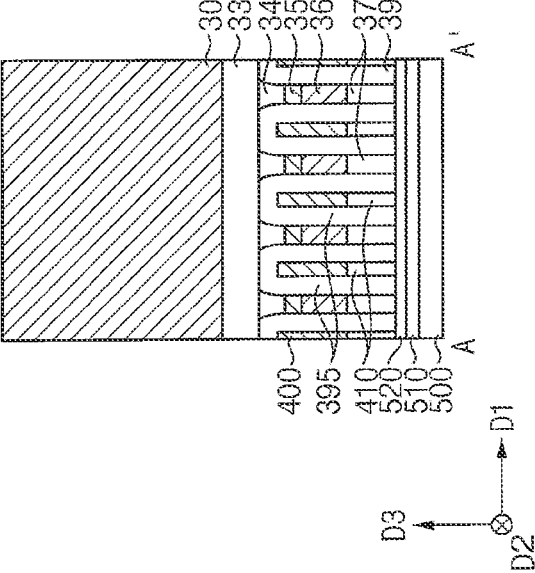

Referring to FIGS. 64 and 65, the exposed first insulation layer 110 and upper portions of the preliminary first and second gate insulation patterns 205 and 295 may be removed, and thus, upper surfaces of the second insulation layer 120 and the first and second gate electrodes 215 and 305 may be exposed.

In an example embodiment, the first insulation layer 110 and the upper portions of the preliminary first and second gate insulation patterns 205 and 295 may be removed by a wet etching process. By the wet etching process, the preliminary first gate insulation pattern 205 covering an upper surface and a sidewall of the first gate electrode 215 may be divided into first gate insulation patterns 207 covering opposite sidewalls, respectively, in the second direction D2 of the first gate electrode 215. Additionally, the preliminary second gate insulation pattern 205 covering an upper surface and a sidewall of the second gate electrode 305 may be divided into second gate insulation patterns 207 covering opposite sidewalls, respectively, in the second direction D2 of the second gate electrode 305.

Figure 66:
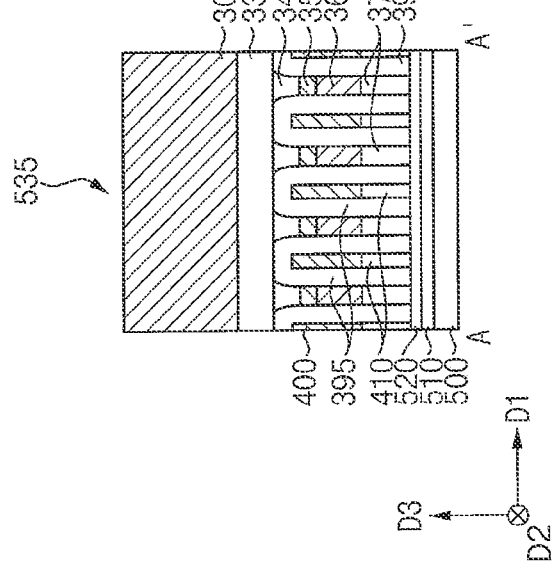

Referring to FIGS. 66 and 67, upper portions of the first and second gate electrodes 215 and 305 may be removed by, for example, an etch back process, and thus, third and fourth recesses 530 and 535 may be formed on the first and second gate electrodes 215 and 305, respectively.

In an example embodiment, upper surfaces of the first and second gate electrodes 215 and 305 remaining after the etch back process may be lower than the upper surface of the semiconductor pattern 137.

Figure 68:
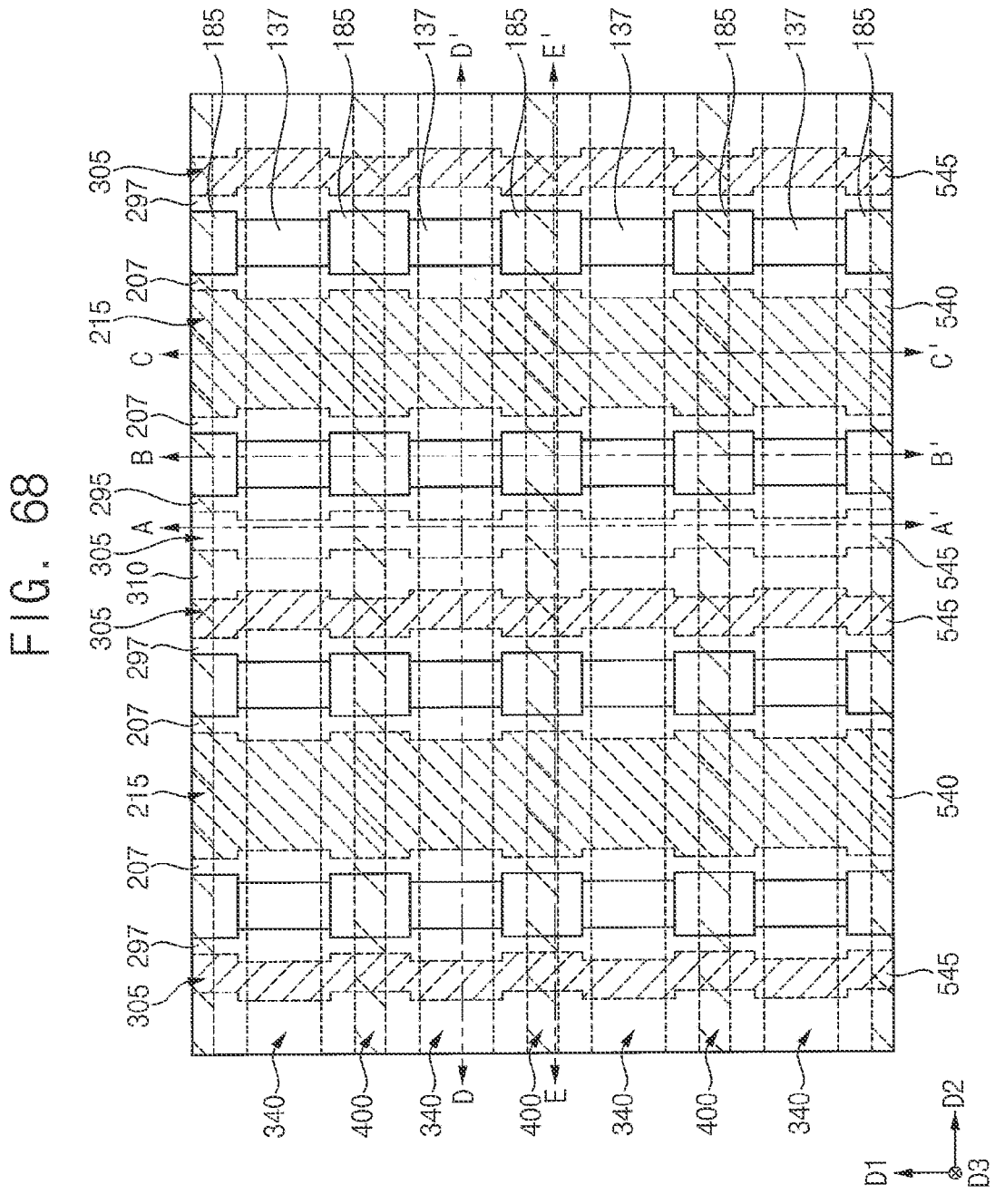

Referring to FIGS. 68 to 70, a sixth insulation layer may be formed on the first and second gate electrodes 215 and 305, the first and second gate insulation patterns 207 and 297, the first insulating interlayer pattern 185 and the second insulating interlayer 310 to fill the third and fourth recesses 530 and 535, and the sixth insulation layer, the second insulation layer 120, and upper portions of the first and second gate insulation patterns 207 and 297, the first insulating interlayer pattern 185 and the second insulating interlayer 310 may be planarized by, e.g., a CMP process.

Thus, sixth and seventh insulation patterns 540 and 545 may be formed on the first and second gate electrodes 215 and 305, respectively, and the second insulation layer 120 may be removed to expose an upper surface of the semiconductor pattern 137.

In an example embodiment, for example, a GPD process or a PLAD process may be performed through the exposed upper surface of the semiconductor pattern 137, so that n-type or p-type impurities may be doped into the semiconductor pattern 137.

Figure 71:
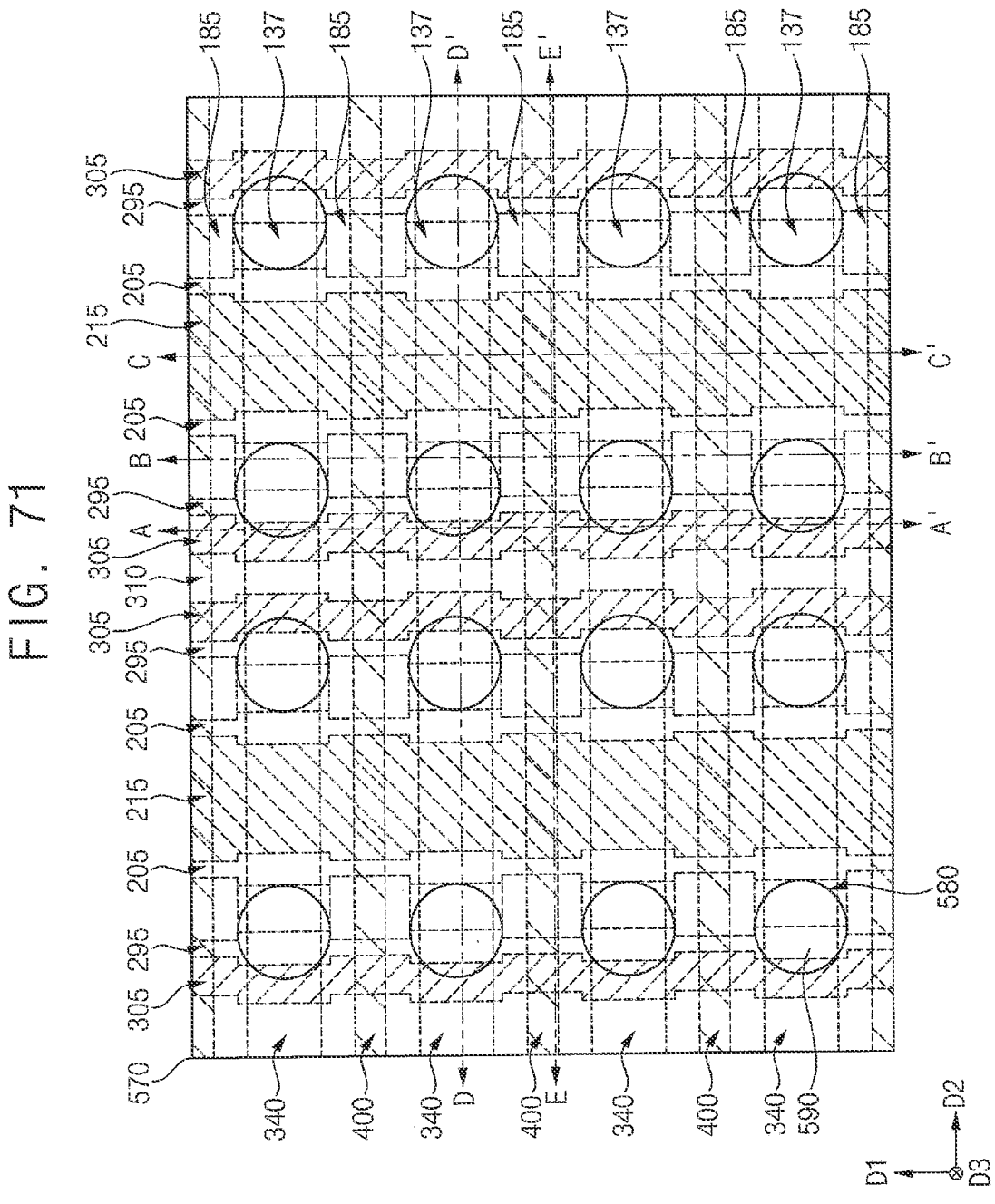
Figure 73:
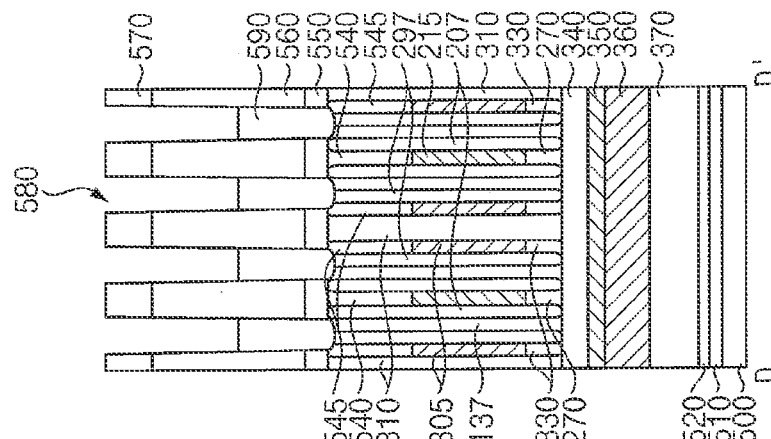

Referring to FIGS. 71 to 73, a first etch stop layer 550, a third insulating interlayer 560 and a capping layer 570 may be sequentially formed on the semiconductor pattern 137, the first insulating interlayer pattern 185, the second insulating interlayer 310, the first and second gate insulation patterns 207 and 297, and the sixth and seventh insulation patterns 540 and 545, and may be partially etched to form a seventh opening 580 exposing an upper surface of the semiconductor pattern 137.

In example embodiments, the seventh opening 580 may expose the upper surface of each of the semiconductor patterns 137, and thus, a plurality of seventh openings 580 may be formed in the first and second directions D1 and D2. The seventh opening 580 may also partially expose upper surfaces of portions of the first and second gate insulation patterns 207 and 297 and the sixth and seventh insulation patterns 540 and 545 adjacent to the semiconductor patterns 137.

In example embodiments, the seventh opening 580 may have a shape of, for example, a circle, an ellipse, a polygon, a polygon with rounded corners, etc., in a plan view. In an example embodiment, the seventh openings 580 may be arranged in a lattice pattern in a plan view. Alternatively, the seventh openings 580 may be arranged in a honeycomb pattern in a plan view.

A lower contact plug layer may be formed on the semiconductor pattern 137 and the capping layer 570 to fill the seventh opening 580, the lower contact plug layer may be planarized until an upper surface of the capping layer 570 is exposed, and an upper portion of the lower contact plug layer may be removed by, e.g., an etch back process. Thus, a lower contact plug 590 may be formed in a lower portion of the seventh opening 580.

Figure 74:
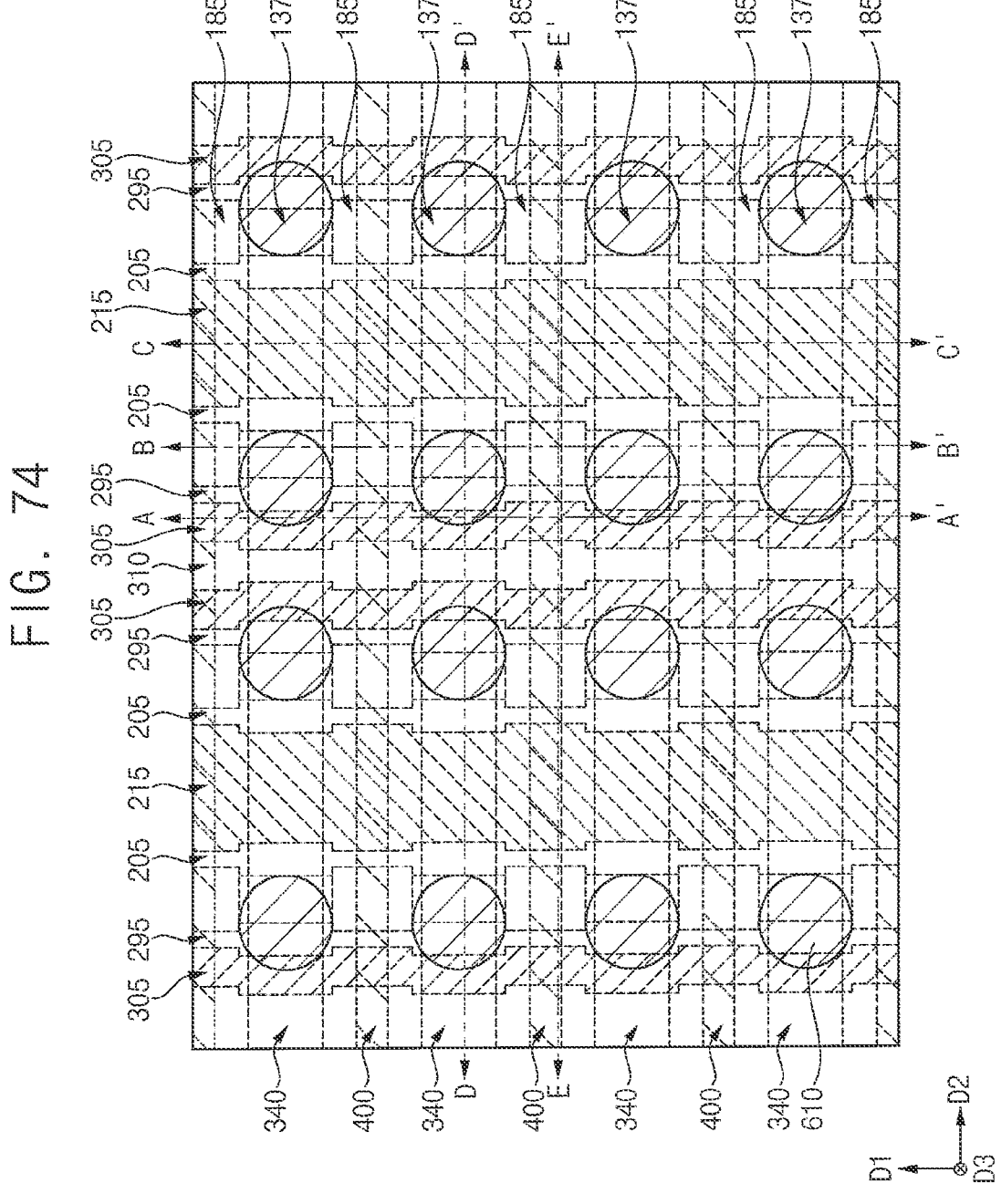

Referring to FIGS. 74 to 76, an ohmic contact pattern 600 and an upper contact plug 610 stacked in an upper portion of the seventh opening 580 may be formed.

The ohmic contact pattern 600 may be formed by forming a metal layer on the lower contact plug 590 and the capping layer 570 to fill the seventh opening 580, performing a heat treatment process on the metal layer so that the metal layer and the lower contact plug 590 may be reacted with each other to form a metal silicide layer, and removing an unreacted portion of the metal layer.

The upper contact plug 610 may be formed by forming an upper contact plug layer on the ohmic contact pattern 600 and the capping layer 570 to fill a remaining portion of the seventh opening 580, and planarizing the upper contact plug layer until an upper surface of the capping layer 570 is exposed.

The lower contact plug 590, the ohmic contact pattern 600 and the upper contact plug 610 sequentially stacked in the seventh opening 580 may collectively form a contact plug structure, and a plurality of contact plug structures may be spaced apart from each other in the first and second directions D1 and D2. In example embodiments, the contact plug structures may be arranged in a lattice pattern or a honeycomb pattern in a plan view.

Figure 77:
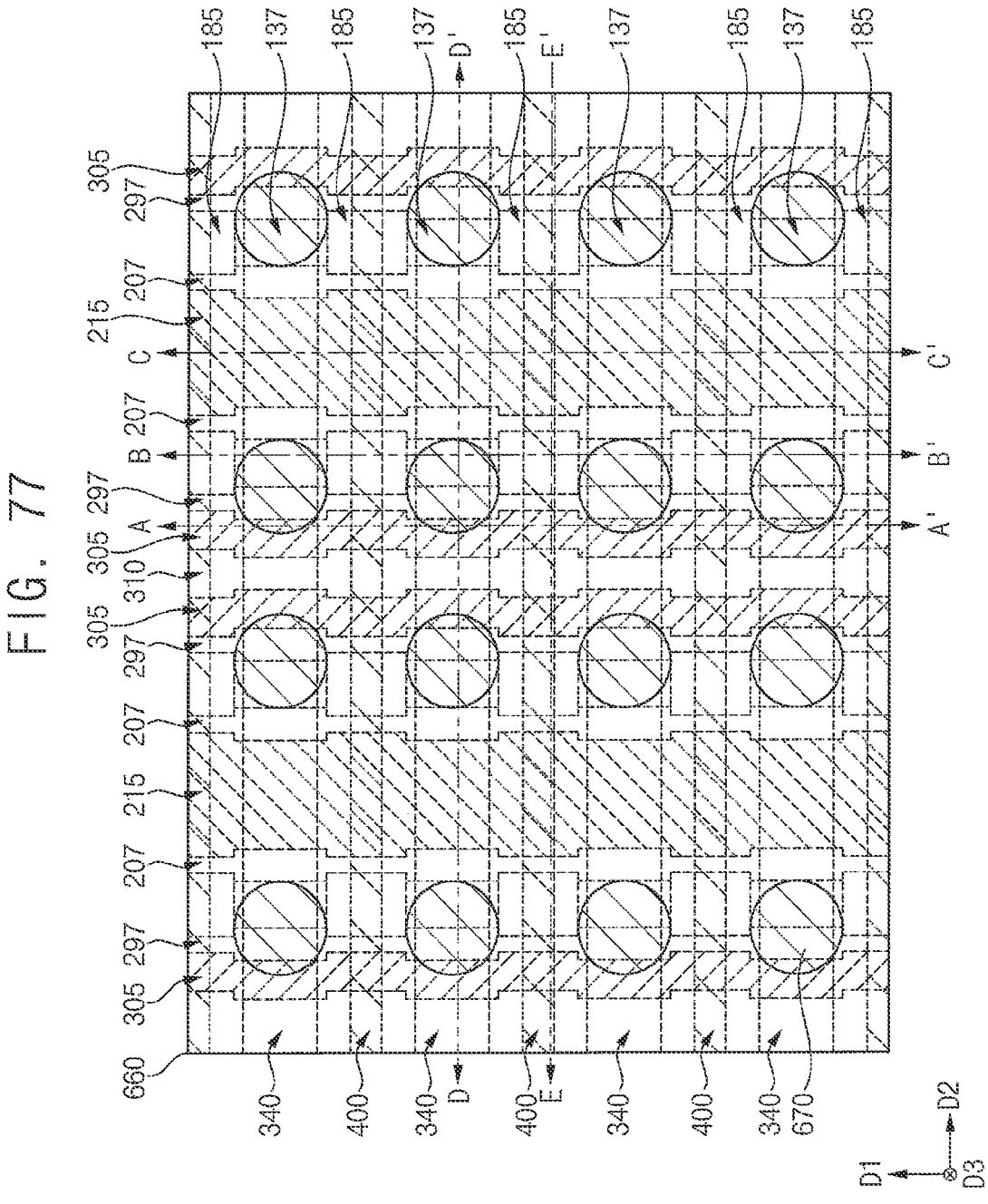

Referring to FIGS. 77 to 79, a second etch stop layer 620, a first mold layer 630, a first support layer 640, a second mold layer 650 and a second support layer 660 may be sequentially stacked on the capping layer 570 and the upper contact plug 610, and may be partially removed to form an eighth opening exposing an upper surface of the upper contact plug 610, and a first capacitor electrode 670 may be formed in the eighth opening.

The first and second mold layers 630 and 650 may include an oxide, e.g., silicon oxide.

In example embodiments, the first capacitor electrode 670 may have a shape of, for example, a circle, an ellipse, a polygon, a polygon with rounded corners, etc., in a plan view. In an example embodiment, the first capacitor electrodes 670 may be arranged in a lattice pattern in a plan view. Alternatively, first capacitor electrodes 670 may be arranged in a honeycomb pattern in a plan view.

Figure 80:
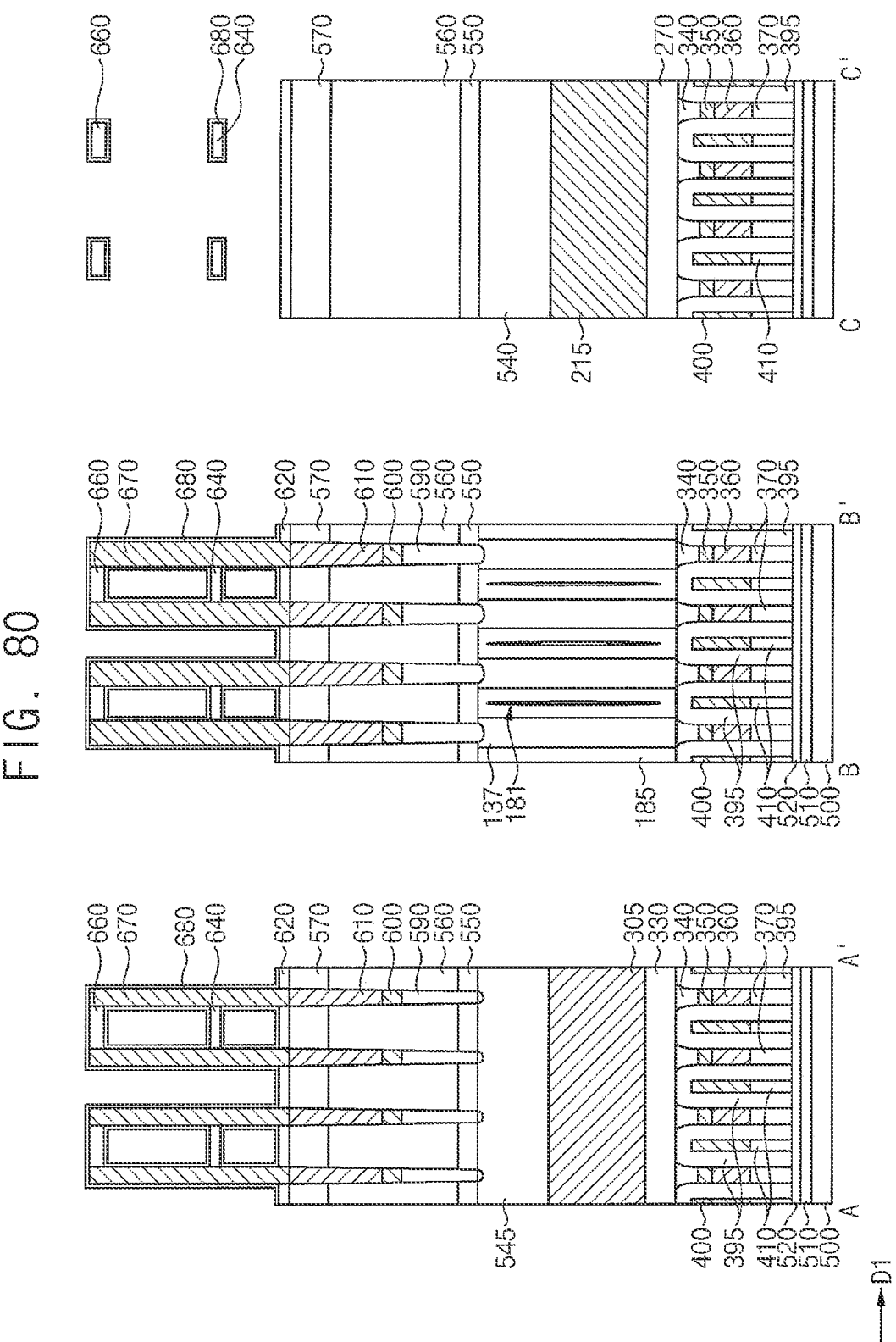

Referring to FIGS. 80 and 81, the first and second mold layers 630 and 650 may be removed to expose surfaces of the first capacitor electrode 670 and the first and second support layers 640 and 660, and a dielectric layer 680 may be formed on the exposed surfaces of the first capacitor electrode 670 and the first and second support layers 640 and 660.

Referring again to FIGS. 1 to 4, a second capacitor electrode 690 may be formed on the dielectric layer 680.

The first and second capacitor electrodes 670 and 690 and the dielectric layer 680 therebetween may collectively form a capacitor 700.

By the above processes, the semiconductor device may be manufactured.

As illustrated above, a dry etching process may be performed on the semiconductor layer 130 using the mask structure as an etching mask to form the preliminary semiconductor pattern 135, a dry etching process may be performed on the preliminary semiconductor pattern 135 to form the second opening 190 and the semiconductor pattern 137, the preliminary first gate electrode 210 may be formed in the second opening 190, and an upper portion of the preliminary first gate electrode 210 may be removed to form the first gate electrode 215.

Thus, the semiconductor pattern 137 serving as a channel may be formed before forming the first gate electrode 215 serving as a back gate electrode, which may be more easily performed when compared to forming the first gate electrode 215 before forming the semiconductor pattern 137.

Figure 82:
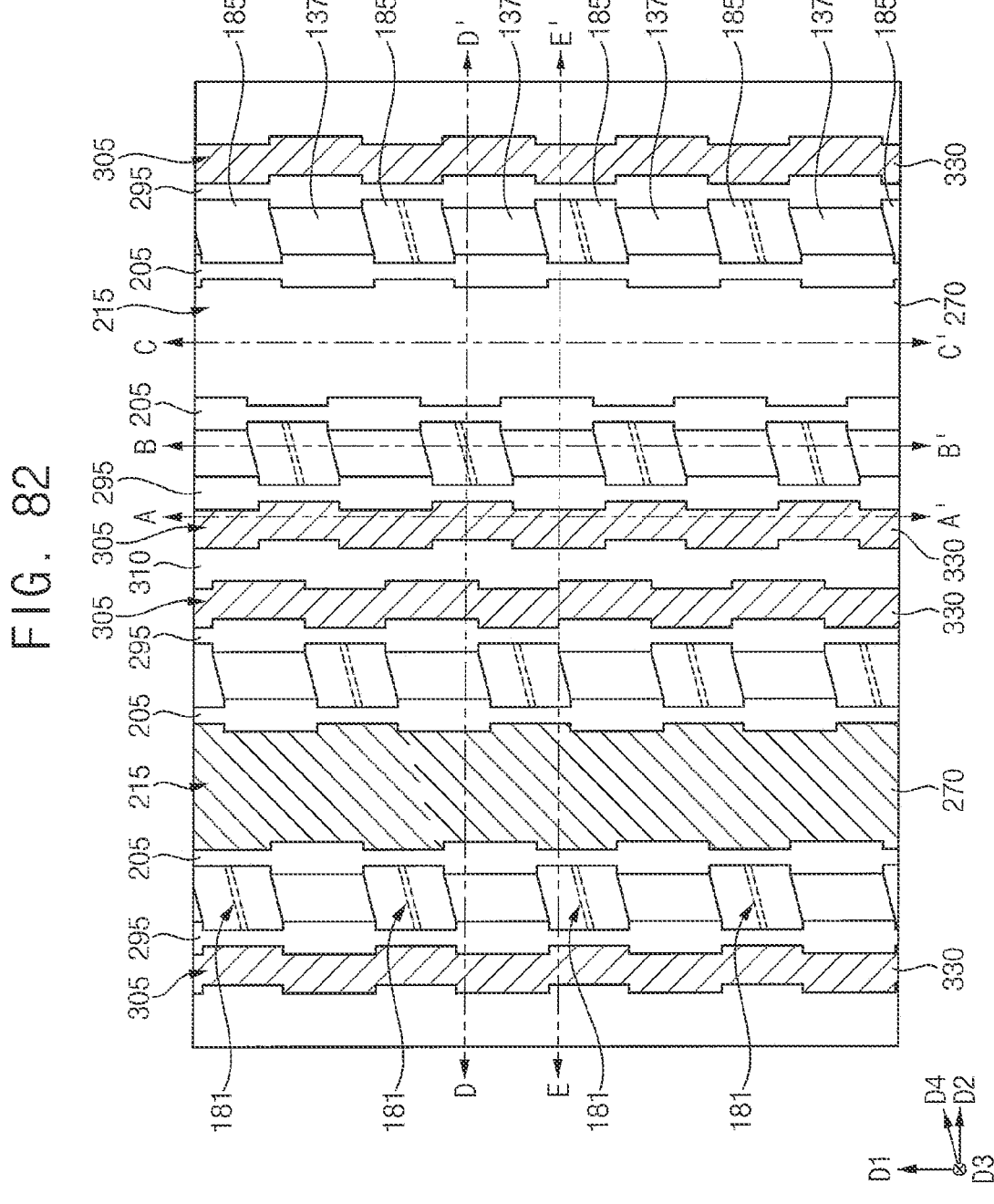
FIG. 82 is a horizontal cross-sectional view illustrating a semiconductor device in accordance with example embodiments.

FIG. 82 is a horizontal cross-sectional view illustrating a semiconductor device in accordance with example embodiments, and may correspond to FIG. 49. This semiconductor device may be substantially the same as or similar to that of FIGS. 1 to 4, except for the shape and layout of the semiconductor pattern 137, and for convenience of description, repeated explanations are omitted herein.

Referring to FIG. 82, the semiconductor pattern 137 may have a shape of a parallelogram in a plan view, and a plurality of semiconductor patterns 137 may be arranged in the first direction D1 and in a fourth direction D4, which is parallel to the upper surface of the first substrate 100 or the second substrate 500 and forms an acute angle with respect to the first and second directions D1 and D2.

The first insulating interlayer pattern 185 may also have a shape of a parallelogram in a plan view, and a plurality of first insulating interlayer patterns 185 may be arranged in the first and fourth directions D1 and D4. Thus, the seam 181 or the void in each of the first insulating interlayer patterns 185 may extend in the fourth direction D4 in a plan view.

Figure 83:
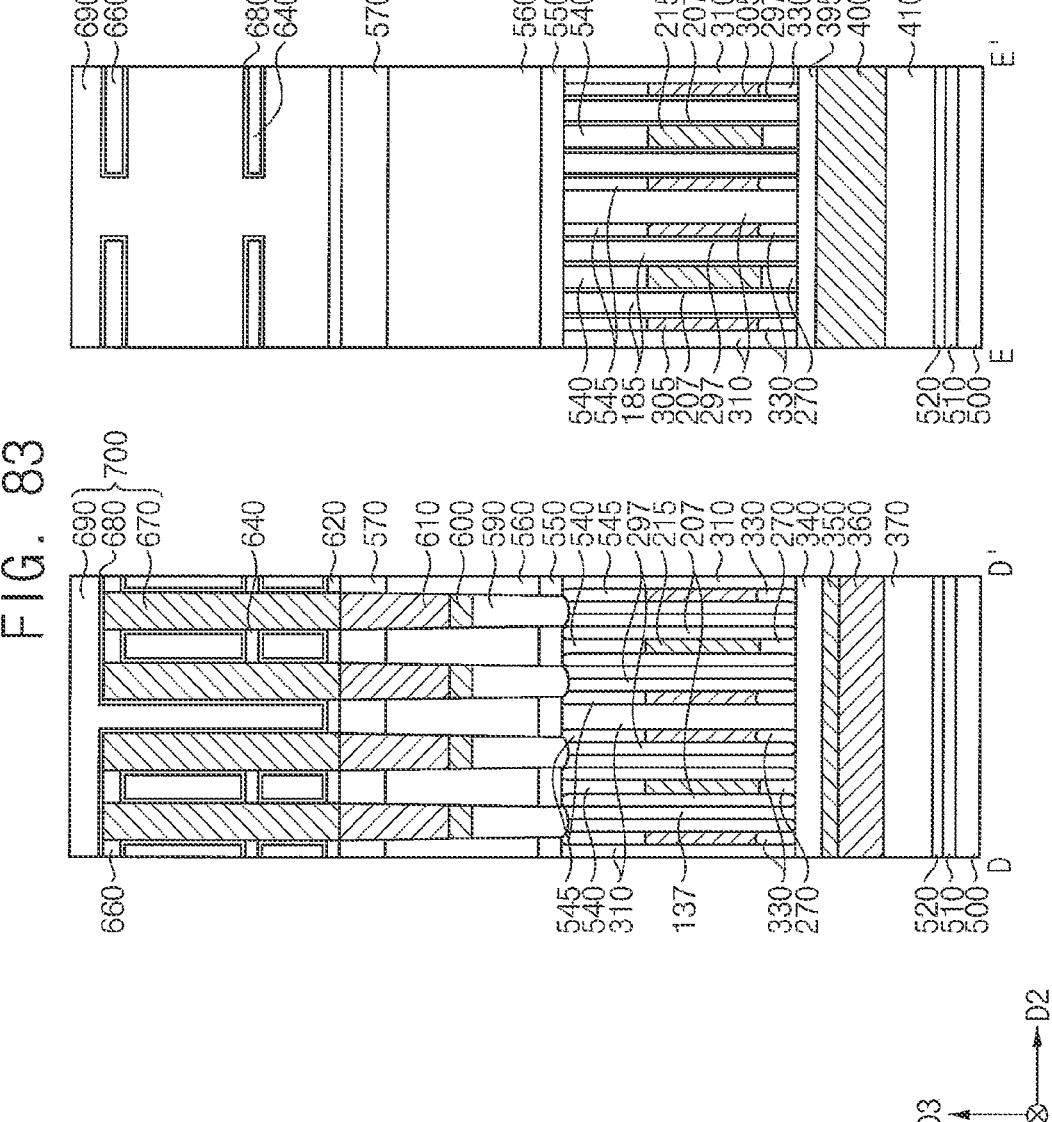
FIGS. 83 to 85 are cross-sectional views illustrating semiconductor devices in accordance with example embodiments.
Figure 84:
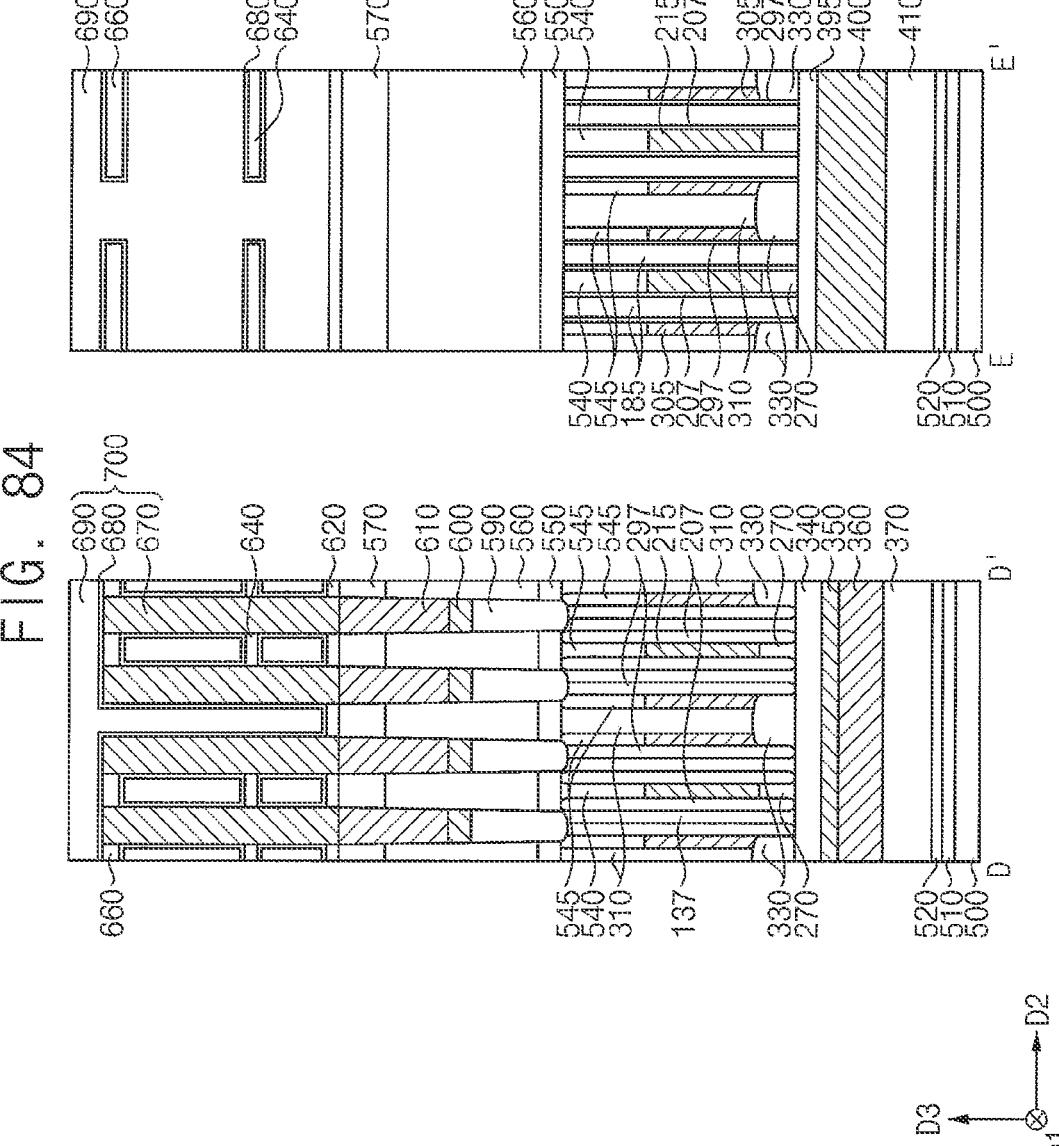
Figure 85:
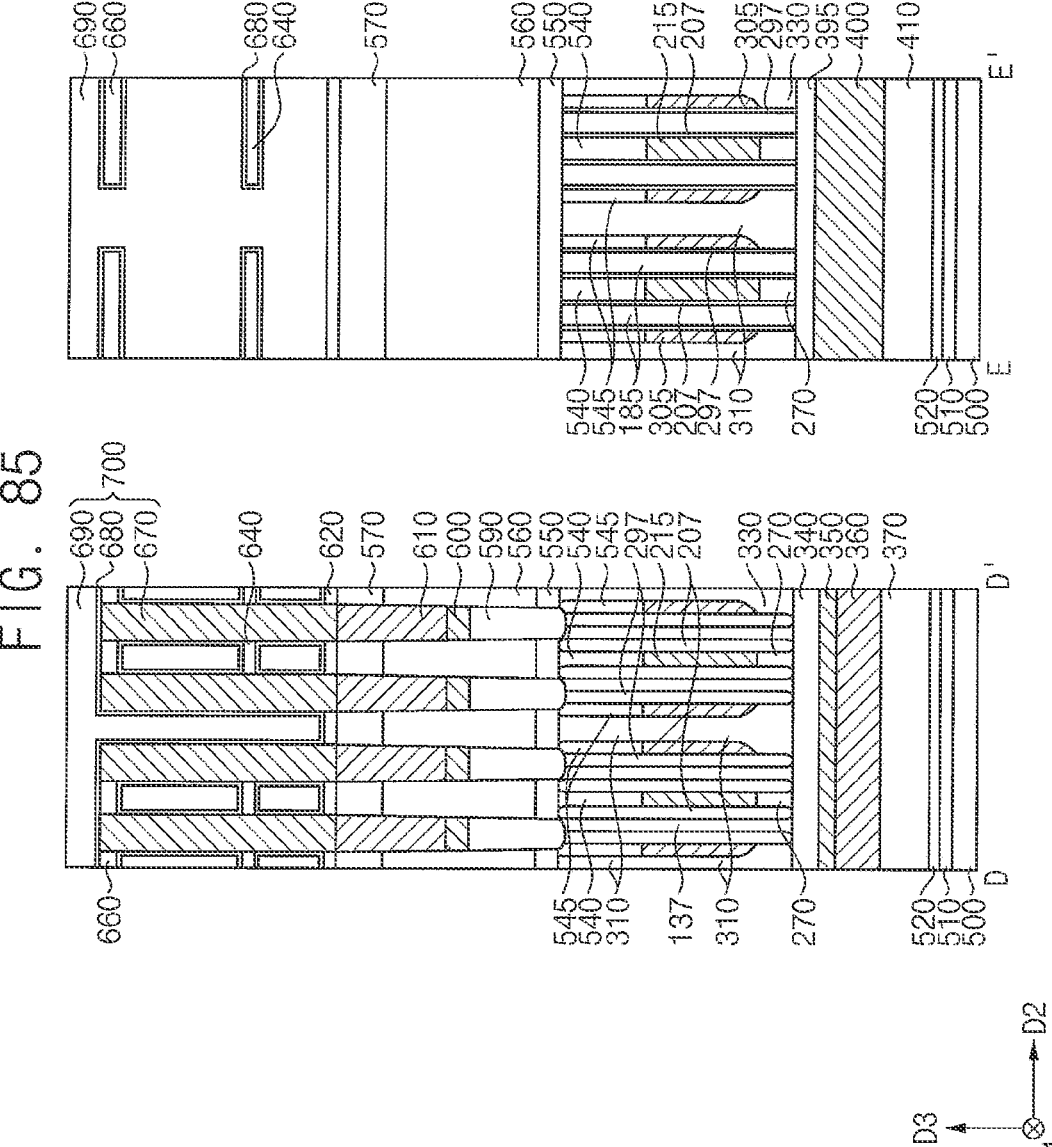

FIGS. 83 to 85 are cross-sectional views illustrating semiconductor devices in accordance with example embodiments, and may correspond to FIG. 4. These semiconductor devices may be substantially the same as or similar to that of FIGS. 1 to 4, except for the shape of the second gate electrode 305, and for convenience of description, repeated explanations are omitted herein.

Referring to FIG. 83, a lower surface of the second gate electrode 305 is not flat, but rather, is concave. Thus, a central portion of the lower surface of the second gate electrode 305 may be higher than an edge portion of the lower surface of the second gate electrode 305.

Referring to FIG. 84, a lower surface of the second gate electrode 305 is not flat, but rather, is concave.

Additionally, a height of the lower surface of the second gate electrode 305 may increase from the sidewall of the second gate insulation pattern 297 to the sidewall of the second insulating interlayer 310.

The fourth insulation pattern 330 may cover not only the lower surface of the second gate electrode 305, but also a lower surface of the second insulating interlayer 310.

Referring to FIG. 85, a height of a lower surface of the second gate electrode 305 may increase from the sidewall of the second gate insulation pattern 297 toward a central portion of the second insulating interlayer 310, and may have a rounded shape.

The second insulating interlayer 310 may contact a sidewall of the second gate electrode 305, and further cover a lower surface of the second gate electrode 305.

Figure 86:
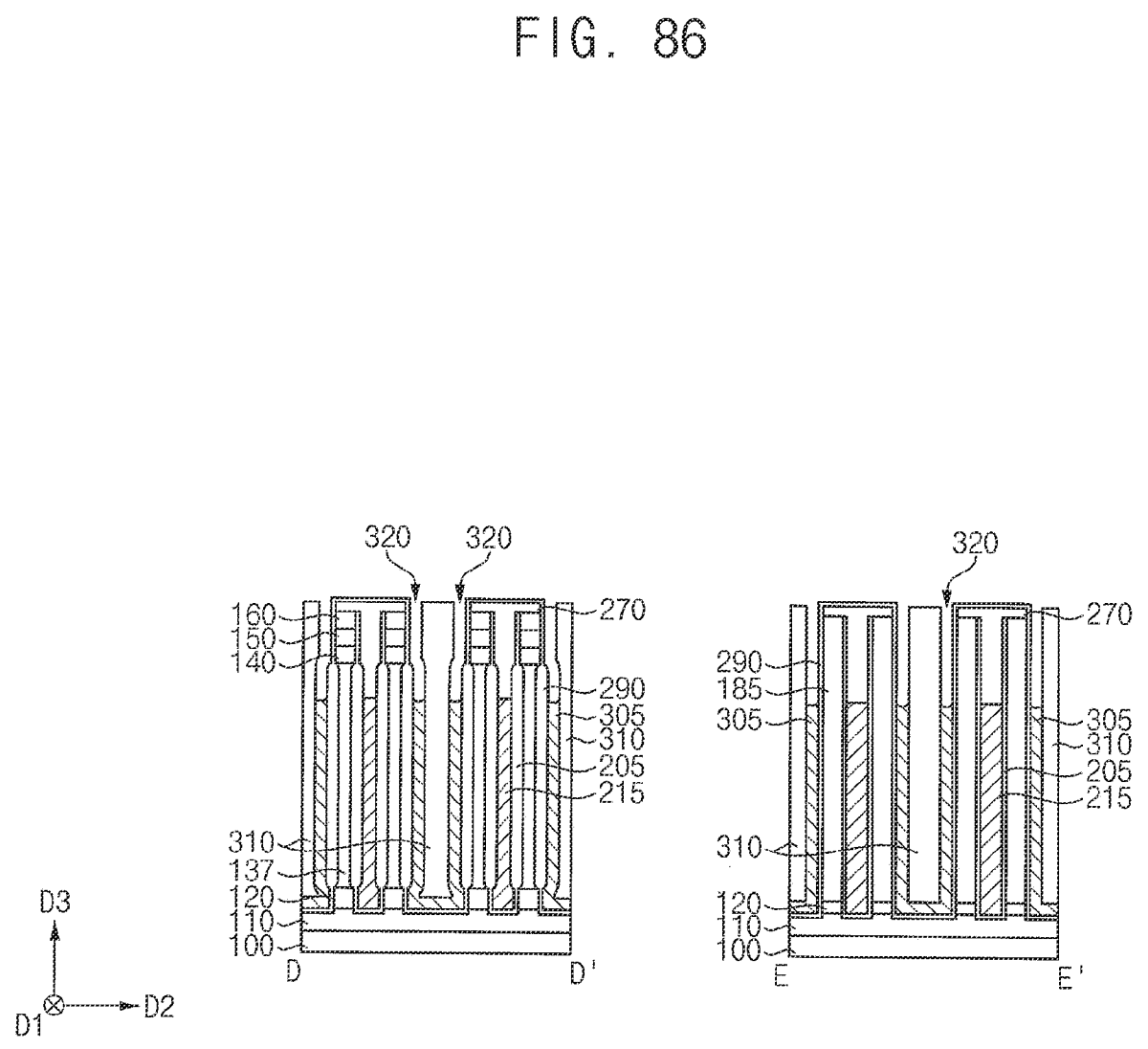
Figure 88:
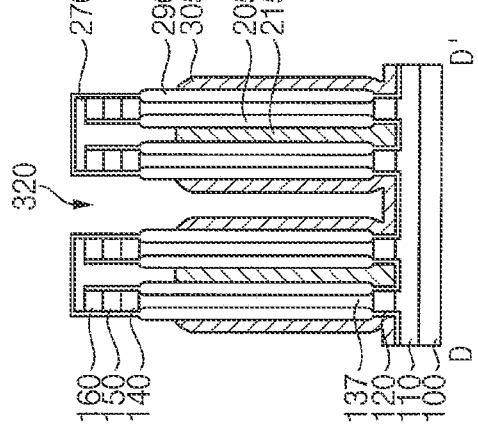

FIGS. 86 to 88 are cross-sectional views illustrating methods of manufacturing the semiconductor devices shown in FIGS. 83 to 85, respectively. These methods may include processes substantially the same as or similar to those referred to with reference to FIGS. 1 to 81, and for convenience of explanation, repeated explanations are omitted herein.

Referring to FIG. 86, processes substantially the same as or similar to those described with reference to FIGS. 45 and 46 may be performed so that an upper portion of the second gate electrode layer 300 may be removed by an etch back process to form the second gate electrode 305.

In an example embodiment, the upper portion of the second gate electrode layer 300 may be removed by a wet etching process, and an upper surface of the second gate electrode 305 after the wet etching process may be concave.

Referring to FIG. 87, processes substantially the same as or similar to those described with reference to FIGS. 45 and 46 may be performed so that an upper portion of the second gate electrode layer 300 may be removed by an etch back process to form the second gate electrode 305.

In an example embodiment, the upper portion of the second gate electrode layer 300 may be removed by a wet etching process, and an upper portion of the second insulating interlayer 310 may also be removed by the wet etching process. Thus, an upper surface of the second gate electrode after the wet etching process may be concave, and a height of the upper surface of the second gate electrode 305 may decrease from the sidewall of the second gate insulation layer 290 to the sidewall of the second insulating interlayer 310.

Referring to FIG. 88, processes substantially the same as or similar to those described with reference to FIGS. 43 and 44 may be performed so that the second gate electrode layer 300 may be formed on the second gate insulation layer 290. The second gate electrode layer 300 may be anisotropically etched.

Thus, the second gate electrode 305 may be formed on the sidewall of the second gate insulation layer 290, and an upper surface of the second gate electrode 305 may have a height gradually decreasing from the sidewall of the second gate insulation layer 290 and have a rounded shape.

The second insulating interlayer 310 may be formed on the second gate electrode 305 to fill a remaining portion of the fifth opening 280.

Figure 89:
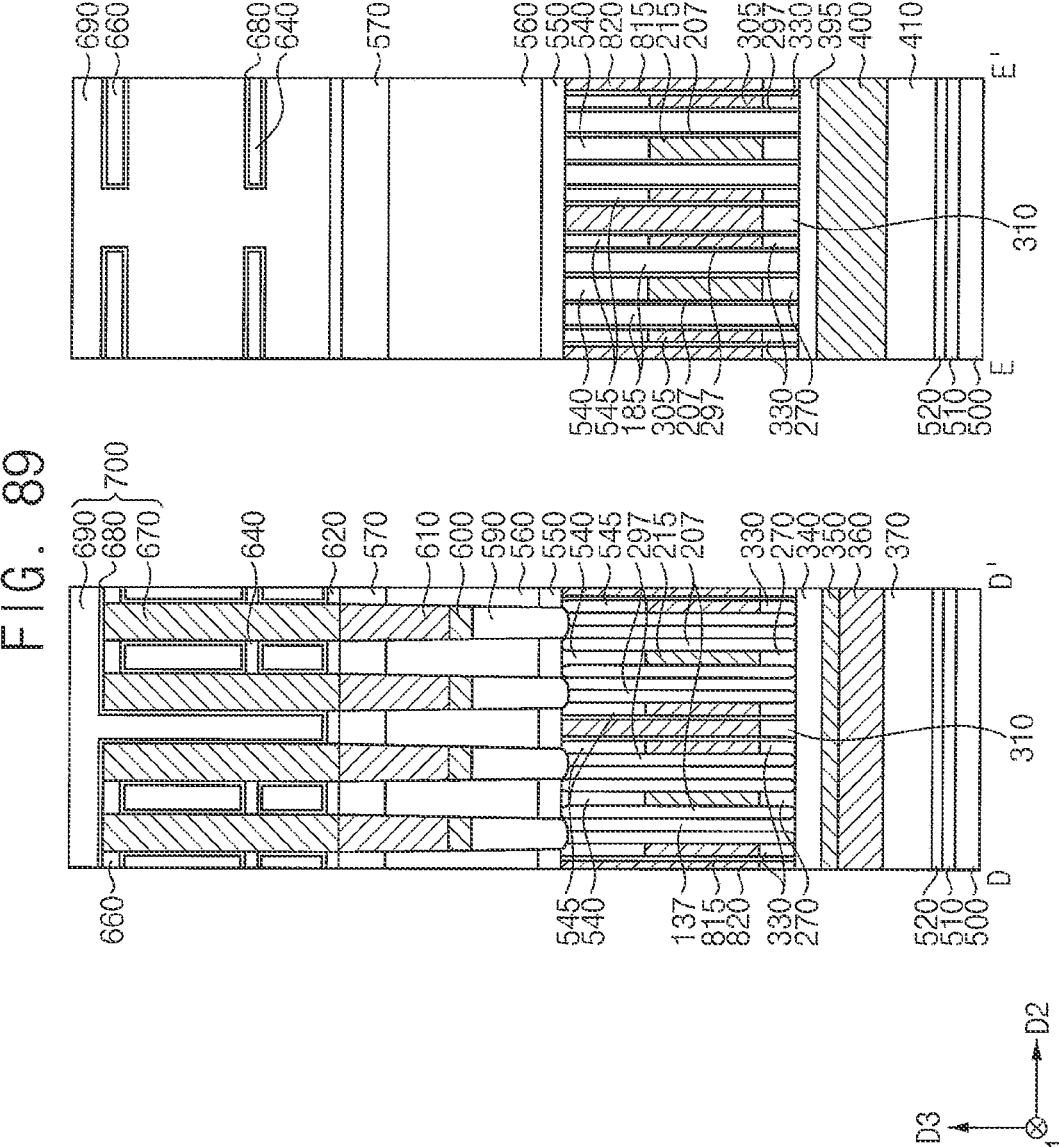
FIGS. 89 and 90 are cross-sectional views illustrating semiconductor devices in accordance with example embodiments.
Figure 90:
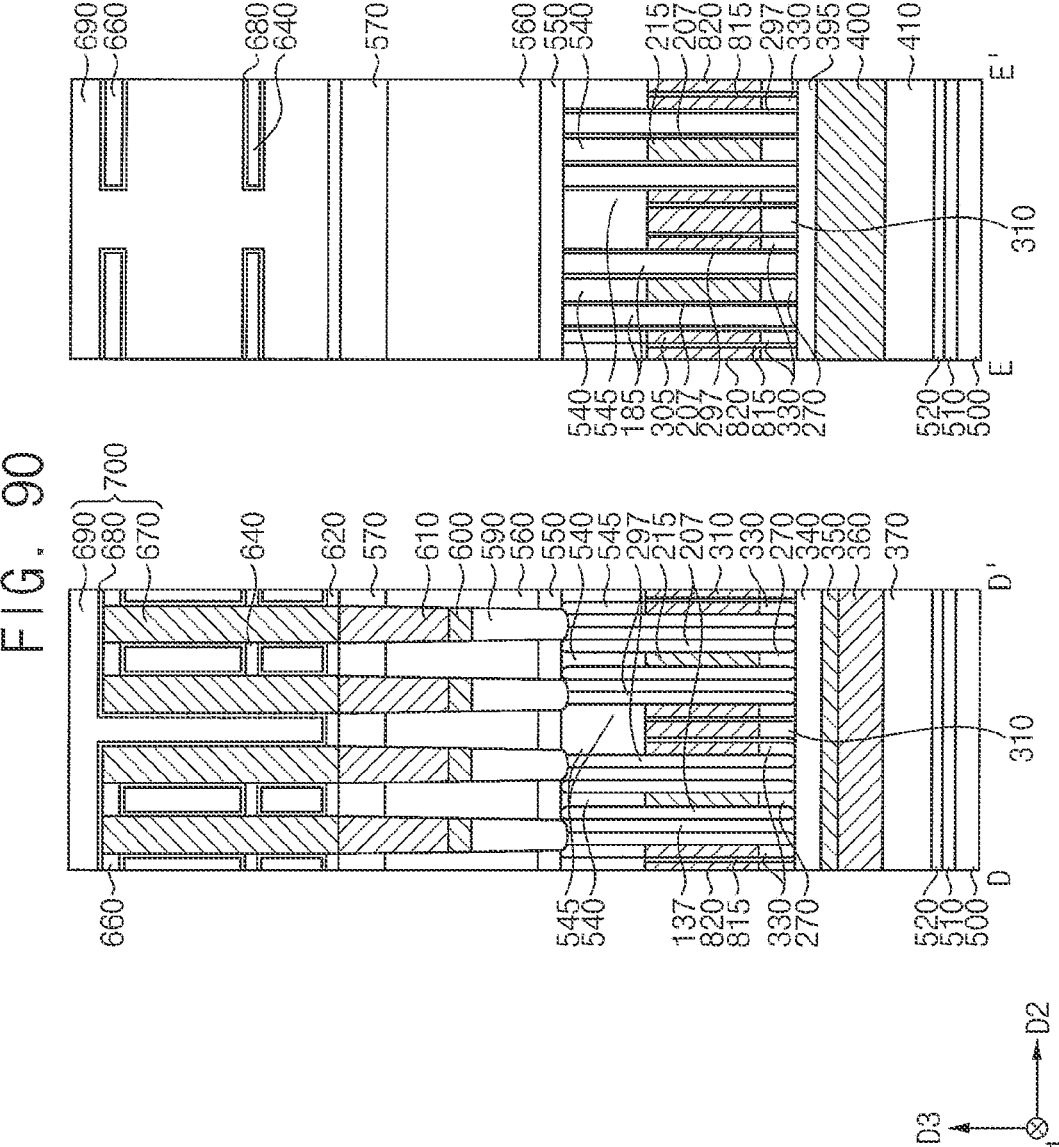

FIGS. 89 and 90 are cross-sectional views illustrating semiconductor devices in accordance with example embodiments, and may correspond to FIG. 4. These semiconductor devices may be substantially the same as or similar to that of FIGS. 1 to 4, except for further including a second shield pattern and a fourth spacer, and for convenience of description, repeated explanations are omitted herein.

Referring to FIG. 89, a fifth bar structure extending in the first direction D1 and including the second insulating interlayer 310 and a second shield pattern 820 may be formed between neighboring ones of fourth bar structures, each of which may extend in the first direction D1 and include the fourth insulation pattern 330, the second gate electrode 305 and the seventh insulation pattern 545, and a fourth spacer 815 may be formed on a sidewall of the fifth bar structure.

In example embodiments, the second shield pattern 820 may include a metal nitride, e.g., titanium nitride, tantalum nitride, etc., and the fourth spacer 815 may include an insulating nitride, e.g., silicon nitride or an oxide, e.g., silicon oxide.

Referring to FIG. 90, the fifth bar structure including second insulating interlayer 310 and the second shield pattern 820 may be formed between neighboring ones of sixth bar structures, each of which may extend in the first direction D1 and include the fourth insulation pattern 330 and the second gate electrode 305, and the fourth spacer 815 may be formed on the fifth bar structure.

Upper surfaces of the fifth and sixth bar structures may be substantially coplanar with each other, and the seventh insulation pattern 545 may commonly contact the upper surfaces of the fifth and sixth bar structures.

FIGS. 91 and 92 are cross-sectional views illustrating methods of manufacturing the semiconductor devices shown in FIGS. 89 and 90, respectively. These methods may include processes substantially the same as or similar to those described with reference to FIGS. 1 to 81, and for convenience of description, repeated explanations are omitted herein.

Referring to FIG. 91, processes substantially the same as or similar to those described with reference to FIGS. 43 and 44 may be performed so that the second gate electrode layer 300 may be formed on the second gate insulation layer 290, a fourth spacer layer 810 may be formed on the second gate electrode layer 300, a second shield layer may be formed to fill a remaining portion of the fifth opening 280, and an upper portion of the second shield layer may be removed by, e.g., an etch back process.

Thus, a second shield pattern 820 may be formed in a lower portion of the fifth opening 280, and the second insulating interlayer 310 may be formed on the second shield pattern 820 to fill an upper portion of the fifth opening 280.

Processes substantially the same as or similar to those described with reference to FIGS. 47 and 48 may be performed so that an upper portion of the preliminary first gate insulation pattern 205 may be removed by, e.g., a CMP process and that the fourth spacer layer 810 may be divided into fourth spacers 815.

Processes substantially the same as or similar to those described with reference to FIGS. 68 to 70 may be performed so that an upper portion of the second insulating interlayer 310 may be removed by, e.g., a CMP process and that a portion of the fourth spacer 815 disposed on an upper surface of the second shield pattern 820 may also be removed.

Referring to FIG. 92, processes substantially the same as or similar to those described with reference to FIG. 91 may be performed so that the second shield pattern 820 and the fourth spacer 815 may be formed.

Processes substantially the same as or similar to those described with reference to FIGS. 66 and 67 may be performed so that upper portions of the first and second gate electrodes 215 and 305 may be removed and that upper portions of the second shield pattern 820 and the fourth spacer 815 may also be removed.

Thus, the fourth recess 535 may be formed not only on the first and second gate electrodes 215 and 305, but also on the second shield pattern 820 and the fourth spacer 815. Accordingly, upper surfaces of the second shield pattern 820 and the fourth spacer 815 may be substantially coplanar with an upper surface of the second gate electrode 305.

Processes substantially the same as or similar to those described with reference to FIGS. 68 to 70 may be performed so that the seventh insulation pattern 545 may contact upper surfaces of the second shield pattern 820, the fourth spacer 815 and the second gate electrode 305.

FIG. 93 includes cross-sectional views illustrating heights of the first and second gate electrodes 215 and 305 included in the semiconductor device in accordance with example embodiments.

Referring again to FIG. 4, upper surfaces of the first and second gate electrodes 215 and 305 may be substantially coplanar with each other, and lower surfaces of the first and second gate electrodes 215 and 305 may be substantially coplanar with each other, however, embodiments of the present disclosure are not limited thereto.

Referring to FIG. 93, the lower surface of the first gate electrode 215 may be lower or higher than the lower surface of the second gate electrode 305, and the upper surface of the first gate electrode 215 may be lower or higher than the upper surface of the second gate electrode 305. Accordingly, lengths in the third direction D3 of the first and second gate electrodes 215 and 305 may be different from each other.

When processes substantially the same as or similar to those described with reference to FIGS. 45 and 46 are performed so that the upper portion of the second gate electrode layer 300 is removed to form the second recess 320, or when processes substantially the same as or similar to those described with reference to FIGS. 66 and 67 are performed so that the upper portions of the first and second gate electrodes 215 and 305 are removed to form the third and fourth recesses 530 and 535, the etching processes may be adjusted so as to implement the above structures.

FIGS. 94 to 99 are cross-sectional views illustrating semiconductor devices in accordance with example embodiments, and may correspond to FIG. 4. These semiconductor devices may be substantially the same as or similar to those of FIGS. 1 to 4, except for further including a third gate electrode, and for convenience of description, repeated explanations are omitted herein.

Figure 94:
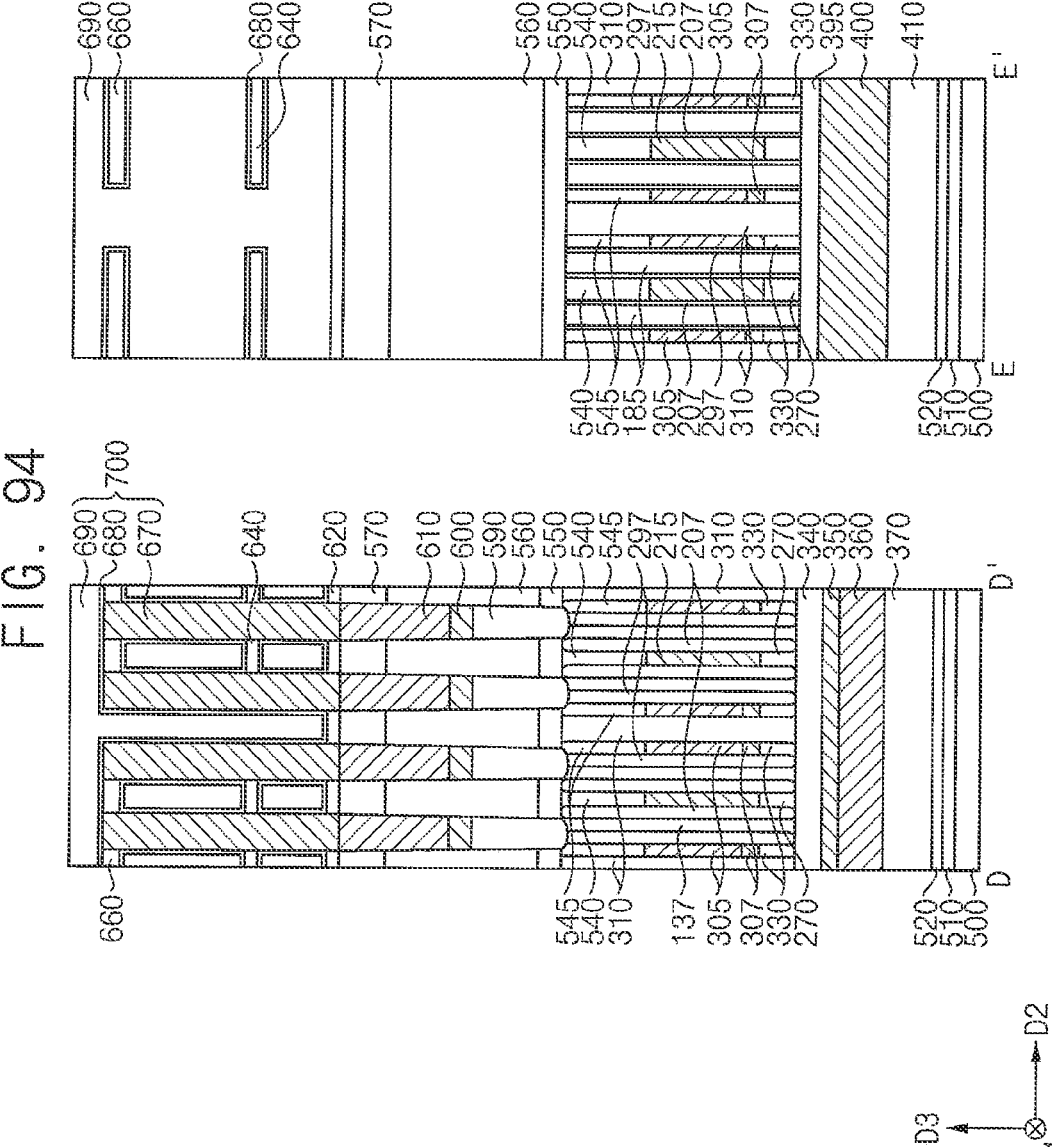
FIGS. 94 to 99 are cross-sectional views illustrating semiconductor devices in accordance with example embodiments.

Referring to FIG. 94, a third gate electrode 307 may be formed beneath and contacting the second gate electrode 305, and a lower surface of the third gate electrode 307 may be covered by the fourth insulation pattern 330. The third gate electrode 307 may be referred to as an additional word line.

In example embodiments, the third gate electrode 307 may include, for example, a metal, a metal nitride, a metal silicide, etc., and may include a metal having a work function different from a work function of the metal included in the second electrode 305.

Figure 95:
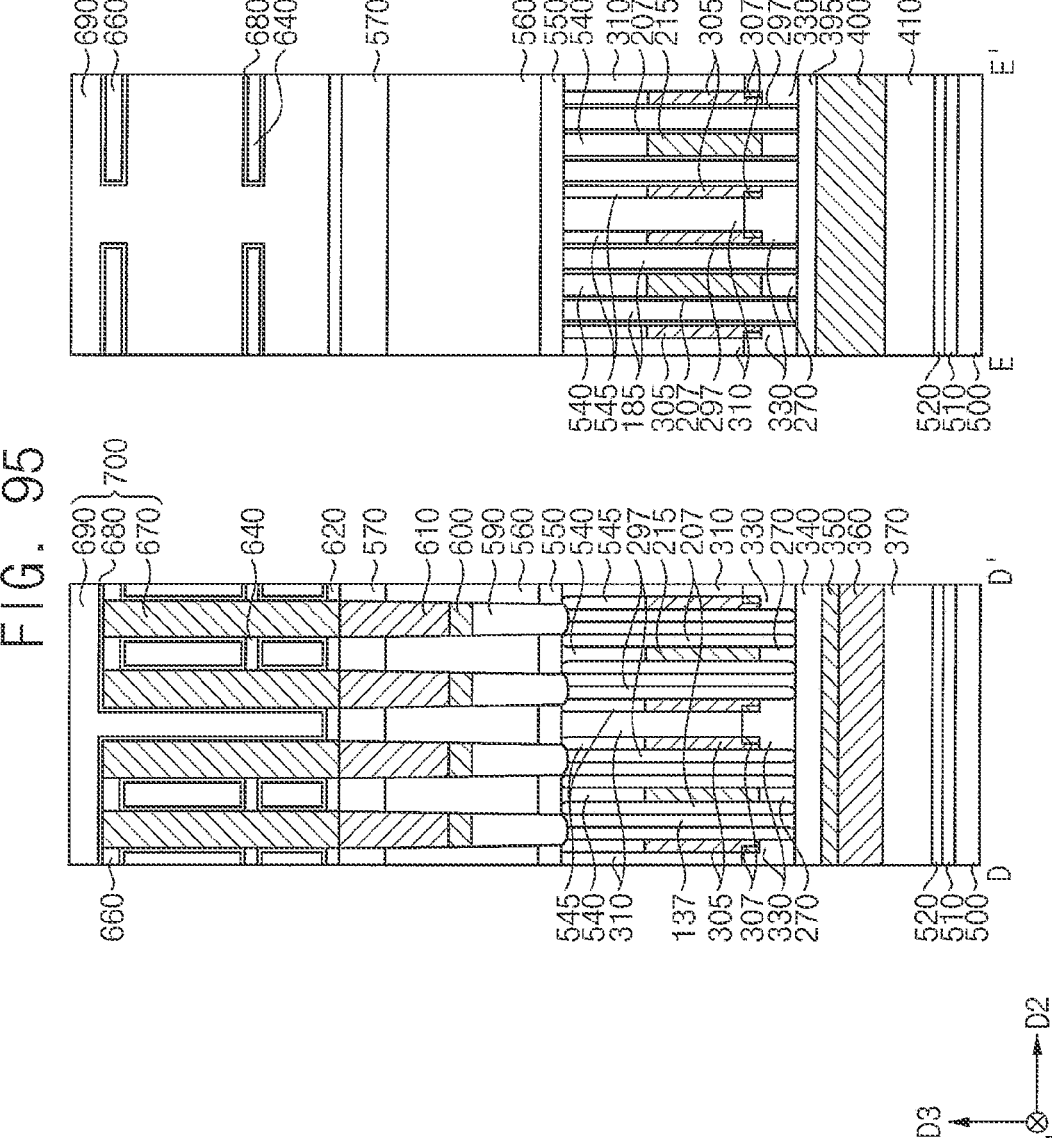

Referring to FIG. 95, the second gate electrode 305 may include an upper portion having a relatively large width and a lower portion having a relatively small width, and the third gate electrode 307 contacting a lower surface of the upper portion of the second gate electrode 305 and a sidewall of the lower portion of the second gate electrode 305 may be further formed.

A sidewall and a lower surface of the third gate electrode 307 may be covered by the fourth insulation pattern 330.

Figure 96:
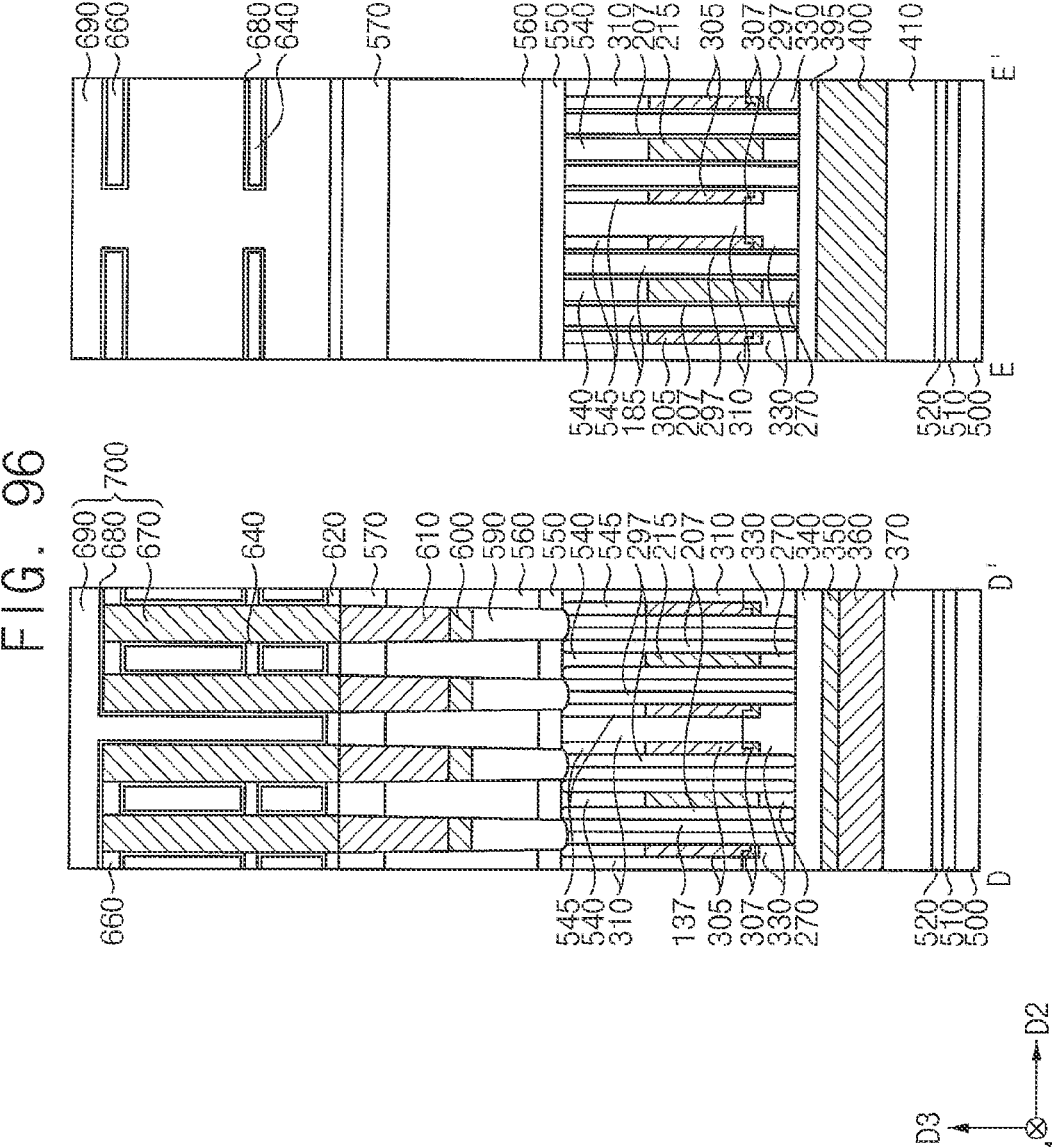

Referring to FIG. 96, unlike the third gate electrode 307 shown in FIG. 95, the third gate electrode 307 may also contact a lower surface of the lower portion of the second gate electrode 305, and thus may have a shape of an "L."

Figure 97:
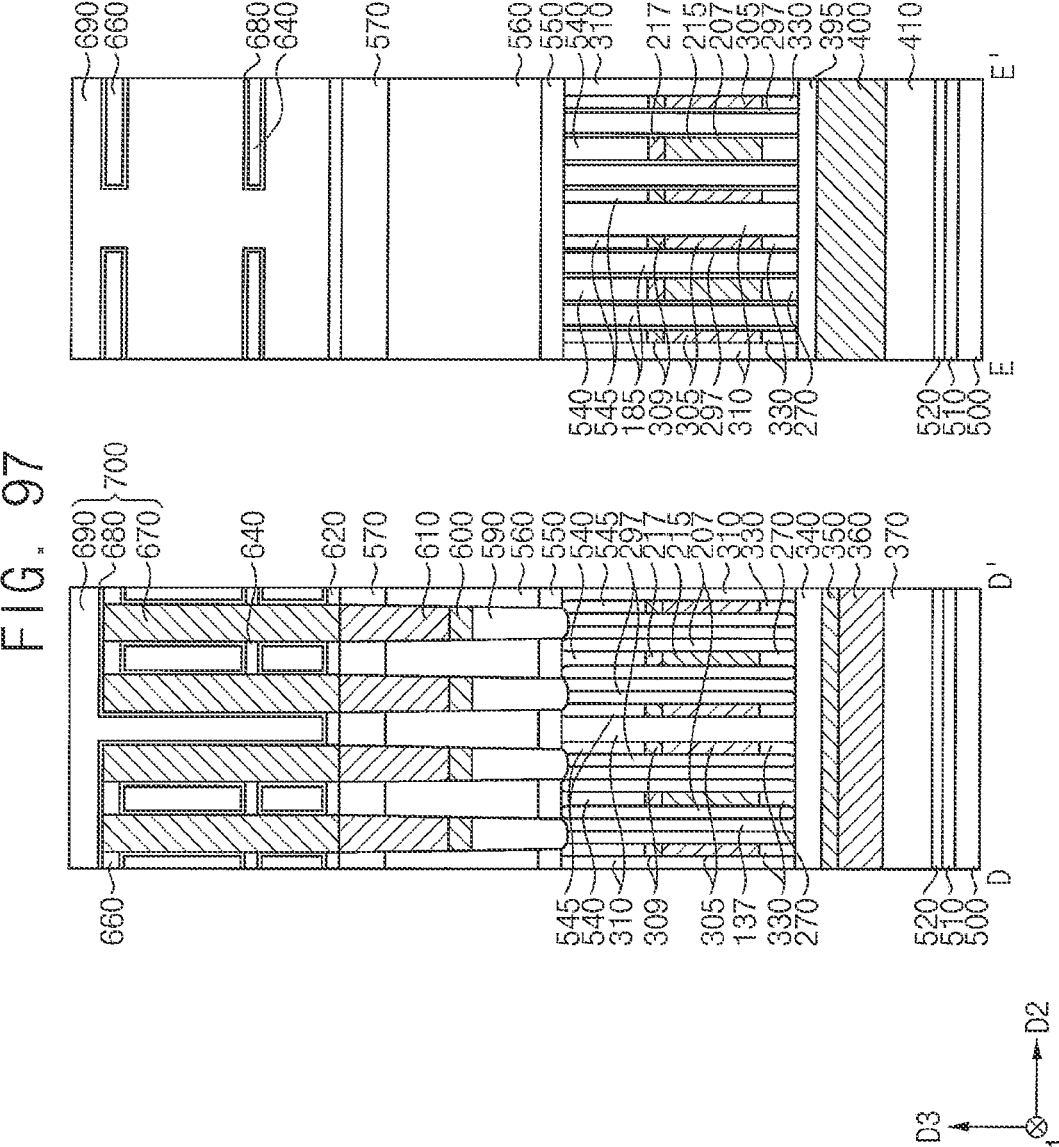

Referring to FIG. 97, fourth and fifth gate electrodes 217 and 309 may be further formed on and contact the first and second gate electrodes 215 and 305, respectively, and upper surfaces of the fourth and fifth gate electrodes 217 and 309 may be covered by the sixth and seventh insulation patterns 540 and 545, respectively.

In example embodiments, the fourth and fifth gate electrodes 217 and 309 may include, e.g., a metal, a metal nitride, a metal silicide, etc., and may include a metal having a work function different from a work function of the metal included in the second gate electrode 305. The fourth and fifth gate electrodes 217 and 309 may include substantially the same material or different materials.

Figure 98:
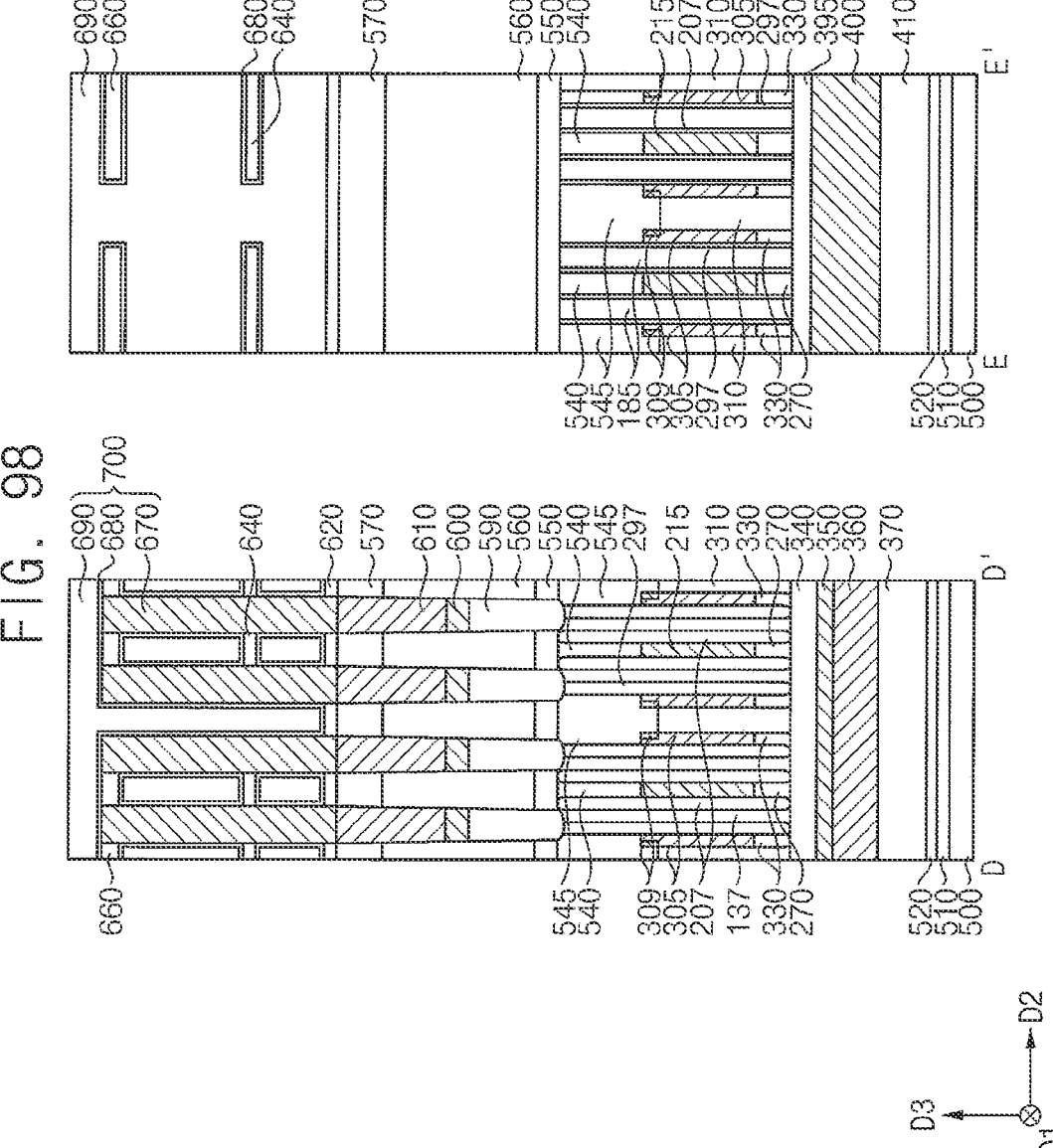

Referring to FIG. 98, the second gate electrode 305 may include a lower portion having a relatively large width and an upper portion having a relatively small width, and the fifth gate electrode 309 contacting an upper surface of the lower portion of the second gate electrode 305 and a sidewall of the upper portion of the second gate electrode 305 may be further formed.

A sidewall and an upper surface of the fifth gate electrode 309 may be covered by the seventh insulation pattern 545.

Figure 99:
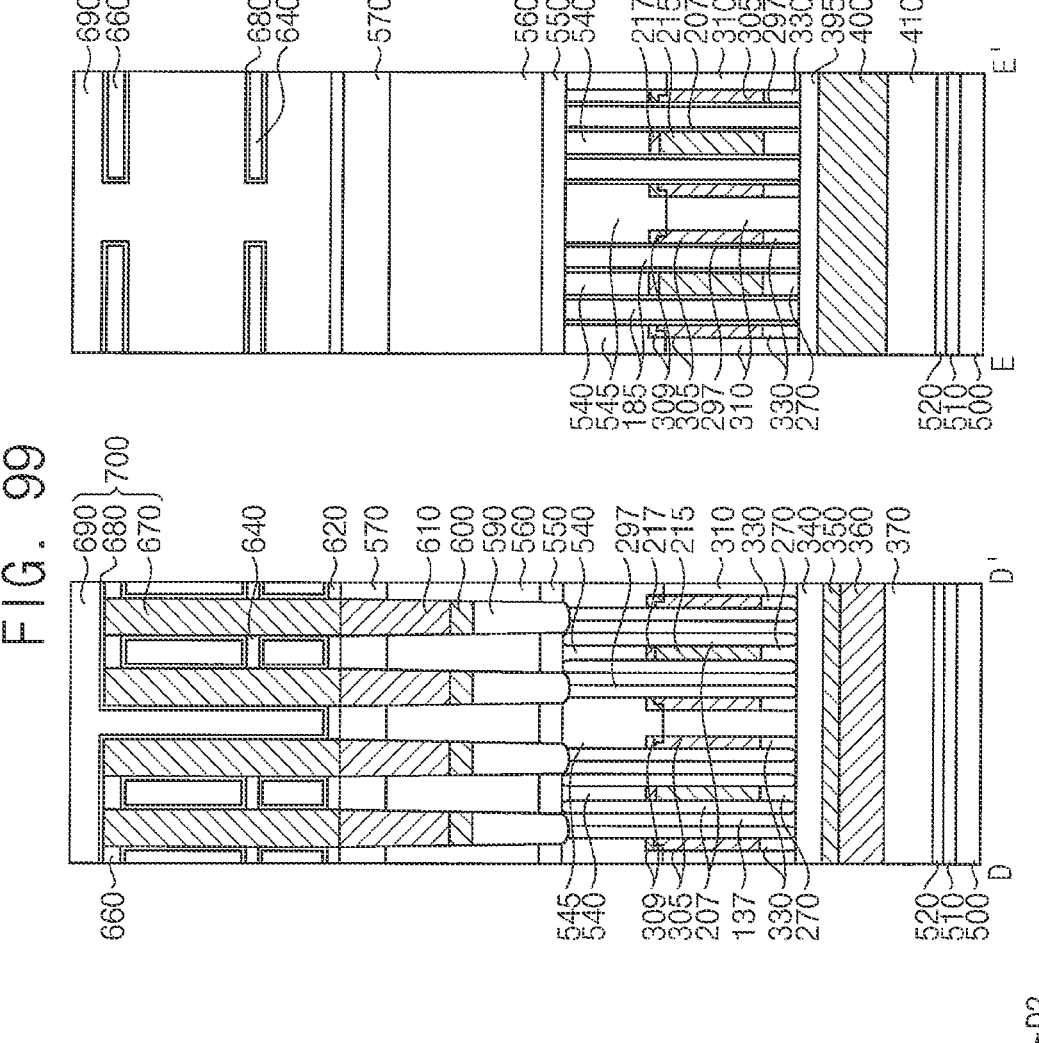

Referring to FIG. 99, the fifth gate electrode 309 may also contact an upper surface of the upper portion of the second gate electrode 305.

In some embodiments, the fourth gate electrode 217 may be further formed on the upper surface of the first gate electrode 215.

FIGS. 100, 101, 102 and 103 are cross-sectional views illustrating methods of manufacturing the semiconductor devices of FIGS. 94, 95, 97 and 98, respectively. These methods may include processes substantially the same as or similar to those described with reference to FIGS. 1 to 81, and thus, for convenience of description, repeated explanations are omitted herein.

Referring to FIG. 100, processes substantially the same as or similar to those described with reference to FIGS. 45 and 46 may be performed so that the upper portion of the second gate electrode layer 300 may be removed to form the second recess 320 and the second gate electrode 305, and a third gate electrode 307 may be further formed on the second gate electrode 305 to fill a lower portion of the second recess 320.

In an example embodiment, the upper surface of the second gate electrode 305 may be lower than the upper surface of the first gate electrode 215, and an upper surface of the third gate electrode 307 may be substantially coplanar with the upper surface of the first gate electrode 215. However, embodiments of the present disclosure are not limited thereto.

Referring to FIG. 101, processes substantially the same as or similar to those described with reference to FIGS. 45 and 46 may be performed so that the upper portion of the second gate electrode layer 300 may be removed to form the second recess 320 and the second gate electrode 305, and an upper portion of the second insulating interlayer 310 may be further removed by an etching process.

In an example embodiment, an upper surface of the second insulating interlayer 310 after the etching process may be lower than an uppermost surface of the second gate electrode 305, and an upper portion of the second gate electrode 305 adjacent to the second insulating interlayer 310 may also be removed to form a fifth recess during the etching process.

A third gate electrode layer may be formed on the second insulating interlayer 310, the second gate electrode 305 and the second gate insulation layer 290 to fill the fifth recess, and may be anisotropically etched to form the third gate electrode 307 in the fifth recess.

The semiconductor device shown in FIG. 96 may be formed by performing a dry etching process on the third gate electrode layer so that the third gate electrode 307 may also remain on the upper surface of the second gate electrode 305.

Referring to FIG. 102, processes substantially the same as or similar to those described with reference to FIGS. 66 and 67 may be performed so that the upper portions of the first and second gate electrodes 215 and 305 may be removed to form the third and fourth recesses, respectively, and fourth and fifth gate electrodes 217 and 309 may be further formed on the first and second gate electrodes 215 and 305 to fill lower portions of the third and fourth recesses 530 and 535, respectively.

Referring to FIG. 103, processes substantially the same as or similar to those described with reference to FIGS. 66 and 67 may be performed so that the upper portions of the first and second gate electrodes 215 and 305 may be removed to form the third and fourth recesses, respectively, and an upper portion of the second insulating interlayer 310 may be further removed by an etching process.

In an example embodiment, an upper surface of the second insulating interlayer 310 after the wet etching process may be lower than an uppermost surface of the second gate electrode 305, and an upper portion of the second gate electrode 305 adjacent to the second insulating interlayer 310 may also be removed to form a sixth recess.

A fifth gate electrode layer may be formed on the second insulating interlayer 310, the first and second gate electrodes 215 and 305, the first and second gate insulation patterns 207 and 297 and the second insulation layer 120 to fill the sixth recess, and may be anisotropically etched to form a fifth gate electrode 309 in the sixth recess.

The semiconductor device shown in FIG. 99 may be formed by performing a dry etching process on the fifth gate electrode layer so that the fifth gate electrode 309 may also remain on the upper surface of the second gate electrode 305, and a fourth gate electrode 217 may also be formed on the upper surface of the first gate electrode 215.

Figure 104:
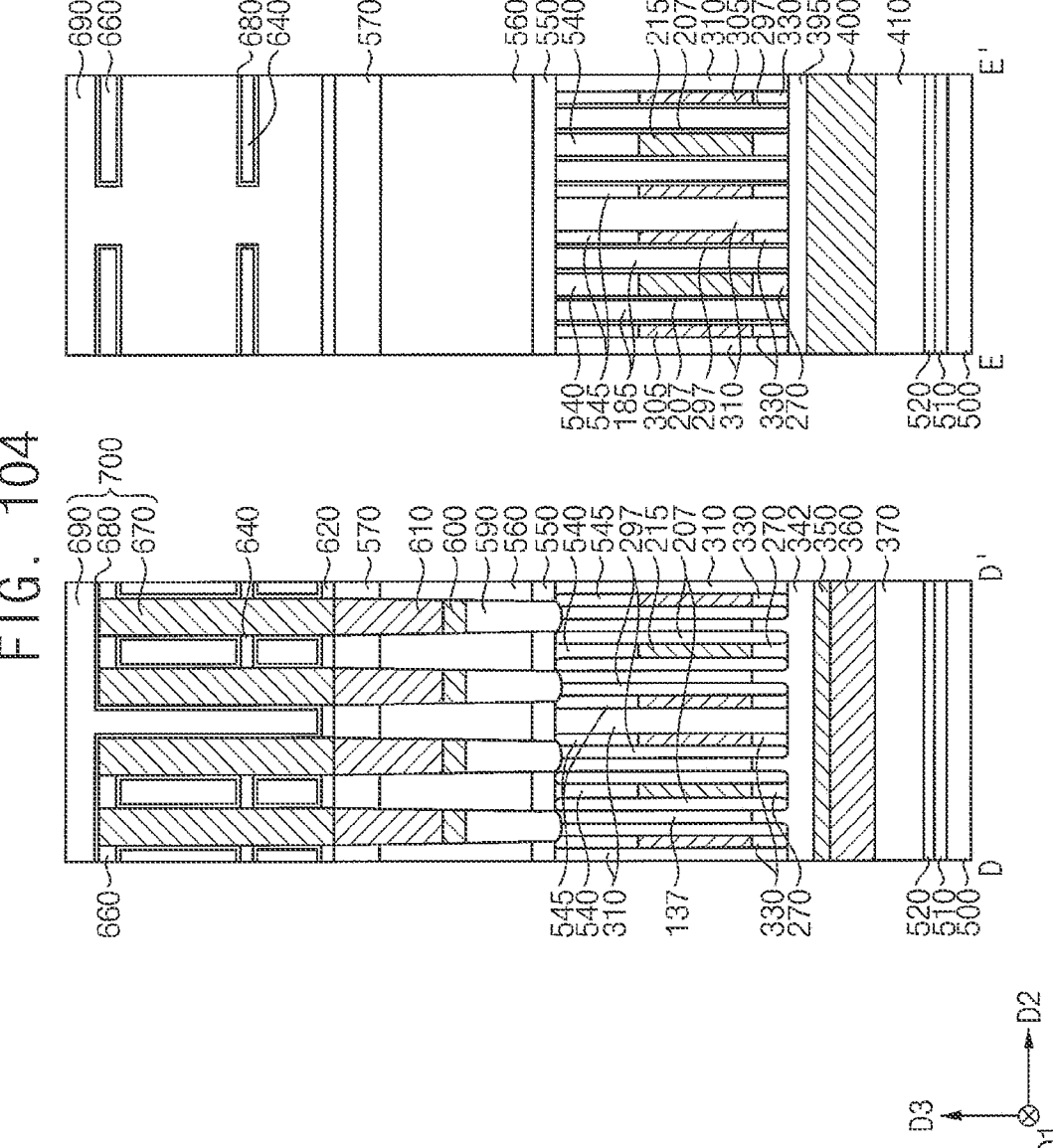
FIGS. 104 to 106 are cross-sectional views illustrating semiconductor devices in accordance with example embodiments.
Figure 105:
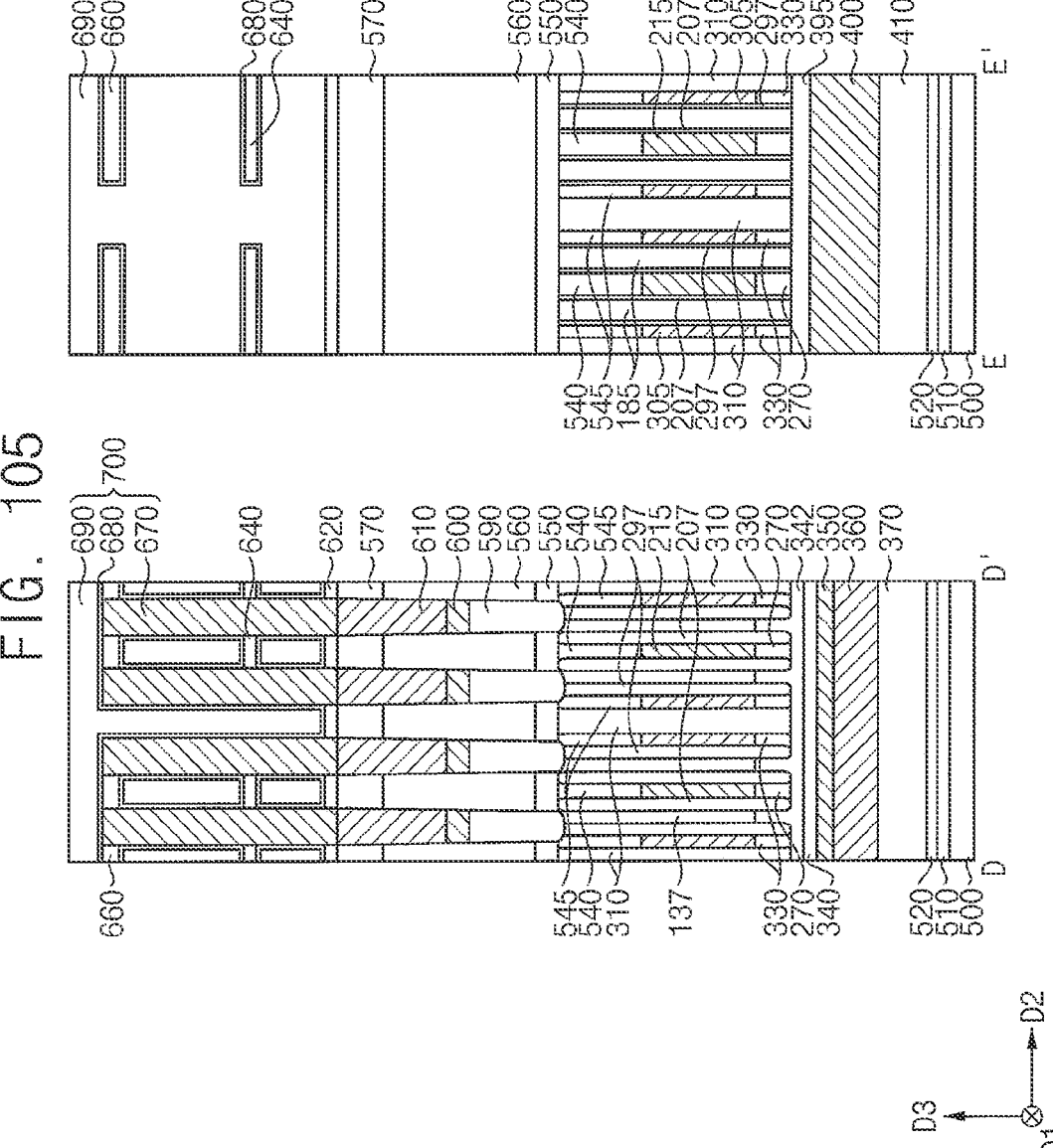
Figure 106:
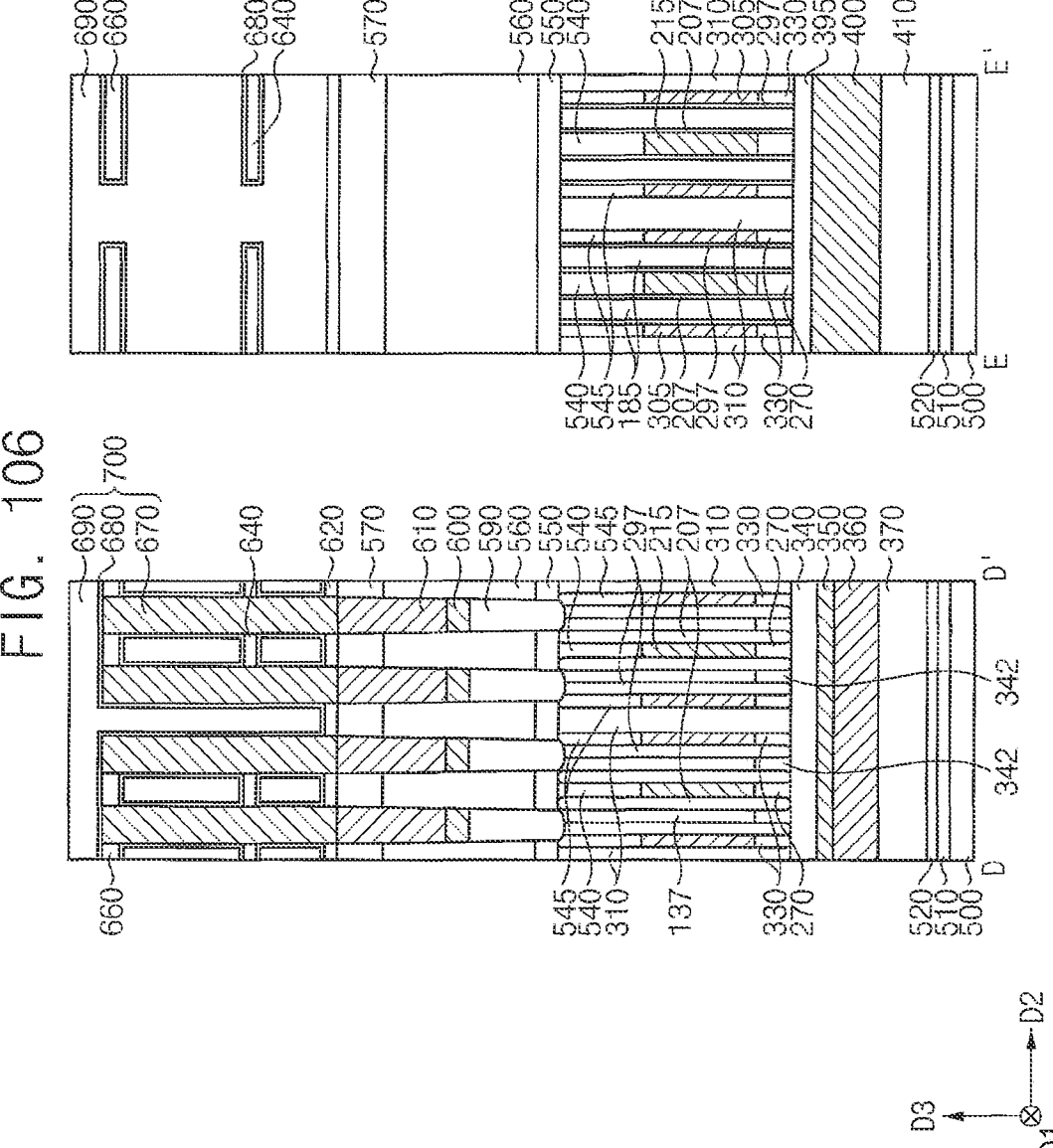

FIGS. 104 to 106 are cross-sectional views illustrating semiconductor devices in accordance with example embodiments, and may correspond to FIG. 4. These semiconductor devices may be substantially the same as or similar to that of FIGS. 1 to 4, except for further including a third conductive pattern, and for convenience of description, repeated explanations are omitted herein.

Referring to FIG. 104, unlike FIG. 4, the bit line structure may include the second conductive pattern 360, the barrier pattern 350 and a third conductive pattern 342 sequentially stacked, and the third conductive pattern 342 may include a lower portion extending in the second direction D2 and an upper portion extending in the first direction D1.

In example embodiments, the third conductive pattern 342 may include silicon-germanium doped with n-type or p-type impurities. The lower portion of the third conductive pattern 342 may contact the barrier pattern 350, and the upper portion of the third conductive pattern 342 may contact the semiconductor pattern 137.

For example, if the semiconductor pattern 137 includes single crystalline silicon or polysilicon undoped or doped with p-type impurities, and the third conductive pattern 342 includes silicon-germanium doped with n-type impurities, a heterojunction may be formed between the semiconductor pattern 137 and the third conductive pattern 342.

Referring to FIG. 105, the bit line structure may further include the third conductive pattern 342 in addition to the second conductive pattern 360, the barrier pattern 350 and the first conductive pattern 340, and the third conductive pattern 342 may contact an upper surface of the first conductive pattern 340 and a lower surface of the semiconductor pattern 137.

Referring to FIG. 106, unlike FIG. 105, according to example embodiments, the third conductive pattern 342 included in the bit line structure does not include the lower portion extending in the second direction D2, but rather, includes only the upper portion contacting a lower surface of the semiconductor pattern 137.

Figure 107:
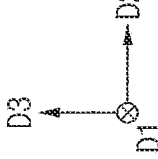
FIG. 107 is a cross-sectional view illustrating a method of manufacturing the semiconductor device shown in FIG. 104 according to example embodiments.

FIG. 107 is a cross-sectional view illustrating a method of manufacturing the semiconductor device shown in FIG. 104. This method may include processes substantially the same as or similar to those described with reference to FIGS. 1 to 81, and thus, for convenience of description, repeated explanations are omitted herein.

Referring to FIG. 107, processes substantially the same as or similar to those described with reference to FIGS. 49 to 51 may be performed to expose the upper surface of the semiconductor pattern 137, and the exposed upper portion of the semiconductor pattern 137 may be removed by an etching process to form a seventh recess.

Processes substantially the same as or similar to those described with reference to FIGS. 52 to 54 may be performed so that a third conductive layer may be formed on the semiconductor pattern 137, the first insulating interlayer pattern 185, the second insulating interlayer 310, the third insulation layer 270, the fourth insulation pattern 330 and the preliminary first and second gate insulation patterns 205 and 295 to fill the seventh recess, the barrier layer, the second conductive layer and the mask layer may be sequentially stacked on the third conductive layer, and a dry etching process may be performed on the mask layer, the second conductive layer, the barrier layer and the third conductive layer to form the bit line structure including the third conductive pattern 342, the barrier pattern 350, the second conductive pattern 360 and the fourth mask 370 sequentially stacked.

The semiconductor device shown in FIG. 105 may be formed by sequentially stacking the first conductive layer, the barrier layer, the second conductive layer and the mask layer on the third conductive layer.

The semiconductor device shown in FIG. 106 may be formed by planarizing an upper portion of the third conductive layer until an upper surface of the second insulating interlayer 310 is exposed to form the third conductive pattern 342 in the seventh recess, and sequentially stacking the first conductive layer, the barrier layer, the second conductive layer and the mask layer on the semiconductor pattern 137, the first insulating interlayer pattern 185, the second insulating interlayer 310, the third insulation layer 270, the fourth insulation pattern 330, the preliminary first and second gate insulation patterns 205 and 295, and the third conductive pattern 342.

FIG. 108 is a cross-sectional view illustrating a semiconductor device in accordance with example embodiments, and may correspond to FIG. 4. This semiconductor device may be substantially the same as or similar to that of FIGS. 1 to 4, except for including an air gap instead of the first shield pattern, and for convenience of description, repeated explanations are omitted herein.

Referring to FIG. 108, unlike FIG. 3, an air gap 830 may be formed instead of the first shield pattern 400 between neighboring ones of the bit line structures in the second direction D2.

A top and a sidewall of the air gap 830 may be covered by the third spacer 395, and a bottom of the air gap 830 may be covered by the fifth insulation pattern 410.

FIG. 109 includes cross-sectional views illustrating heights of the second conductive pattern 360 and the first shield pattern 400 included in the semiconductor device in accordance with example embodiments.

Referring again to FIG. 3, an upper surface of the second conductive pattern 360 may be lower than an upper surface of the first shield pattern 400 between neighboring ones of the bit line structures, and a lower surface of the second conductive pattern 360 may be substantially coplanar with a lower surface of the first shield pattern 400. However, embodiments of the present disclosure are not limited thereto.

Referring to FIG. 109, the upper surface of the second conductive pattern 360 may be lower than or substantially coplanar with the upper surface of the first shield pattern 400, and the lower surface of the second conductive pattern 360 may be lower or higher than the lower surface of the first shield pattern 400. Accordingly, a length in the third direction D3 of the second conductive pattern 360 may be substantially the same as or different from a length in the third direction D3 of the first shield pattern 400.

When processes substantially the same as or similar to those described with reference to FIGS. 55 and 56 are performed so that the third spacer layer 390 is formed, the first shield layer is formed on the third spacer layer 390 to fill the sixth opening 380, and the upper portion of the first shield layer is removed, a thickness of the third spacer layer 390 or a process time for removing the upper portion of the first shield layer may be adjusted so that the above structure may be formed.

Figure 110:
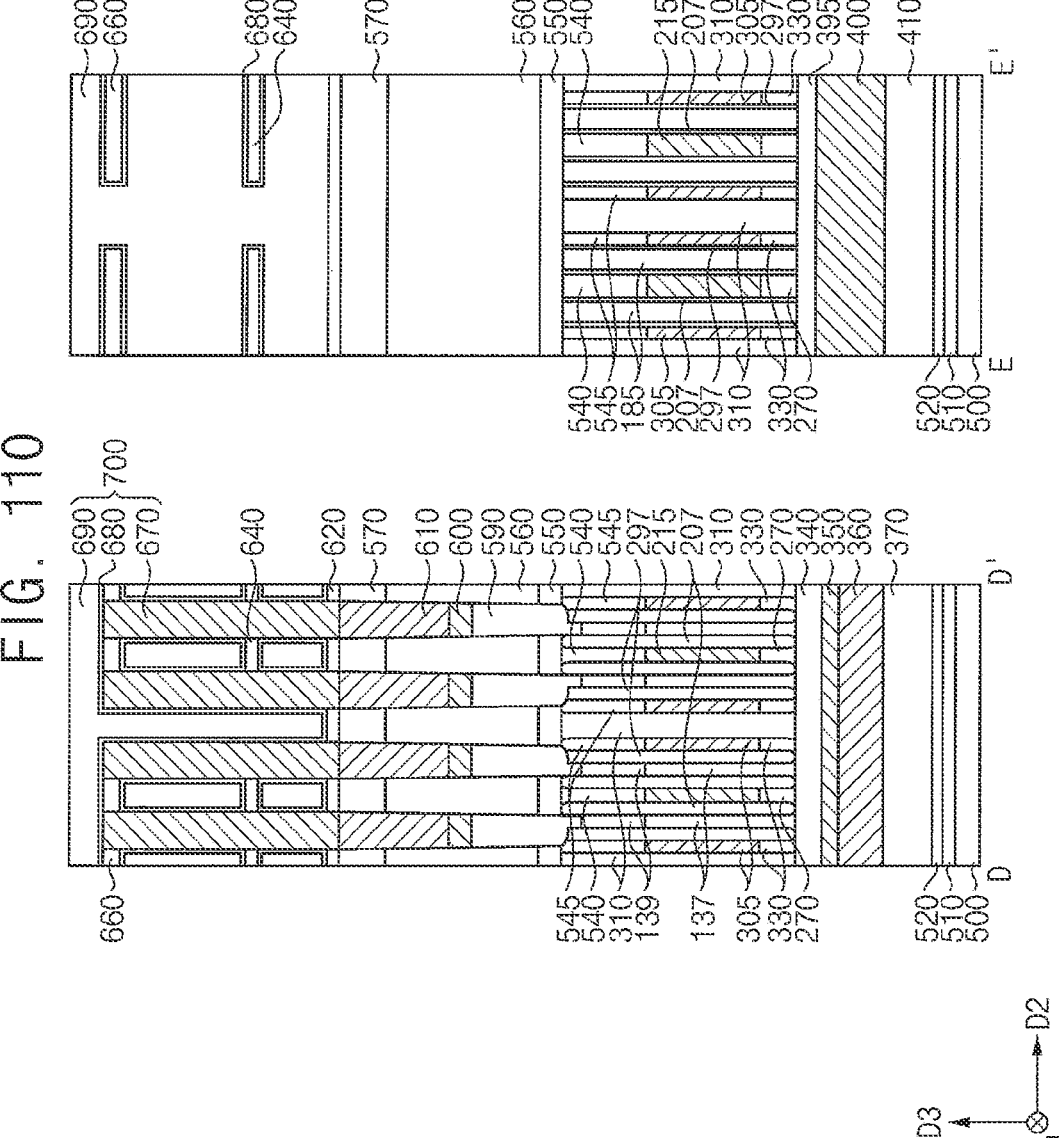
FIG. 110 is a cross-sectional view illustrating a semiconductor device in accordance with example embodiments.

FIG. 110 is a cross-sectional view illustrating a semiconductor device in accordance with example embodiments, and may correspond to FIG. 4. FIG. 111 is a cross-sectional view illustrating a method of manufacturing the semiconductor device of FIG. 110.

This semiconductor device may be substantially the same as or similar to that of FIGS. 1 to 4, except for further including a first bonding pattern, and for convenience of description, repeated explanations are omitted herein.

Referring to FIG. 110, a first bonding pattern 139 may be formed between the semiconductor pattern 137 and the lower contact plug 590.

In example embodiments, the first bonding pattern 139 may include single crystalline silicon or polysilicon lightly doped with n-type or p-type impurities. A lower surface of the first bonding pattern 139 may be substantially coplanar with the upper surfaces of the first and second gate electrodes 215 and 305. Alternatively, the lower surface of the first bonding pattern 139 may be lower or higher than the upper surfaces of the first and second gate electrodes 215 and 305.

The lower contact plug 590 may include an upper portion having a relatively large width, and a lower portion having a relatively small width and contacting an upper surface of the first bonding pattern 139. The lower contact plug 590 may be highly doped with n-type or p-type impurities when compared to the first bonding pattern 139, and the impurities doped in the lower contact plug 590 may diffuse into an upper portion of the first bonding pattern 139 to form the lower portion of the lower contact plug 590 during the formation of the lower contact plug 590 or a subsequent heat treatment process.

For example, referring to FIG. 111, processes substantially the same as or similar to those described with reference to FIGS. 68 to 70 may be performed to expose the upper surface of the semiconductor pattern 137, and n-type or p-type impurities may be doped into the semiconductor pattern 137 through the exposed upper surface of the semiconductor pattern 137 to form a first bonding pattern 139.

When processes substantially the same as or similar to those described with reference to FIGS. 71 to 73 are performed so that the lower contact plug 590 is formed during a subsequent heat treatment process, n-type or p-type impurities included in the lower contact plug 590 may diffuse into an upper portion of the first bonding pattern 139, and thus, the lower portion of the lower contact plug 590 including a highly doped impurities may be formed.

Figure 112:
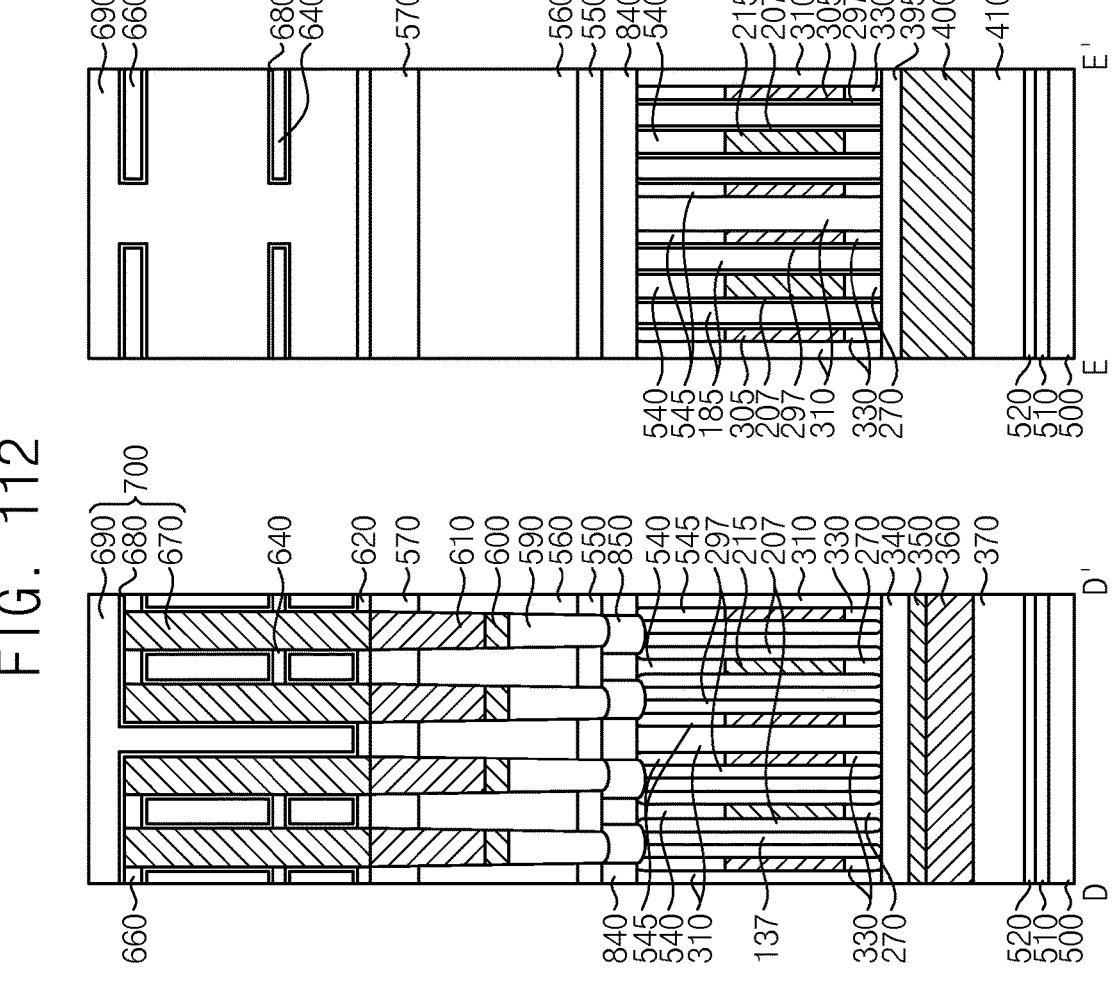

FIGS. 112 and 113 are cross-sectional views illustrating semiconductor devices in accordance with example embodiments, and may correspond to FIG. 4. These semiconductor devices may be substantially the same as or similar to that of FIGS. 1 to 4, except for further including a second bonding pattern and a fourth insulating interlayer, and for convenience of description, repeated explanations are omitted herein.

Referring to FIG. 112, a second bonding pattern 850 may be formed between the semiconductor pattern 137 and the lower contact plug 590, and a sidewall of the second bonding pattern 850 may be covered by a fourth insulating interlayer 840.

The second bonding pattern 850 may contact the upper surface of the semiconductor pattern 137, and may also contact upper surfaces of the first and second gate insulation patterns 207 and 297 and the seventh insulation pattern 545. In an example embodiment, a lower surface of the second bonding pattern 850 may be lower than the upper surface of the second insulating interlayer 310.

The second bonding pattern 850 may include polysilicon doped with n-type or p-type impurities, and a concentration of the impurities may be equal to or lower than that of the impurities doped in the lower contact plug 590. The fourth insulating interlayer 840 may include an insulating nitride, e.g., silicon nitride or an oxide, e.g., silicon oxide.

Referring to FIG. 113, the second bonding pattern 850 may be formed between the semiconductor pattern 137 and the lower contact plug 590, and the sidewall of the second bonding pattern 850 may be covered by the fourth insulating interlayer 840.

The second bonding pattern 850 may contact the upper surface of the semiconductor pattern 137, and may also contact upper surfaces of the first and second gate insulation patterns 207 and 297 and the seventh insulation pattern 545. In an example embodiment, a lower surface of the fourth insulating interlayer 840 may be lower than the upper surface of the semiconductor pattern 137.

FIGS. 114 to 116 are cross-sectional views illustrating methods of manufacturing the semiconductor devices of FIGS. 112 and 113 in accordance with example embodiments. These methods may include processes substantially the same as or similar to those described with reference to FIGS. 1 to 81, and for convenience of description, repeated explanations are omitted herein.

Referring to FIG. 114, processes substantially the same as or similar to those described with reference to FIGS. 68 to 70 may be performed, a fourth insulating interlayer 840 may be formed on the semiconductor pattern 137, the first insulating interlayer pattern 185, the second insulating interlayer 310, the first and second gate insulation patterns 207 and 297, and the sixth and seventh insulation patterns 540 and 545, a ninth opening may be formed through the fourth insulating interlayer 840 to expose an upper surface of the semiconductor pattern 137, and a second bonding pattern 850 may be formed to fill the ninth opening.

The ninth opening may expose not only the upper surface of the semiconductor pattern 137, but also expose upper surfaces of the first and second gate insulation patterns 207 and 297 and the seventh insulation pattern 545 adjacent thereto.

Referring to FIG. 115, processes substantially the same as or similar to those described with reference to FIGS. 71 to 73 may be performed on the fourth insulating interlayer 840 and the second bonding pattern 850, and the ninth opening may be formed to expose the upper surface of the second bonding pattern 850. Processes substantially the same as or similar to those described with reference to FIGS. 74 to 81 and FIGS. 1 to 4 may be performed to manufacture the semiconductor device of FIG. 112.

Referring to FIG. 116, a second bonding layer may be formed on the semiconductor pattern 137, the first insulating interlayer pattern 185, the second insulating interlayer 310, the first and second gate insulation patterns 207 and 297, and the sixth and seventh insulation patterns 540 and 545, a tenth opening may be formed through the second bonding layer to expose upper surfaces of the second insulating interlayer 310 and the sixth and seventh insulation patterns 540 and 545, and the fourth insulating interlayer 840 may be formed to fill the tenth opening.

As the tenth opening is formed, the second bonding layer may be transformed into the second bonding pattern 850.

The tenth opening may also expose an upper surface of the first gate insulation pattern 207 adjacent to the sixth and seventh insulation patterns 540 and 545, and may partially extend through upper portions of the second insulating interlayer 310, the sixth and seventh insulation patterns 540 and 545 and the first gate insulation pattern 207.

Processes substantially the same as or similar to those described with reference to FIGS. 74 to 81 and FIGS. 1 to 4 may be performed to manufacture the semiconductor device of FIG. 113.

Figure 117:
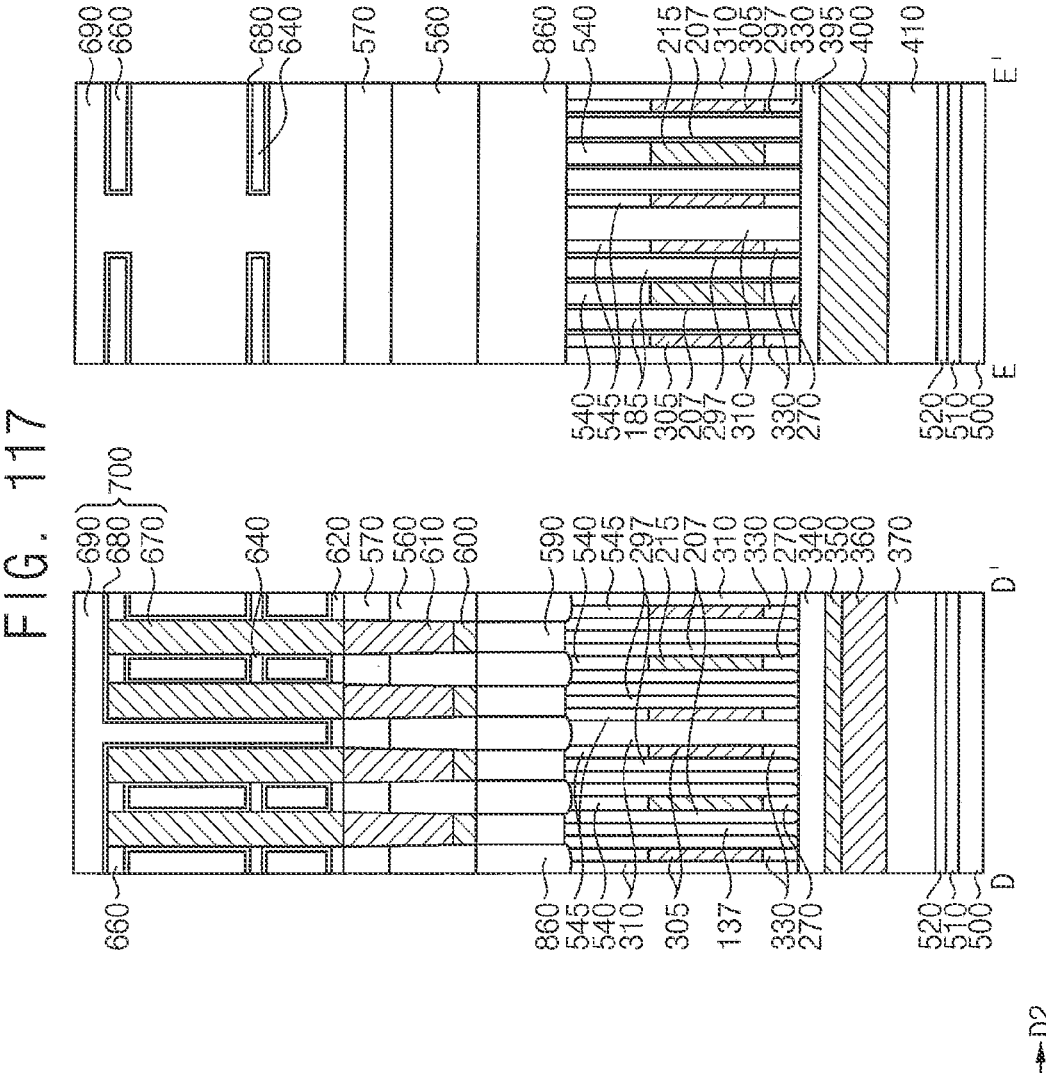
FIG. 117 is a cross-sectional view illustrating a semiconductor device in accordance with example embodiments.

FIG. 117 is a cross-sectional view illustrating a semiconductor device in accordance with example embodiments, and may correspond to FIG. 4. This semiconductor device may be substantially the same as or similar to that of FIGS. 1 to 4, except for including a fifth insulating interlayer instead of the first etch stop layer, and for convenience of description, repeated explanations are omitted herein.

Referring to FIG. 117, the lower contact plug 590 may be formed on the semiconductor pattern 137, and a sidewall of the lower contact plug 590 may be covered by a fifth insulating interlayer 860.

The lower contact plug 590 may contact the upper surface of the semiconductor pattern 137, and may also contact upper surfaces of the first and second gate insulation patterns 207 and 297 and the sixth and seventh insulation patterns 540 and 545 adjacent to the semiconductor pattern 137. In an example embodiment, a lower surface of the fifth insulating interlayer 860 may be lower than the upper surface of the semiconductor pattern 137.

FIGS. 118 and 119 are cross-sectional views illustrating a method of manufacturing the semiconductor device of FIG. 117 in accordance with example embodiments. This method may include processes substantially the same as or similar to those described with reference to FIGS. 1 to 81, and for convenience of description, repeated explanations are omitted herein.

Referring to FIG. 118, a lower contact plug layer may be formed on the semiconductor pattern 137, the first insulating interlayer pattern 185, the second insulating interlayer 310, the first and second gate insulation patterns 207 and 297, and the sixth and seventh insulation patterns 540 and 545, an eleventh opening may be formed through the lower contact plug layer to expose upper surfaces of the second insulating interlayer 310 and the sixth and seventh insulation patterns 540 and 545, and a fifth insulating interlayer 860 may be formed to fill the eleventh opening.

As the eleventh opening is formed, the lower contact plug layer may be transformed into the lower contact plug 590.

The eleventh opening may also expose an upper surface of the first gate insulation pattern 2078 adjacent to the seventh insulation pattern 540, and may partially extend through upper portions of the second insulating interlayer 310, the sixth and seventh insulation patterns 540 and 545 and the first gate insulation pattern 207.

Referring to FIG. 119, processes substantially the same as or similar to those described with reference to FIGS. 71 to 73 may be performed.

For example, the third insulating interlayer 560 and the capping layer 570 may be sequentially formed on the fifth insulating interlayer 860 and the lower contact plug 590, and may be partially etched to form a twelfth opening exposing an upper surface of the lower contact plug 590, and the ohmic contact pattern 600 and the upper contact plug 610 may be formed in the twelfth opening.

Processes substantially the same as or similar to those described with reference to FIGS. 74 to 81 and FIGS. 1 to 4 may be performed to manufacture the semiconductor device of FIG. 117.

FIG. 120 is a plan view illustrating a semiconductor device in accordance with example embodiments, and may correspond to FIG. 2. This semiconductor device may be substantially the same as or similar to that of FIGS. 1 to 4, except for the location of the first capacitor electrode 670, and thus, for convenience of description, repeated explanations are omitted herein.

Referring to FIG. 120, the first capacitor electrode 670 included in the capacitor 700 may contact the upper contact plug 610, however, a center of the first capacitor electrode 670 may not match a center of the upper contact plug 610 in a plan view.

For example, the contact plug structure including the upper contact plug 610 may be arranged in a lattice pattern in a plan view, and the first capacitor electrode 670 may be arranged in a honeycomb pattern in a plan view. However, embodiments of the present disclosure are not limited thereto, and the first capacitor electrode 670 and the contact plug structure may be arranged in various types. For example, both of the contact plug structure and the first capacitor electrode 670 may be arranged in a honeycomb pattern in a plan view.

While the present disclosure has been shown and described with reference to example embodiments thereof, it will be understood by those of ordinary skill in the art that various changes in form and detail may be made thereto without departing from the spirit and scope of the present disclosure as set forth by the following claims.

What is claimed is:

1. A semiconductor device, comprising:
a plurality of bit line structures disposed on a substrate, wherein each of the bit line structures extends in a second direction parallel to an upper surface of the substrate, and the bit line structures are spaced apart from each other in a first direction parallel to the upper surface of the substrate and crossing the second direction;
a plurality of semiconductor patterns spaced apart from each other in the second direction on each of the bit line structures;
a plurality of insulating interlayer patterns disposed between neighboring ones of the semiconductor patterns in the first direction;
a plurality of word lines spaced apart from each other in the second direction on the bit line structures, wherein each of the word lines extends in the first direction adjacent to the semiconductor patterns; and
a plurality of capacitors disposed on and electrically connected to the semiconductor patterns, respectively,
wherein a seam extending in the second direction is formed in each of the insulating interlayer patterns.

2. The semiconductor device according to claim 1, further comprising:
a shield pattern extending in the second direction between neighboring ones of the bit line structures in the first direction.

3. The semiconductor device according to claim 2, wherein an upper surface of the shield pattern is lower than upper surfaces of the bit line structures, and a lower surface of the shield pattern is lower than lower surfaces of the bit line structures.

4. The semiconductor device according to claim 2, wherein the seam overlaps the shield pattern in a third direction perpendicular to the upper surface of the substrate.

5. The semiconductor device according to claim 1, further comprising:
an air gap extending in the second direction between neighboring ones of the bit line structures in the first direction.

6. The semiconductor device according to claim 1, wherein:
the semiconductor patterns include:
a plurality of first semiconductor patterns arranged in the first direction; and
a plurality of second semiconductor patterns arranged in the first direction and spaced apart from the first semiconductor patterns in the second direction,
the word lines include:
a first word line extending in the first direction adjacent to a first side of each of the first semiconductor patterns, wherein each of the first semiconductor patterns comprises the first side and a second side disposed opposite to the first side in the second direction; and
a second word line extending in the first direction adjacent to a first side of each of the second semiconductor patterns, wherein each of the second semiconductor patterns comprises the first side and a second side disposed opposite to the first side of each of the second semiconductor patterns in the second direction, and
the second side of each of the first semiconductor patterns and the second side of each of the second semiconductor patterns are adjacent to each other in the second direction.

7. The semiconductor device according to claim 6, further comprising:
a back gate electrode extending in the first direction between the second side of each of the first semiconductor patterns and the second side of each of the second semiconductor patterns.

8. The semiconductor device according to claim 7, wherein an upper surface of the back gate electrode is coplanar with upper surfaces of the word lines.

9. The semiconductor device according to claim 6, wherein:
the first and second word lines adjacent to the first sides of the first and second semiconductor patterns, respectively, form a word line pair,
the semiconductor device includes a plurality of word line pairs spaced apart from each other in the second direction, and
the semiconductor device further comprises a shield pattern extending in the first direction between neighboring ones of the word line pairs in the second direction.

10. The semiconductor device according to claim 1, further comprising:
a plurality of contact plug structures disposed on upper surfaces of the semiconductor patterns, respectively,
wherein the capacitors contact upper surfaces of the contact plug structures, respectively.

11. The semiconductor device according to claim 10, wherein the contact plug structures are arranged in a lattice pattern in a plan view, and
wherein the capacitors are arranged in a honeycomb pattern in the plan view.

12. The semiconductor device according to claim 10, further comprising:
a bonding pattern disposed between the upper surface of each of the semiconductor patterns and a corresponding one of the contact plug structures.

13. The semiconductor device according to claim 1, further comprising:
a gate insulation pattern disposed between each of the semiconductor patterns and a corresponding one of the word lines.

14. The semiconductor device according to claim 13, wherein the gate insulation pattern extends in the first direction, and covers sidewalls of the semiconductor patterns and the insulating interlayer patterns arranged in the first direction, and
wherein a width in the second direction of a portion of the gate insulation pattern on the sidewall of each of the semiconductor patterns is greater than a width in the second direction of a portion of the gate insulation pattern on the sidewall of each of the insulating interlayer patterns.

15. The semiconductor device according to claim 1, wherein a lower surface of each of the word lines is convex, and a height of the lower surface of each of the word lines increases as a distance from sidewalls of the semiconductor patterns increases.

16. A semiconductor device, comprising:
a plurality of bit line structures disposed on a substrate, wherein each of the bit line structures extends in a second direction parallel to an upper surface of the substrate, and the bit line structures are spaced apart from each other in a first direction parallel to the upper surface of the substrate and crossing the second direction;

a plurality of semiconductor patterns spaced apart from each other in the second direction on each of the bit line structures;

a plurality of insulating interlayer patterns disposed between neighboring ones of the semiconductor patterns in the first direction;

a plurality of gate insulation patterns, wherein each gate insulation pattern extends in the first direction and contacts sidewalls of the semiconductor patterns and the insulating interlayer patterns disposed in the first direction;

a plurality of word lines disposed on the bit line structures, wherein each of the word lines extends in the first direction on sidewalls of the gate insulation patterns; and a plurality of capacitors disposed on and electrically connected to the semiconductor patterns, respectively, wherein each of the gate insulation patterns includes a first portion contacting the sidewalls of the semiconductor patterns and a second portion contacting the sidewalls of the insulating interlayer patterns, and a width in the second direction of the first portion is greater than a width in the second direction of the second portion.

17. The semiconductor device according to claim 16, wherein a width in the second direction of each of the word lines is constant in the first direction.

18. The semiconductor device according to claim 16, wherein:

the semiconductor patterns include:

a plurality of first semiconductor patterns arranged in the first direction; and a plurality of second semiconductor patterns arranged in the first direction and spaced apart from the first semiconductor patterns in the second direction, the word lines include:

a first word line extending in the first direction adjacent to a first side of each of the first semiconductor patterns, wherein each of the first semiconductor patterns comprises the first side and a second side disposed opposite to the first side in the second direction; and a second word line extending in the first direction adjacent to a first side of each of the second semiconductor patterns, wherein each of the second semiconductor patterns comprises the first side and a second side disposed opposite to the first side of each of the second semiconductor patterns in the second direction, and the second side of each of the first semiconductor patterns and the second side of each of the second semiconductor patterns are adjacent to each other in the second direction.

19. A semiconductor device, comprising:

a plurality of bit line structures disposed on a substrate, wherein each of the bit line structures extends in a second direction parallel to an upper surface of the substrate, and the bit line structures are spaced apart from each other in a first direction parallel to the upper surface of the substrate and crossing the second direction;

a plurality of semiconductor patterns spaced apart from each other in the second direction on each of the bit line structures, wherein each of the semiconductor patterns comprises first and second sidewalls disposed opposite to each other in the second direction;

a plurality of word lines disposed on the bit line structures, wherein each of the word lines extends in the first direction on the first sidewalls of the semiconductor patterns;

a plurality of back gate electrodes disposed on the bit line structures, wherein each of the back gate electrodes extends in the first direction adjacent to the second sidewalls of the semiconductor patterns; and a plurality of capacitors disposed on and electrically connected to the semiconductor patterns, respectively, wherein a width in the second direction of each of the back gate electrodes periodically changes in the first direction.

20. The semiconductor device according to claim 19, further comprising:

a plurality of insulating interlayer patterns disposed between neighboring ones of the semiconductor patterns in the first direction, wherein each of the back gate electrodes includes a first portion adjacent to the second sidewalls of the semiconductor patterns and a second portion adjacent to sidewalls of the insulating interlayer patterns, and a width in the second direction of the first portion is less than a width in the second direction of the second portion.

* * * * *